(12) United States Patent
Moriya et al.

(10) Patent No.: US 10,539,849 B2
(45) Date of Patent: Jan. 21, 2020

(54) COLOR CHANGE MEMBER, LIGHT EMITTING DEVICE, DISPLAY DEVICE AND ELECTRONIC APPARATUS

(71) Applicant: JOLED Inc., Tokyo (JP)

(72) Inventors: Yusuke Moriya, Tokyo (JP); Kensaku Maeda, Kanagawa (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/640,548

(22) Filed: Mar. 6, 2015

(65) Prior Publication Data

US 2015/0276175 A1  Oct. 1, 2015

(30) Foreign Application Priority Data

Mar. 26, 2014  (JP) ................................ 2014-064595

(51) Int. Cl.

| G02F 1/137 | (2006.01) |
|---|---|
| H01L 27/32 | (2006.01) |
| G02B 5/22 | (2006.01) |
| G02F 1/1335 | (2006.01) |
| G02F 1/13357 | (2006.01) |

(52) U.S. Cl.
CPC ............ *G02F 1/13762* (2013.01); *G02B 5/22* (2013.01); *G02F 1/133514* (2013.01); *G02F 1/133621* (2013.01); *G02F 2201/44* (2013.01); *H01L 27/3232* (2013.01)

(58) Field of Classification Search
CPC ......... G02F 1/133621; G02F 1/133514; G02F 1/13762; G02F 2201/44; G02B 5/20; G02B 5/22; G02B 5/223; H01L 27/322; H01L 27/32; H01L 27/3232; H23B 2457/206
USPC ........... 349/104, 106, 69; 313/499, 504, 509
See application file for complete search history.

(56) References Cited

U.S. PATENT DOCUMENTS

| 8,044,575 B2 * | 10/2011 | Kawamura | ........... H01L 27/322 313/504 |
|---|---|---|---|
| 2011/0095276 A1 | 4/2011 | Imai et al. | |
| 2012/0154722 A1 * | 6/2012 | Kang | ..................... G02B 5/003 349/106 |
| 2012/0274879 A1 * | 11/2012 | Jinbo | .................. H01L 27/1214 349/69 |
| 2013/0001571 A1 * | 1/2013 | Yamazaki | ............... H01L 27/12 257/59 |
| 2013/0015476 A1 * | 1/2013 | Imai | ..................... H01L 27/322 257/89 |
| 2014/0027798 A1 * | 1/2014 | Sato | ........................ H01L 33/50 257/89 |

FOREIGN PATENT DOCUMENTS

| JP | 2006339028 A | 12/2006 |
|---|---|---|
| JP | 201190894 A | 5/2011 |
| JP | 2013-004219 | 1/2013 |
| JP | 2013-221964 A | 10/2013 |

* cited by examiner

*Primary Examiner* — Angela K Davison
(74) *Attorney, Agent, or Firm* — Xsensus LLP

(57) ABSTRACT

A color change member includes: a color change layer that has a light incident surface, a light emission surface, and a side surface; a first protective layer that is provided on the light incident surface of the color change layer; and a second protective layer that is provided on at least a part of the side surface of the color change layer.

18 Claims, 50 Drawing Sheets

COLOR CHANGE MEMBER, LIGHT EMITTING DEVICE, DISPLAY DEVICE AND ELECTRONIC APPARATUS

CROSS REFERENCE TO RELATED APPLICATIONS

This application claims the benefit of Japanese Priority Patent Application JP 2014-064595 filed Mar. 26, 2014, the entire contents of which are incorporated herein by reference.

BACKGROUND

The present disclosure relates to a color change member that varies a color of incident light, a light emitting device that has the color change member, a display device that has the color change member, and an electronic apparatus that has the display device.

In liquid crystal display devices, a color of light, which is transmitted through the liquid crystal element, is changed using color filters, thereby performing color display. In some illumination devices (light emitting devices) and some display devices using self-light-emitting elements such as organic electroluminescence (EL) elements, the color may be also changed using color filters such that light with a desired color is obtained.

The color filters may be provided on a substrate (counter substrate) different from a substrate on which the liquid crystal elements, the organic EL elements, and the like are provided, and may be so-called on-chip color filters which are provided on the same substrate together with the liquid crystal elements, the organic EL elements, or the like. As an example of the on-chip color filter, for example, in the description of Japanese Unexamined Patent Application Publication No. 2013-4219, a planarization layer made of acryl resin is provided on a light emitting layer, and color filters are provided on the planarization layer.

SUMMARY

Generally, the color filters are made of an organic material, and thus a process of forming the color filters includes thermal curing. However, if heat resistance of different components is low, it is difficult to thermally cure the color filters at a high temperature. Hence, if the color filters are not cured or are not sufficiently cured, there has been a concern about adverse effects on reliability caused by diffusion of degassed components and residual solvents in the color filters.

It is desirable to provide a color change member capable of suppressing deterioration in reliability caused by residual solvents and degassed components, a light emitting device that has the color change member, a display device that has the color change member, and an electronic apparatus that has the display device.

A color change member according to a first embodiment of the present disclosure includes the following elements (A) to (C): (A) a color change layer that has a light incident surface, a light emission surface, and a side surface; (B) a first protective layer that is provided on the light incident surface of the color change layer; and (C) a second protective layer that is provided on at least a part of the side surface of the color change layer.

In the color change member according to the first embodiment of the present disclosure, the first protective layer is provided on the light incident surface of the color change layer, and the second protective layer is provided on at least a part of the side surface of the color change layer. Accordingly, the color change layer is prevented from mixing with adjacent color change layers due to diffusion of residual solvents and degassed components in the color change layer. Consequently, the deterioration in reliability caused by residual solvents and degassed components in the color change layer is suppressed.

A light emitting device according to a second embodiment of the present disclosure includes: a light emitting element that emits light; and a color change member that is provided on a light extraction side of the light emitting element. The color change member is constituted by the color change member according to the first embodiment of the present disclosure.

In the light emitting device according to the second embodiment of the present disclosure, a color of the light, which is emitted from the light emitting element, is changed by the color change member.

A display device according to a third embodiment of the present disclosure includes: a light control element that controls transmission or reflection of light or a light emitting element that emits light; and a color change member that is provided on a light extraction side of the light control element or the light emitting element. The color change member is constituted by the color change member according to the first embodiment of the present disclosure.

In the display device according to the third embodiment of the present disclosure, a color of the light, which is emitted from the light emitting element, or a color of the light, which is transmitted or reflected by the light control element, is changed by the color change member.

An electronic apparatus according to a fourth embodiment of the present disclosure includes the display device according to the third embodiment of the present disclosure.

In the electronic apparatus according to the fourth embodiment of the present disclosure, the display device displays an image.

According to the color change member of the first embodiment of the present disclosure, the light emitting device of the second embodiment of the present disclosure, the display device of the third embodiment of the present disclosure, or the electronic apparatus of the fourth embodiment of the present disclosure, the first protective layer is provided on the light incident surface of the color change layer of the color change member, and the second protective layer is provided on at least a part of the side surface of the color change layer. Consequently, it is possible to suppress the deterioration in reliability caused by residual solvents and degassed components in the color change layer.

It should be noted that the effect described herein is not necessarily limited, and may be any one of the effects described in the present disclosure.

DETAILED DESCRIPTION OF EMBODIMENTS

Figure 1:
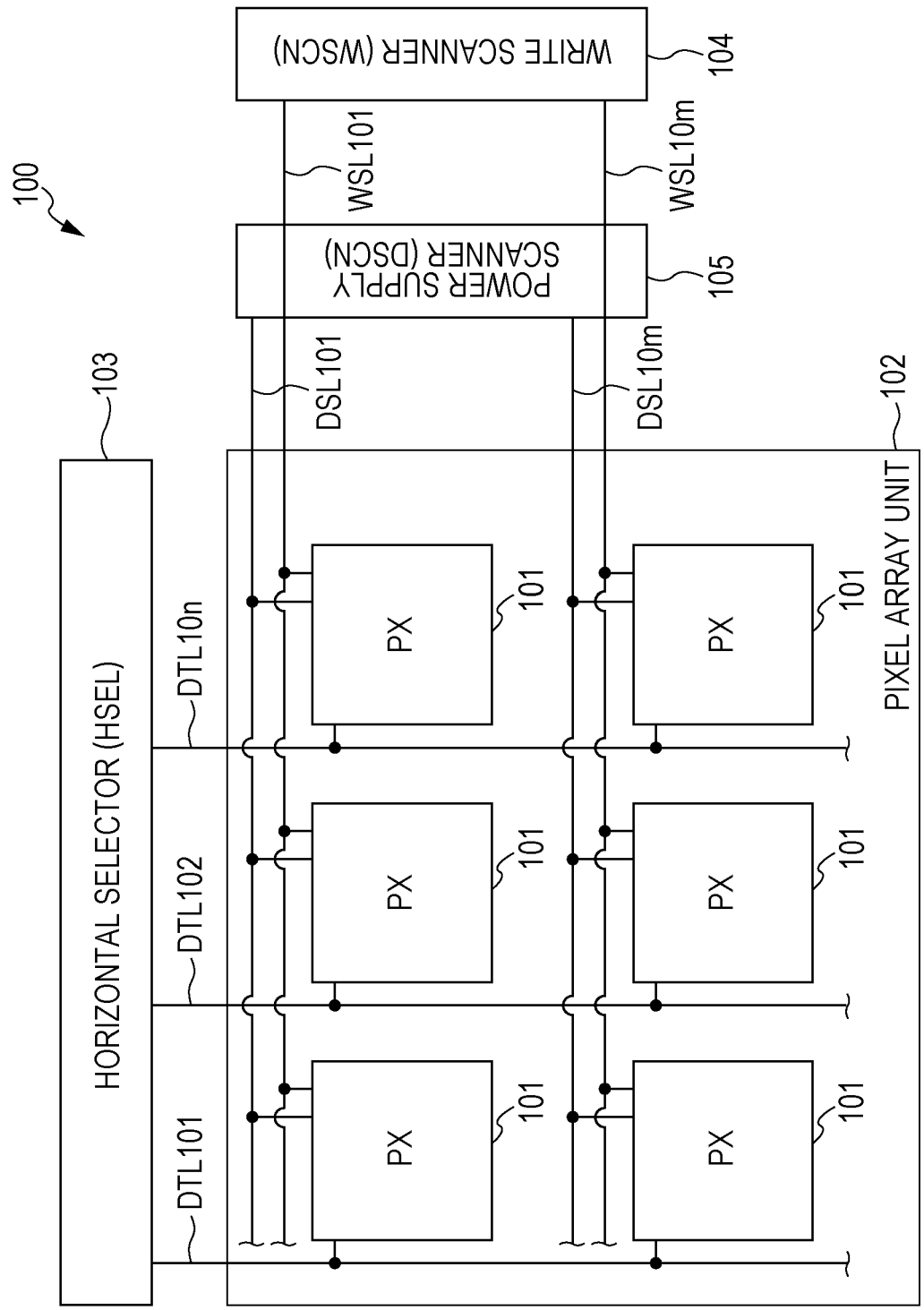
FIG. 1 is a block diagram illustrating a configuration of the entirety of a display device according to a first embodiment of the present disclosure.

Hereinafter, embodiments of the present disclosure will be described in detail with reference to the accompanying drawings. It should be noted that description will be given in the following order:

1. First Embodiment (an example in which a first protective layer that is transparent is provided on the light incident surface of the color change layer, a second protective layer that is transparent is provided on the side surface, and a third protective layer that is transparent is provided on the light emission surface);

2. Second Embodiment (an example in which an antireflection film is provided between the third protective layer and a sealing resin layer);

3. Third Embodiment (an example in which the antireflection film is provided between the third protective layer and the light emission surface of the color change layer);

4. Fourth Embodiment (an example in which the antireflection film is provided on the light incident surface of the color change layer);

5. Modification Examples 4-1 and 4-2 (combination between the fourth embodiment and the second or third embodiment);

6. Fifth Embodiment (an example in which the second protective layer made of a metal film is provided on the side surface of the color change layer);

7. Modification Examples 5-1 to 5-3 (combinations between the fifth embodiment and the second to fourth embodiments);

8. Sixth Embodiment (an example in which a side wall made of a black filter is provided on the first protective layer, and the second protective layer that is transparent is provided on the first protective layer and a surface of the side wall);

9. Modification Examples 6-1 to 6-3 (combinations between the sixth embodiment and the second to fourth embodiments);

10. Seventh Embodiment (an example in which a side wall made of chromatic filters is provided on the first protective layer, and the second protective layer made of a metal film is provided on the surface of the side wall);

11. Modification Examples 7-1 to 7-3 (combinations between the seventh embodiment and the second to fourth embodiments);

12. Eighth Embodiment (an example in which a side wall made of black filters or chromatic filters is provided on the first protective layer, and organic EL elements and the second protective layer that is transparent are provided on the surface of the side wall and the first protective layer);

13. Modification Examples 8-1 to 8-3 (combinations between the eighth embodiment and the second to fourth embodiments);

14. Ninth Embodiment (an example in which curved portions are provided on the upper surface of the third protective layer);

15. Modification Examples 9-1 to 9-3 (combinations between the ninth embodiment and the second to fourth embodiments);

16. Tenth Embodiment (an example in which the second protective layer made of a metal film is provided on a part of the side surface of the color change layer in the height direction, and the second protective layer that is transparent is provided on the remaining part of the side surface of the color change layer in the height direction);

17. Eleventh Embodiment (an example in which a sealing resin layer and a sealing substrate are omitted from the upper surface of the third protective layer); and 18. Application Example (electronic apparatus).

First Embodiment

FIG. 1 shows a configuration of the entirety of a display device according to a first embodiment of the present disclosure. A display device 100 includes, for example, a pixel array section 102 and driving sections (a signal selector 103, a main scanner 104, and a power supply scanner 105) that drive the pixel array section 102.

The pixel array section 102 has a plurality of pixels PX arranged in a matrix, and power supply lines DSL101 to 10m arranged to correspond to the respective rows of the plurality of pixels PX. The respective pixels PX are disposed at intersection portions between scanning lines WSL101 to 10m as rows and signal lines DTL101 to 10n as columns, and have pixel circuits 101.

The main scanner (write scanner WSCN) 104 sequentially supplies a control signal to each of the scanning lines WSL101 to 10m so as to perform line-sequential scanning on the pixels PX in the row unit. The power supply scanner (DSCN) 105 supplies, synchronously with the line-sequential scanning, a power supply voltage switching between first and second potentials to each of the power supply lines DSL 101 to 10m. The signal selector (horizontal selector HSEL) 103 supplies, synchronously with the line-sequential scanning, a reference potential and a signal potential as a video signal to the column signal lines DTL101 to 10n.

Figure 2:
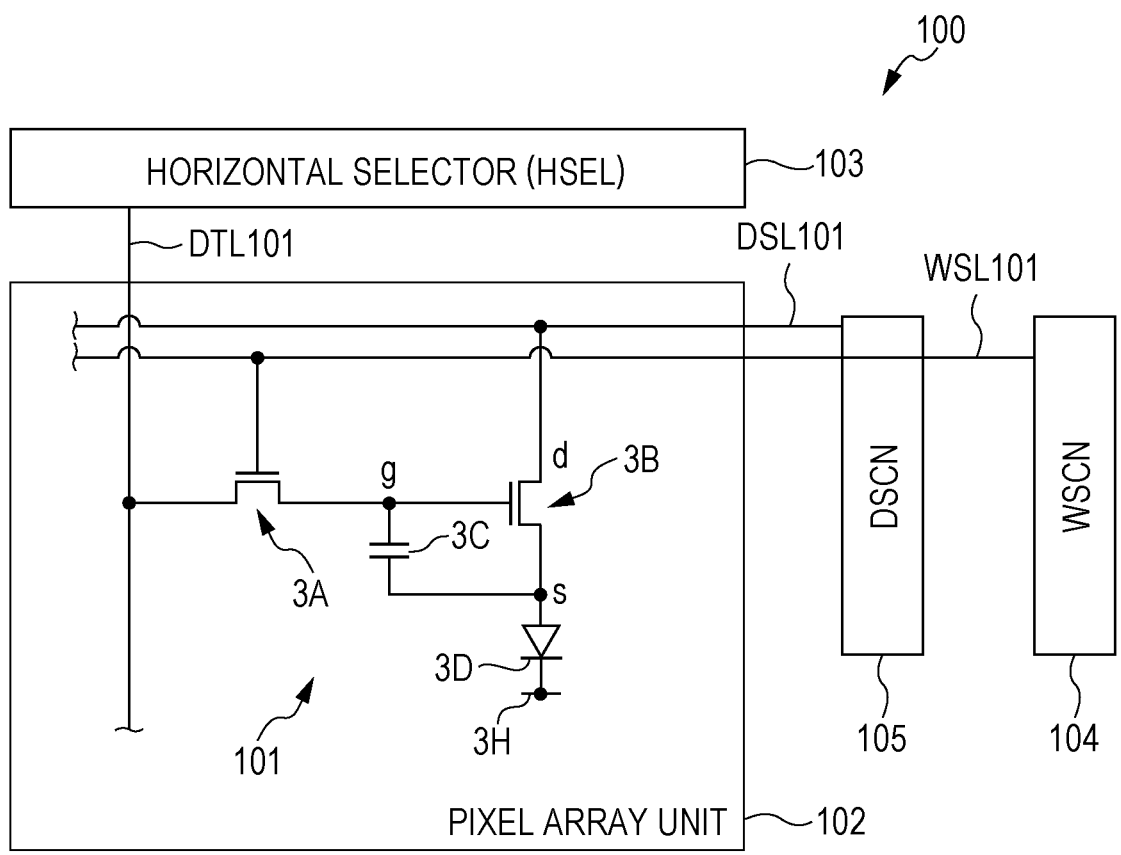
FIG. 2 is a diagram illustrating an example of a pixel circuit of the display device shown in FIG. 1.

FIG. 2 shows an example of a specific configuration and a wiring relationship of the pixel circuit 101 shown in FIG. 1. The pixel circuit 101 includes, for example, a light emitting element 3D typified by an organic EL element or the like, a sampling transistor 3A, a driving transistor 3B, and a retentive capacitor 3C.

A gate of the sampling transistor 3A is connected to a corresponding scanning line WSL101, one of the source and the drain is connected to a corresponding signal line DTL101, and the other of the source and the drain is connected to a gate g of the driving transistor 3B.

One of the source s and the drain d of the driving transistor 3B is connected to the light emitting element 3D, and the other of the source s and the drain d is connected to a corresponding power supply line DSL101. In the present embodiment, the drain d of the driving transistor 3B is connected to the power supply line DSL101, and the source s is connected to an anode of the light emitting element 3D. A cathode of the light emitting element 3D is connected to a grounding line 3H. The grounding line 3H is wired in common to all the pixels PX.

The retentive capacitor 3C is connected between the source s and gate g of the driving transistor 3B. The retentive capacitor 3C retains a signal potential of the video signal supplied from the signal line DTL101.

Figure 3:
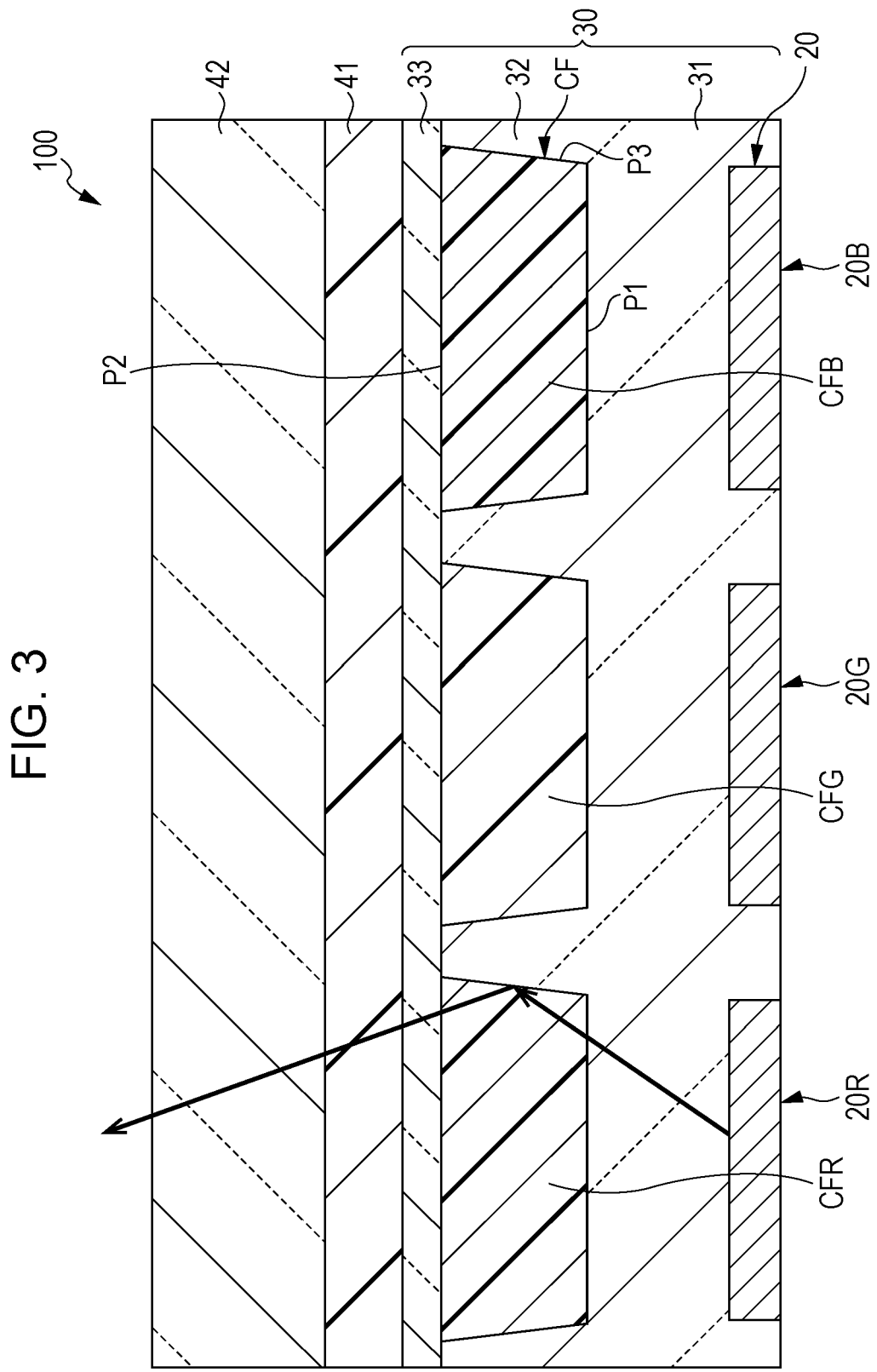
FIG. 3 is a cross-sectional view illustrating a schematic configuration of three adjacent pixels in the display device shown in FIG. 1.

FIG. 3 shows a schematic cross-sectional configuration of the three adjacent pixels PX in the display device 100 shown in FIG. 1. Each pixel PX has, for example, a light emitting element 20, and a color change member 30 that is provided on a light extraction side of the light emitting element 20. For example, a sealing resin layer 41 and a sealing substrate 42 are provided on the color change member 30, and the light emitting element 20 is sealed by the color change member 30, the sealing resin layer 41, and the sealing substrate 42 (solid sealing structure).

A pitch (center-to-center distance) between the pixels PX of the display device 100 is equal to or less than, for example, 30 µm, and, specifically for example, 2 µm to 3 µm. That is, the display device 100 is a so-called micro display in which the size of each pixel PX is extremely small, and is used in electronic viewfinders of digital single-lens reflex cameras, head mount displays, other wearable displays, and the like. In addition, an eyepiece lens (not shown in the drawing) is provided on the display device 100, and a user is able to view an image, which is displayed on the display device 100, in an enlarged manner through the eyepiece lens. Hence, a user is able to see a part of the image, which is displayed on the display device 100, in a range of an acceptance angle of the eyepiece lens.

The light emitting element 20 is constituted by, for example, an organic EL element, and corresponds to the light emitting element 3D shown in FIG. 2. Specifically, each light emitting element 20 is any one of a red organic EL element 20R which emits red light, a green organic EL element 20G which emits green light, and a blue organic EL element 20B which emits blue light. A specific configuration of the light emitting layer 20 will be described later.

The color change member 30 is constituted by, for example, color filters that change colors of the light through light absorption, and has a color filter layer CF, a first protective layer 31, and a second protective layer 32. The color filter layer CF has a light incident surface P1, a light emission surface P2, and a side surface P3. The first protective layer 31 is provided on the light incident surface P1 of the color filter layer CF. The second protective layer 32 is provided on at least a part of the side surface P3 of the color filter layer CF. Thereby, in the color change member 30 and the display device 100 having the color change member 30, it is possible to suppress deterioration in reliability caused by residual solvents and degassed components in the color filter layer CF.

The color filter layer CF is formed by mixing organic pigments with an organic material such as photoresist. The color filter layer CF has, for example, red filters CFR, green filters CFG, and blue filters CFB, and the filters are regularly arranged. Each of the red filter CFR, the green filter CFG, and the blue filter CFB is adjusted by selecting a pigment such that an optical transmittance thereof in a desired wavelength region of red, green, or blue is high and an optical transmittance thereof in other wavelength regions is low.

It is preferable that the side surface P3 of the color filter layer CF has a tapered shape. For light that travels obliquely, mixing of colors is suppressed, and the light is efficiently extracted upward, whereby it is possible to increase the light extraction efficiency.

The first protective layer 31 constitutes the light incident surface P1, that is, a bottom portion of the color filter layer CF. The first protective layer 31 is a barrier layer that suppresses diffusion of residual solvents and degassed components in the color filter layer CF toward the lower side (toward the light emitting element 20) so as to suppress particularly deterioration of a light emitting layer 23C of an organic layer 23. It is preferable that the first protective layer 31 is formed as a transparent inorganic base film that has a high transmittance and a high passivation ability. Examples of the film include a silicon nitride (SiN) film, a silicon oxynitride (SiON) film, an aluminum oxide film ($Al_2O_3$), and the like. In addition, when the first protective layer 31 is formed as an aluminum oxide film, it is preferable that the aluminum oxide film has a thickness of 100 nm or less and is formed by an atomic layer deposition (ALD) method. The reason for this is that an aluminum oxide film, which is formed by an ALD method, has a high passivation ability.

The second protective layer 32 constitutes the side surface P3, that is, the side wall portion of the color filter layer CF. The second protective layer 32 is a barrier layer that suppresses diffusion of residual solvents and degassed components in the color filter layer CF in the horizontal direction (toward the adjacent color filter layer CF) so as to suppress mixing between adjacent color filter layers CF. Similarly to the first protective layer 31, it is preferable that the second protective layer 32 is formed as a transparent inorganic base film that has a high transmittance and a high passivation ability. Examples of the film include a silicon nitride (SiN) film, a silicon oxynitride (SiON) film, an aluminum oxide film ($Al_2O_3$), and the like. It should be noted that FIG. 3 shows a case where the second protective layer 32 is provided on the entire side surface P3 of the color filter layer CF. However, the second protective layer 32 may be provided on at least a part of the side surface P3 of the color filter layer CF.

Further, it is preferable that the color change member 30 has a third protective layer 33 provided on at least a part of the light emission surface P2 of the color filter layer CF. The third protective layer 33 defines the light emission surface P2, that is, the upper surface portion of the color filter layer CF. The third protective layer 33 is a barrier layer that suppresses diffusion of residual solvents and degassed components in the color filter layer CF toward the upper side (toward the sealing resin layer 41) so as to suppress deterioration of the sealing resin layer 41. Similarly to the first protective layer 31, it is preferable that the third protective layer 33 is formed as a transparent inorganic base film that has a high transmittance and a high passivation ability. Examples of the film include a silicon nitride (SiN) film, a silicon oxynitride (SiON) film, an aluminum oxide film ($Al_2O_3$), and the like. It should be noted that FIG. 3 shows a case where the third protective layer 33 is provided on the entire light emission surface P2 of the color filter layer CF. However, the third protective layer 33 may be provided on at least a part of the light emission surface P2 of the color filter layer CF.

As described above, the light incident surface P1, the light emission surface P2 and the side surface P3 of the color filter layer CF are covered by the first protective layer 31, the second protective layer 32, and the third protective layer 33. Thereby, it is possible to enclose residual solvents and degassed components, which are in the color filter layer CF, in a certain space surrounded by the first protective layer 31, the second protective layer 32, and the third protective layer 33. There is a concern about deterioration of the organic layer 23, particularly, the light emitting layer 23C to be described later. Thus, it may be difficult to thermally cure the color filter layer CF at a high temperature, and the color filter layer CF may not be cured or may be insufficiently cured. Even in this case, it is possible to suppress defects caused by diffusion of residual solvents and degassed components in the color filter layer CF, and thus it is possible to suppress deterioration in reliability. The defects include mixing between the adjacent color filter layers CF, deterioration of the sealing resin layer 41, deterioration of the organic layer 23 which is caused by peeling of the sealing resin layer 41 due to diffusion of degassed components, and the like.

The sealing substrate 42 is positioned to be close to cathode electrodes 24 of the light emitting elements 20, and seals the light emitting elements 20 together with the sealing resin layer 41. The sealing substrate 42 is made of a material such as glass which is transparent to light generated by the light emitting elements 20. For example, the color filters and a light blocking film (none is shown in the drawing) as a black matrix are provided on the sealing substrate 42. With such a configuration, the light generated by the light emitting elements 20 is extracted, and outside light, which is reflected on wiring between the light emitting elements 20, is absorbed, whereby contrast is improved.

Figure 4:
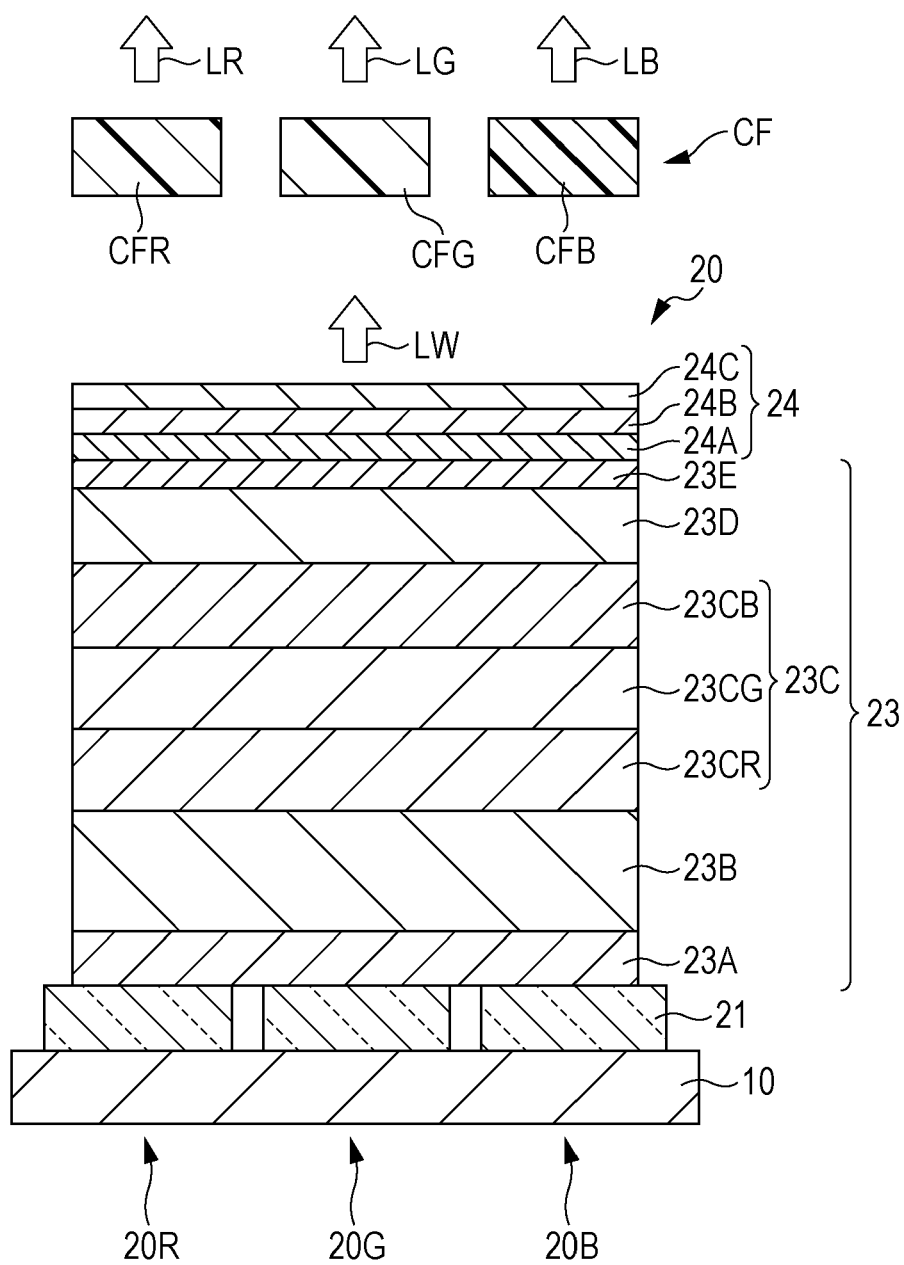
FIG. 4 is a cross-sectional view illustrating an example of a light emitting element shown in FIG. 3.

FIG. 4 shows a schematic cross-sectional configuration of the light emitting element 20 shown in FIG. 3. In the light emitting element 20, anode electrodes 21 (first electrodes), partition walls 22, the organic layer 23, and the cathode electrode 24 (second electrode) are laminated on the substrate 10 in this order. The light emitting element 20 is a top emission organic EL element. In the element, when holes injected from the anode electrodes 21 and electrons injected from the cathode electrode 24 are coupled again in the light emitting layer 23C (to be described later), emitted light is generated, and is extracted from a side (cathode electrode 24 side) opposite to the substrate 10. By using the top emission organic EL elements, an aperture ratio of the light emitting portion of the display device 100 is improved. It should be noted that the light emitting element 20 is not limited to a top emission organic EL element and may be, for example, a transmissive-type organic EL element, that is, a bottom emission organic EL element which extracts light from the substrate 10 side.

The substrate 10 is formed as a glass substrate, a plastic film, or the like. Examples of the plastic material include polyethylene terephthalate (PET), polyethylene naphthalate (PEN), and the like. Further, the substrate 10 may be a substrate made of a metal such as stainless steel (SUS) in accordance with the purpose.

For example, when the display device 100 is a top emission type, the anode electrode 21 is made of a high-reflectivity material such as aluminum-neodymium alloy, aluminum (Al), titanium (Ti), or chromium (Cr). Further, when the display device 100 is a transmissive type, the anode electrode 21 is made of a transparent material such as ITO, IZO (registered trademark), or IGZO. The anode electrode 21 is connected to the source s of the driving transistor 3B (refer to FIG. 2) through a contact hole (not shown in the drawing).

The partition wall 22 is made of, for example, an organic material such as polyimide or novolac, and also has a function of ensuring an insulation property between the anode electrode 21 and the cathode electrode 24.

In the organic layer 23, for example, in order from the anode electrode 21 side, a hole injection layer 23A, a hole transport layer 23B, a light emitting layer 23C, an electron transport layer 23D, and an electron injection layer 23E are laminated. The upper surface of the organic layer 23 is covered by the cathode electrode 24. The light emitting layer 23C is, for example, a white light emitting layer having a structure in which a red light emitting layer 23CR, a blue light emitting layer 23CB, and a green light emitting layer 23CG are laminated. The light emitting layer 23C generates white light LW. The white light LW is color-separated into red light LR, green light LG, and blue light LB through the color filter layer CF (the red filter CFR, the green filter CFG, and the blue filter CFB) to be described later.

The organic layer 23 is formed as a common layer on the entire surface of the pixel array section 102 (refer to FIG. 1) in, for example, a vacuum deposition method.

A film thickness, a constituent material, and the like of each of the layers constituting the organic layer 23 are not particularly limited, but examples are described below.

The hole injection layer 23A is a buffer layer for increasing an efficiency of injecting holes into the light emitting layer 23C and preventing leakage. A thickness of the hole injection layer 23A is, for example, preferably 5 nm to 200 nm, and more preferably 8 nm to 150 nm. A constituent material of the hole injection layer 23A may be appropriately selected on the basis of a relationship between this material and materials of adjacent layers and electrodes. Examples of the constituent material include polyaniline, polythiophene, polypyrrole, polyphenylene vinylene, polythienylene vinylene, polyquinoline, polyquinoxaline and derivatives thereof, conductive polymers such as polymers having an aromatic amine structure in the main chain or side chain, metal phthalocyanines (copper phthalocyanine and the like), carbon, and the like. Specific examples of the conductive polymer include oligoaniline and polydioxythiophenes such as poly(3,4-ethylenedioxythiophene) (PEDOT).

The hole transport layer 23B is for increasing an efficiency of transporting holes to the light emitting layer 23C. Depending on the overall configuration of the element, a thickness of the hole transport layer 23B is, for example, preferably 5 nm to 200 nm, and more preferably 8 nm to 150 nm. As a constituent material of the hole transport layer 23B, it may be possible to use a luminescent material which is soluble in an organic solvent. Examples of the constituent material include polyvinyl carbazole, polyfluorene, polyaniline, polysilane and derivatives thereof, derivatives of polysiloxane having an aromatic amine in the side chain or the main chain, polythiophene and derivatives thereof, polypyrrole, $Alq_3$, and the like.

In the light emitting layer 23C, when an electric field is applied, electrons and holes are coupled again, thereby emitting light. Depending on the overall configuration of the element, a thickness of the light emitting layer 23C is, for example, preferably 10 nm to 200 nm, and more preferably 20 nm to 150 nm. The light emitting layer 23C may have a monolayer structure or a laminated layer.

As constituent materials of the light emitting layer 23C, it is possible to use materials corresponding to the respective luminescent colors. Examples of the constituent materials include polyfluorene polymer derivatives, (poly)p-phenylene vinylene derivatives, polyphenylene derivatives, polyvinyl carbazole derivatives, polythiophene derivatives, perylene dyes, coumarin dyes, rhodamine dyes, and organic EL materials doped in the polymers. As the doped material, it is possible to use, for example, rubrene, perylene, 9,10-diphenylanthracene, tetraphenylbutadiene, Nile red, coumarin 6, or the like. It should be noted that mixture of two or more materials mentioned above may be used as the constituent material of the light emitting layer 23C. Further, the constituent material is not limited to high-molecular-weight materials, and may use a combination of low-molecular-weight materials. Examples of the low-molecular-weight materials include benzine, styrylamine, triphenylamine, porphyrin, triphenylene, azatriphenylene, tetracyanoquinodimethane, triazole, imidazole, oxadiazole, polyarylalkanes, phenylenediamine, arylamines, oxazole, anthracene, fluorenone, hydrazone, stilbene and derivatives thereof, and heterocyclic conjugated monomers and oligomers such as polysilane compounds, vinylcarbazole compounds, and thiophene compounds, and aniline compounds.

The constituent materials of the light emitting layer 23C include not only the above-described materials but also luminescent guest materials. As the luminescent guest materials, it may be possible to use materials of which luminous efficiencies are high. Examples of the materials include low-molecular fluorescent materials, and organic luminescent materials such as phosphorescent dyes and metal complexes.

The light emitting layer 23C may be, for example, a hole transport light emitting layer that also has a function of the above-mentioned hole transport layer 23B, and may be an electron transport light emitting layer that also has a function of the electron transport layer 23D to be described later.

The electron transport layer 23D and the electron injection layer 23E are to increase an efficiency of transporting electrons to the light emitting layer 23C. Depending on the overall configuration of the element, a total film thickness of the electron transport layer 23D and the electron injection layer 23E is, for example, preferably 5 nm to 200 nm, and more preferably 10 nm to 180 nm.

As a material of the electron transport layer 23D, it is possible to use an organic material having an excellent electron transport ability. By increasing the efficiency of transporting electrons to the light emitting layer 23C, change in luminescent color caused by the field intensity is suppressed. Specifically, it is preferable to use, for example, arylpyridine derivatives and benzimidazole derivatives. The reason for this is that, in such a manner, even at a low driving voltage, a high electron supply efficiency is maintained. Examples of the material of the electron injection layer 23E include alkali metals, alkaline earth metals, rare earth metals and their oxides, composite oxides, fluorides, carbonates, and the like.

A thickness of the cathode electrode 24 is, for example, approximately 10 nm, and is formed of a material which has optical transparency and has a small work function. Further, it is possible to ensure light extraction by forming a transparent conductive film using an oxide. In this case, it is possible to use ZnO, ITO, IZnO, InSnZnO, or the like. Furthermore, the cathode electrode 24 may be a single layer, but in the example shown in FIG. 4, the cathode electrode 24 has, for example, a structure in which the first layer 24A, the second layer 24B, and the third layer 24C are laminated in order from the anode electrode 21 side.

It is preferable that the first layer 24A is formed of a material which has a small work function and has excellent optical transparency. Specifically, examples of the material include alkaline earth metals such as calcium (Ca) and barium (Ba), alkali metals such as lithium (Li) and cesium (Cs), indium (In), magnesium (Mg), and silver (Ag). Further, examples of the material include alkali metal oxides, alkali metal fluorides, alkaline earth metal oxides, and alkaline earth fluorides such as $Li_2O$, $Cs_2Co_3$, $Cs_2SO_4$, MgF, LiF, and $CaF_2$.

The second layer 24B is formed as thin Mg—Ag electrodes or thin Ca electrodes made of a material which has optical transparency and has excellent conductivity. In order to suppress deterioration of the electrodes, it is preferable that a transparent lanthanoid oxide is used in the third layer 24C. Thereby, the third layer 24C can be used as sealing electrodes capable of extracting light from the upper surface. Further, in the case of the bottom emission type, as the material of the third layer 24C, gold (Au), platinum (Pt), Au—Ge, or the like is used.

The first layer 24A, the second layer 24B, and the third layer 24C are formed in a vacuum deposition method, a sputtering method, a plasma chemical vapor deposition (CVD) method or the like. Further, when the driving method of the display device 100 is an active matrix method, the cathode electrode 24 may be formed in a solid film form on the substrate 10 and may be formed as a common electrode of the light emitting element 20 in a state where the cathode electrode 24 be insulated from the anode electrode 21 by the partition wall 22 and the organic layer 23.

The cathode electrode 24 may be a mixed layer that contains an organic luminescent material such as an aluminum quinoline complex, a styrylamine derivative, or a phthalocyanine derivative. In this case, there may be further provided a separate layer, such as an Mg—Ag layer, which has optical transparency. Further, the cathode electrode 24 is not limited to having the laminated structure, and it is needless to say that the cathode electrode 24 may have a laminated structure as an optimal combination corresponding to a structure of the manufactured device. For example, the cathode electrode 24 according to the present embodiment is configured to have a laminated structure in which functions of the respective layers of the electrode are separate. In the laminated structure, there are the following separate layers: an inorganic layer (first layer 24A) that promotes electron injection into the organic layer 23; an inorganic layer (second layer 24B) that serves as an electrode; and an inorganic layer (third layer 24C) that protects the electrode. However, the inorganic layer that promotes electron injection into the organic layer 23 may also have a function of the inorganic layer that serves as an electrode, and such a layer may have a monolayer structure.

When the light emitting element 20 has a cavity structure, it is preferable that the cathode electrode 24 is made of a semi-transparent and semi-reflective material. Thereby, the emitted light, which interferes multiple times between the light reflective surface close to the anode electrode 21 and the light reflective surface close to the cathode electrode 24, is extracted from the cathode electrode 24 side. In this case, an optical distance between the light reflective surface close to the anode electrode 21 and the light reflective surface close to the cathode electrode 24 is defined by a wavelength of light to be extracted, and film thicknesses of the respective layers are set depending on the optical distance. In such a top emission display element, by positively using the cavity, it is possible to improve an efficiency of extracting light to the outside and to control an emission spectrum.

For example, the display device 100 can be manufactured as follows.

Figure 5:
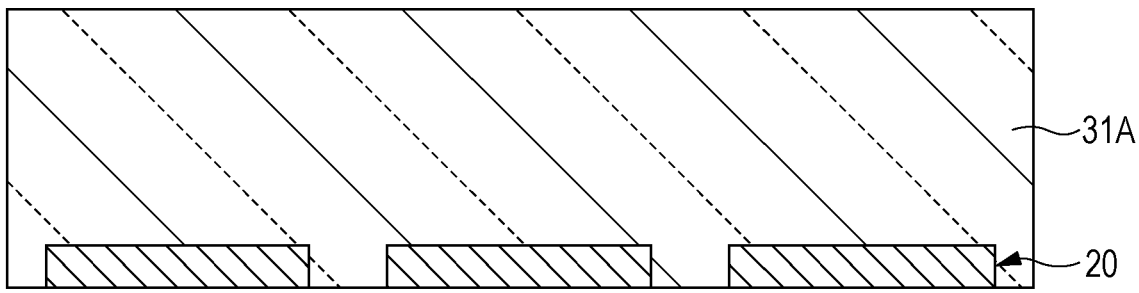
FIG. 5 is a cross-sectional view illustrating a method of manufacturing the display device shown in FIG. 3 in a processing order.

FIGS. 5 to 10 show a method of manufacturing the display device 100 in a processing order. First, as shown in FIG. 5, the anode electrodes 21, the partition walls 22, the organic layer 23, and the cathode electrode 24 are formed on the substrate 10 (refer to FIG. 4), thereby forming the light emitting element 20. Then, as shown in FIG. 5, a protective layer base film 31A is formed on the light emitting element 20.

Figure 6:
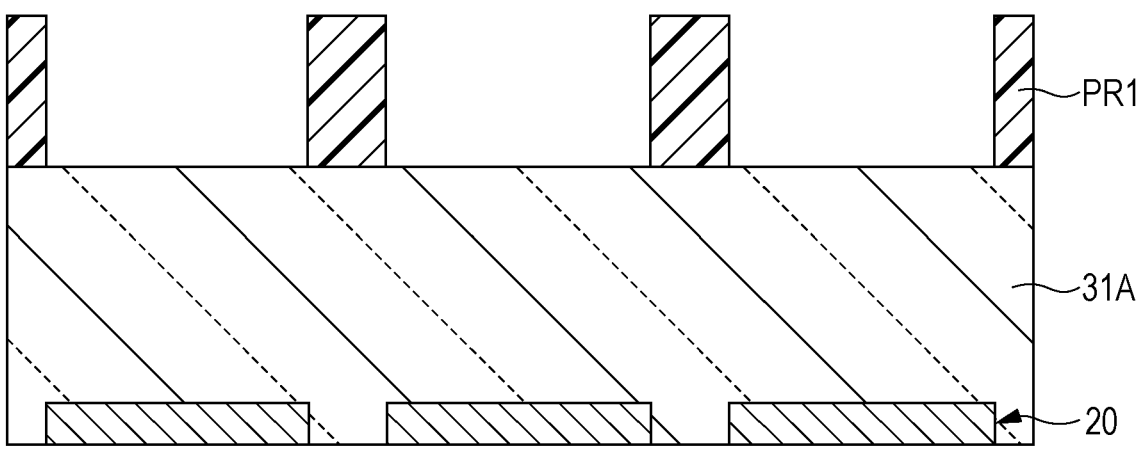
FIG. 6 is a cross-sectional view illustrating a process subsequent to the process of FIG. 5.
Figure 7:
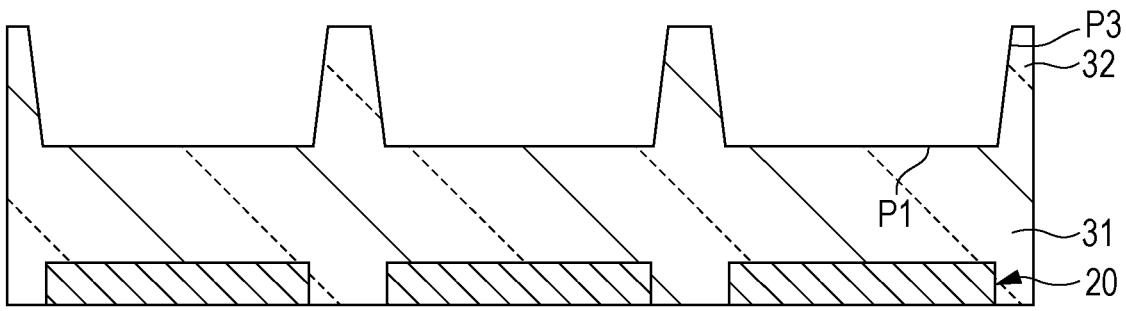
FIG. 7 is a cross-sectional view illustrating a process subsequent to the process of FIG. 6.

Subsequently, as shown in FIG. 6, a photoresist layer PR1 is formed on the protective layer base film 31A. Thereafter, as shown in FIG. 7, through etching performed when the photoresist layer PR1 is used as a mask, the protective layer base film 31A is etched, and the photoresist layer PR1 is removed. Thereby, a first protective layer 31 is formed in a region of the light incident surface P1 of the color filter layer CF, and a second protective layer 32 is formed in a region of the side surface P3 of the color filter layer CF.

Figure 8:
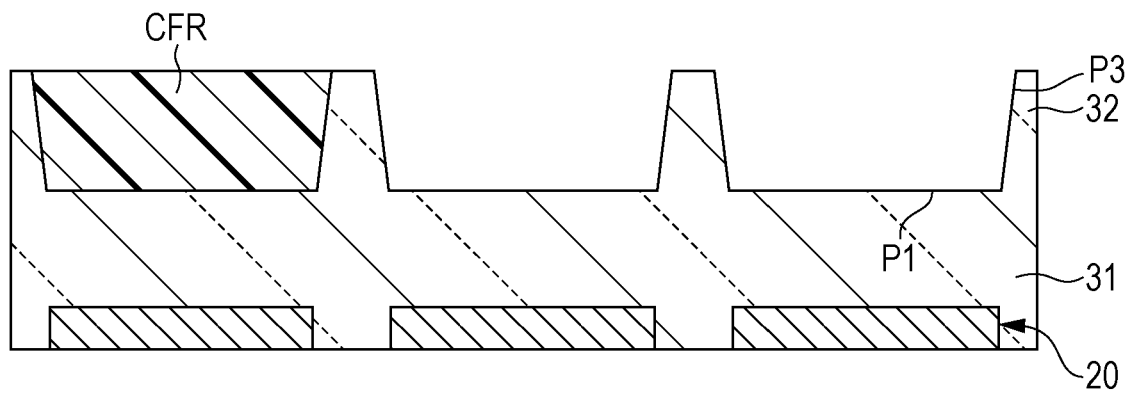
FIG. 8 is a cross-sectional view illustrating a process subsequent to the process of FIG. 7.

After the first protective layer 31 and the second protective layer 32 are formed, as shown in FIG. 8, a red filter CFR is formed on the first protective layer 31 and the second protective layer 32 by using a negative photoresist.

Figure 9:
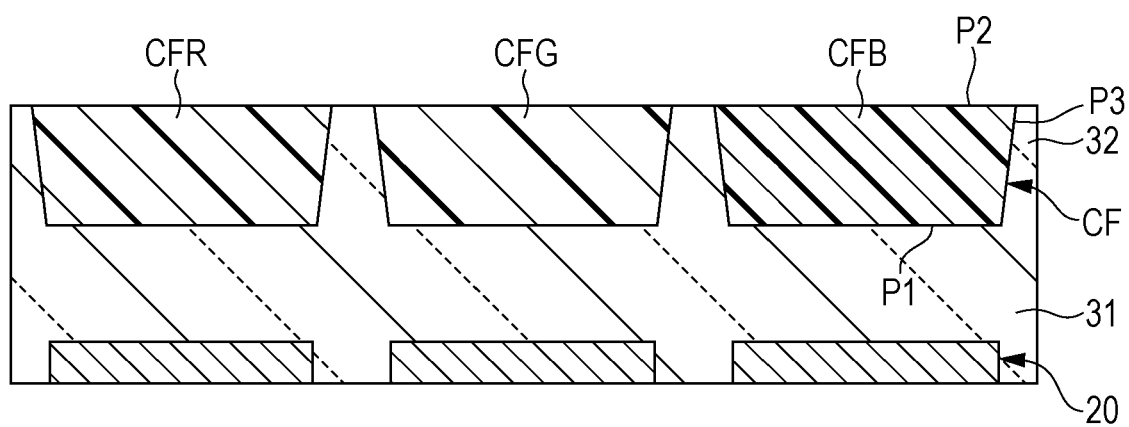
FIG. 9 is a cross-sectional view illustrating a process subsequent to the process of FIG. 8.

Subsequently, as shown in FIG. 9, similarly to the red filter CFR, a blue filter CFB and a green filter CFG are sequentially formed using negative photoresists. Thereby, the color filter layer CF is formed.

Here, the first protective layer 31 is provided on the light incident surface P1 of the color filter layer CF of the color change member 30, and the second protective layer 32 is provided on at least a part of the side surface P3 of the color filter layer CF. There is a concern about deterioration of the organic layer 23, particularly, the light emitting layer 23C to be described later. Thus, it may be difficult to thermally cure the color filter layer CF at a high temperature, and the color filter layer CF may not be cured or may be insufficiently cured. Even in this case, it is possible to suppress defects caused by diffusion of residual solvents and degassed components in the color filter layer CF, and thus it is possible to suppress deterioration in reliability. The defects include mixing between the adjacent color filter layers CF, deterioration of the organic layer 23, and the like.

By forming the color filter layer CF in a space region defined by the first protective layer 31 and the second protective layer 32, variation in the shape of the color filter layer CF can be suppressed. Accordingly, by suppressing variation in an amount of transmitted light in the vicinity of the boundary of the color filter layer CF, it is possible to reduce variation in the emission chromaticity point of the display device 100.

Figure 10:
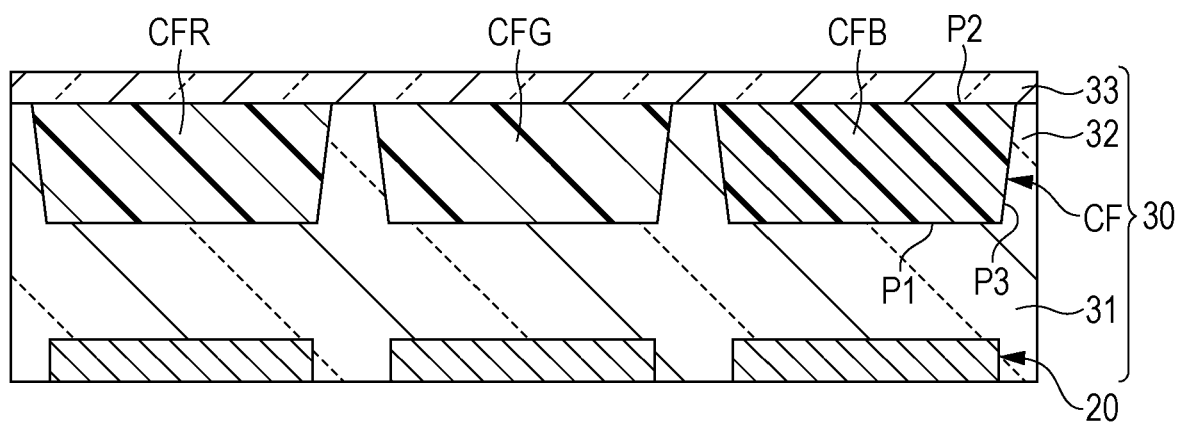
FIG. 10 is a cross-sectional view illustrating a process subsequent to the process of FIG. 9.

Thereafter, as shown in FIG. 10, the third protective layer 33 is formed on the light emission surface P2 of the color filter layer CF and the second protective layer 32. Thereby, it is possible to suppress defects caused by diffusion of residual solvents and degassed components in the color filter layer CF, and thus it is possible to further suppress deterioration in reliability. The defects include deterioration of the sealing resin layer 41, and peeling of the sealing resin layer 41.

Finally, as shown in FIG. 3, the sealing resin layer 41 is formed on the third protective layer 33, and the sealing substrate 42 is bonded to the third protective layer 33 through the sealing resin layer 41. Thus, the display device 100 shown in FIG. 3 is completely formed.

In the display device 100, the sampling transistor 3A becomes conductive in response to a control signal supplied from the scanning line WSL, and a signal potential of a video signal supplied from the signal line DTL is sampled, and is retained in the retentive capacitor 3C. Further, current is supplied to the driving transistor 3B from the power supply line DSL, and driving current is supplied to the light emitting element 3D (light emitting element 20) in response to the signal potential retained in the retentive capacitor 3C. The light emitting element 3D (light emitting element 20) emits light at a luminance corresponding to the signal potential of the video signal, depending on the supplied driving current, thereby generating the white light LW. A color of the white light LW is changed by the color filter layer CF, the white light LW is changed into the red light LR, the green light LG, and the blue light LB, and is transmitted through and extracted from the sealing substrate 42.

Here, the first protective layer 31 is provided on the light incident surface P1 of the color filter layer CF, and the second protective layer 32 is provided on at least a part of the side surface P3 of the color filter layer CF. Therefore, it is possible to suppress diffusion of residual solvents and degassed components in the color filter layer CF in the downward direction and the horizontal direction. Accordingly, it is possible to suppress defects such as mixing between the adjacent color filter layers CF and deterioration of the organic layer 23, and thus it is possible to suppress deterioration in reliability.

Further, the third protective layer 33 is provided on at least a part of the light emission surface P2 of the color filter layer CF. Therefore, it is possible to suppress diffusion of residual solvents and degassed components in the color filter layer CF in the upward direction. Accordingly, it is possible to suppress deterioration and removal of the sealing resin layer 41 and the like, and thus it is possible to further suppress deterioration in reliability.

As described above, in the present embodiment, the first protective layer 31 is provided on the light incident surface P1 of the color filter layer CF of the color change member 30, and the second protective layer 32 is provided on at least a part of the side surface P3 of the color filter layer CF. Accordingly, it is possible to suppress diffusion of residual solvents and degassed components in the color filter layer CF in the downward direction or the horizontal direction, and thus it is possible to suppress deterioration in reliability.

Further, the third protective layer 33 is provided on at least a part of the light emission surface P2 of the color filter layer CF. Therefore, it is possible to suppress diffusion of residual solvents and degassed components in the color filter layer CF in the upward direction, and thus it is possible to further suppress deterioration in reliability.

Second Embodiment

Figure 11:
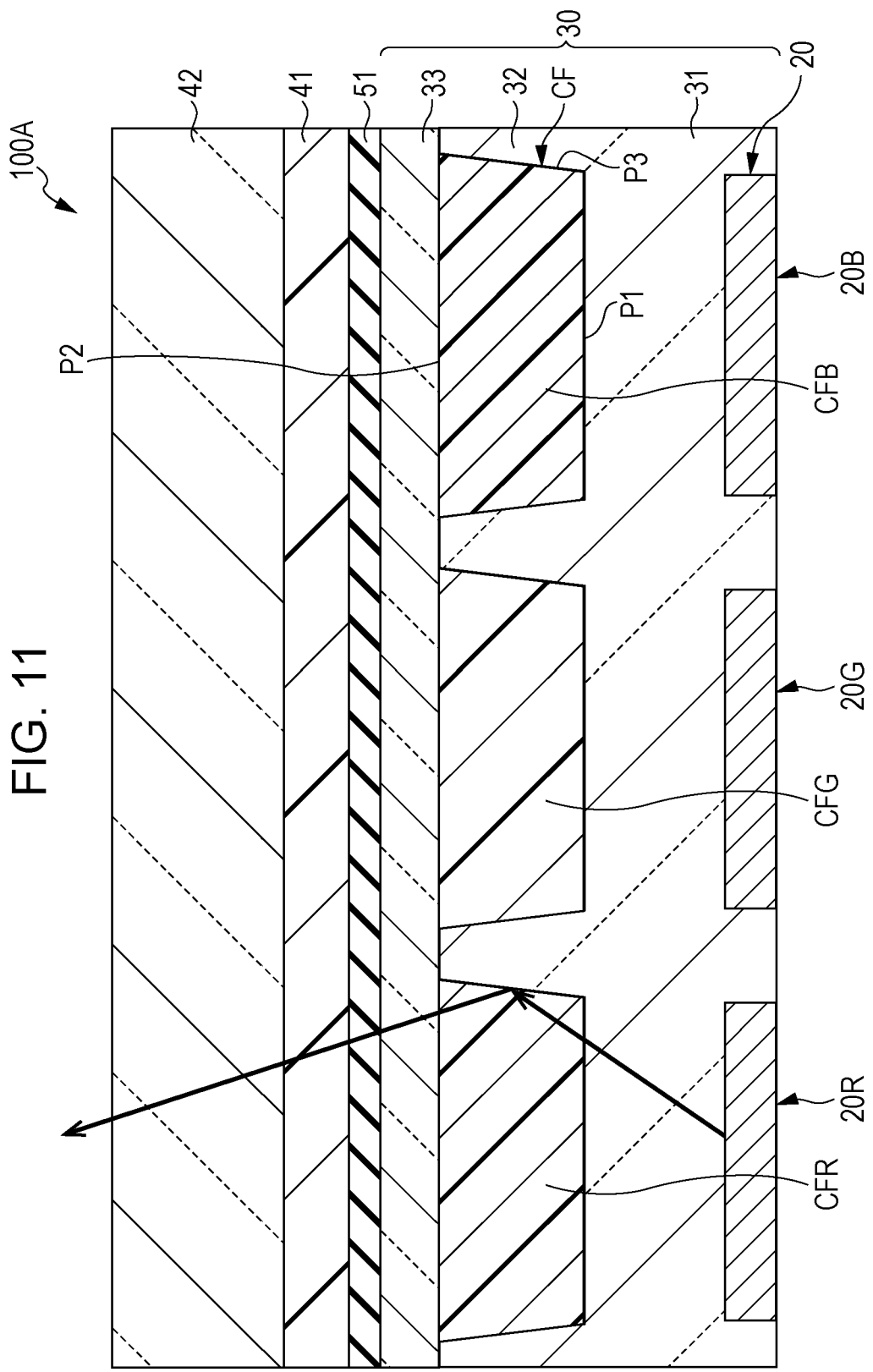
FIG. 11 is a cross-sectional view illustrating a schematic configuration of three adjacent pixels in a display device according to a second embodiment of the present disclosure.

FIG. 11 is a schematic cross-sectional configuration of three adjacent pixels PX in a display device 100A according to a second embodiment of the present disclosure. The display device 100A has the same configuration as the display device 100 according to the first embodiment except that an antireflection film 51 is provided between the third protective layer 33 of the color change member 30 and the sealing resin layer 41. Accordingly, the corresponding components will be referenced by the same numerals and signs.

The antireflection film 51 is for increasing the light extraction efficiency by suppressing reflection of the emitted light caused by the difference in the refractive index between the third protective layer 33 of the color change member 30 and the sealing resin layer 41. The antireflection film 51 is, for example, a low refractive index film made of silicon oxynitride (SiON) (the refractive index N is approximately 1.7).

After the third protective layer 33 of the color change member 30 is formed, before the sealing resin layer 41 is formed, the display device 100A can be manufactured in a manner similar to that of the first embodiment except that the antireflection film 51 is formed on the third protective layer 33.

In the display device 100A, the antireflection film 51 is provided between the third protective layer 33 of the color change member 30 and the sealing resin layer 41. Therefore, it is possible to increase the light extraction efficiency by suppressing reflection of the emitted light caused by the difference in the refractive index between the third protective layer 33 of the color change member 30 and the sealing resin layer 41.

Third Embodiment

Figure 12:
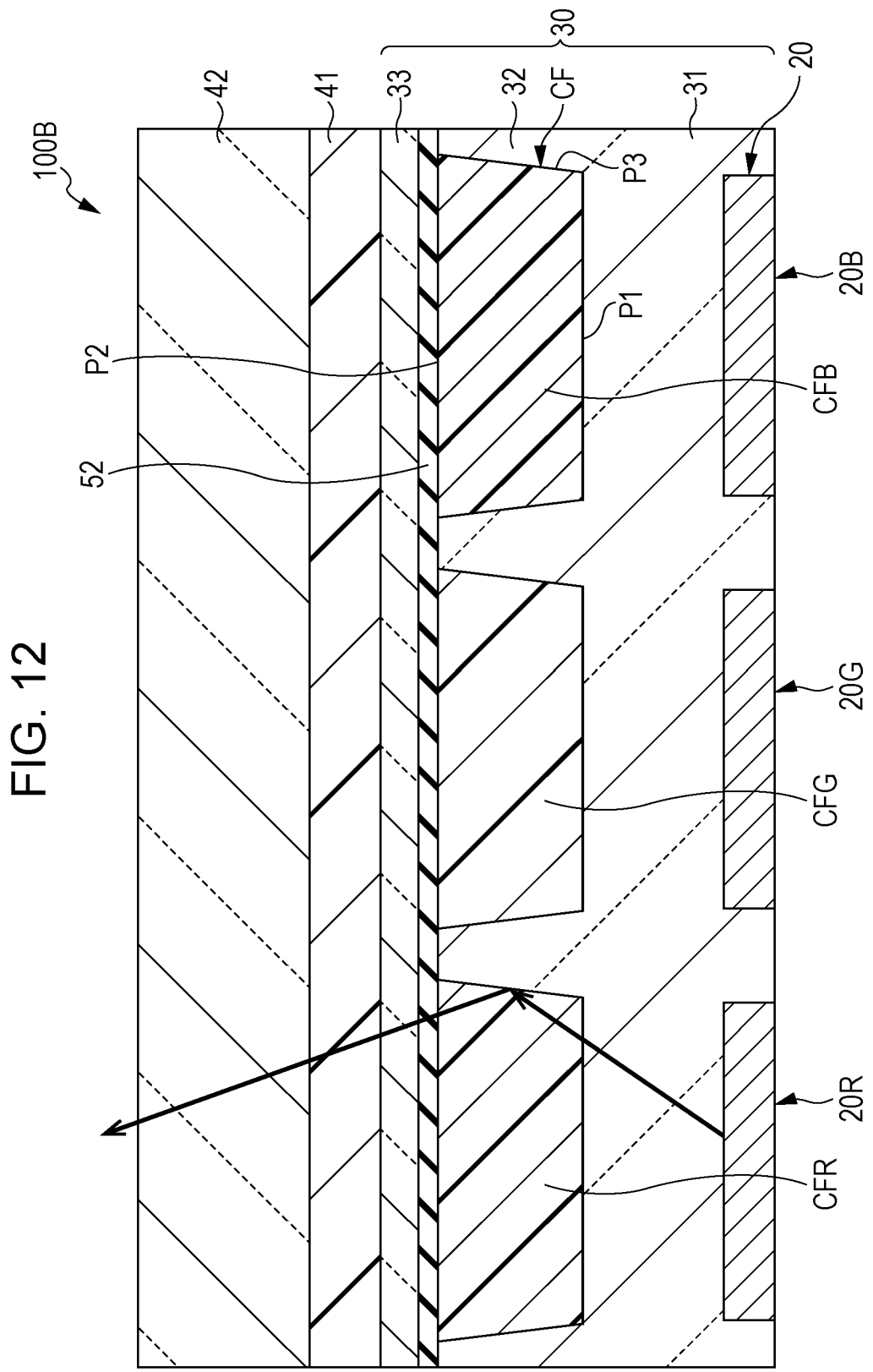
FIG. 12 is a cross-sectional view illustrating a schematic configuration of three adjacent pixels in a display device according to a third embodiment of the present disclosure.

FIG. 12 is a schematic cross-sectional configuration of three adjacent pixels PX in a display device 100B according to a third embodiment of the present disclosure. The display device 100B has the same configuration as the display device 100 according to the first embodiment except that an antireflection film 52 is provided between the light emission surface P2 of the color filter layer CF and the third protective layer 33 of the color change member 30. Accordingly, the corresponding components will be referenced by the same numerals and signs.

The antireflection film 52 is for increasing the light extraction efficiency by suppressing reflection of the emitted light caused by the difference in the refractive index between the color filter layer CF and the third protective layer 33. Similarly to the antireflection film 51 in the second embodiment, the antireflection film 52 is, for example, a low refractive index film made of silicon oxynitride (SiON) (the refractive index N is approximately 1.7).

After the color filter layer CF of the color change member 30 is formed, before the third protective layer 33 is formed, the display device 100B can be manufactured in a manner similar to that of the first embodiment except that the antireflection film 52 is formed on the color filter layer CF.

In the display device 100B, the antireflection film 52 is provided between the color filter layer CF and the third protective layer 33 of the color change member 30. Therefore, it is possible to increase the light extraction efficiency by suppressing reflection of the emitted light caused by the difference in the refractive index between the color filter layer CF and the third protective layer 33.

Fourth Embodiment

Figure 13:
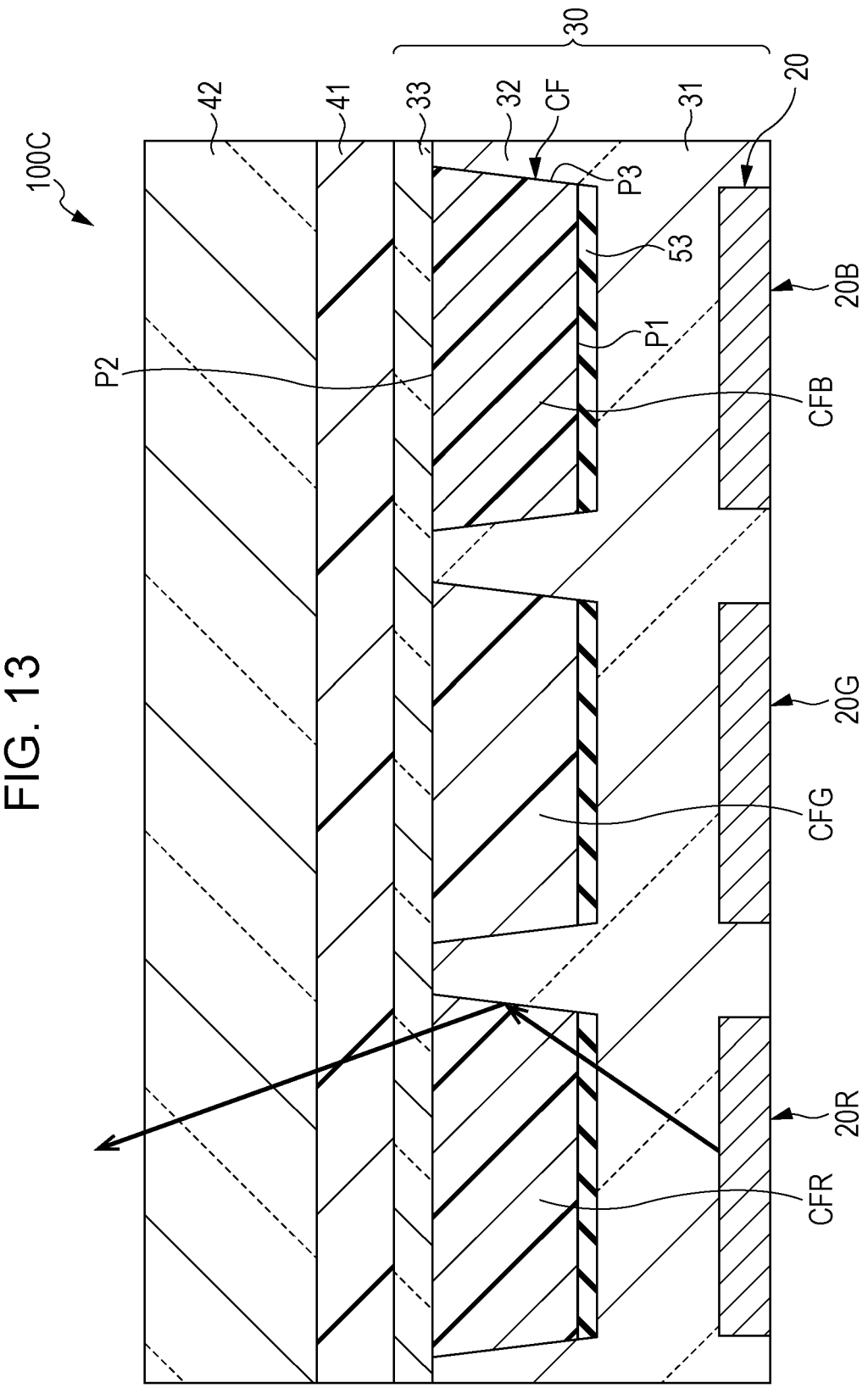
FIG. 13 is a cross-sectional view illustrating a schematic configuration of three adjacent pixels in a display device according to a fourth embodiment of the present disclosure.

FIG. 13 is a schematic cross-sectional configuration of three adjacent pixels PX in a display device 100C according to a fourth embodiment of the present disclosure. The display device 100C has the same configuration as the display device 100 according to the first embodiment except that an antireflection film 53 is provided between the light incident surface P1 of the color filter layer CF and the first protective layer 31 of the color change member 30. Accordingly, the corresponding components will be referenced by the same numerals and signs.

The antireflection film 53 is for increasing the light extraction efficiency by suppressing reflection of the emitted light caused by the difference in the refractive index between the color filter layer CF and the first protective layer 31. Similarly to the antireflection film 51 in the second embodiment, the antireflection film 53 is, for example, a low refractive index film made of silicon oxynitride (SiON) (the refractive index N is approximately 1.7).

For example, the display device 100C can be manufactured as follows.

First, in a manner similar to that of the first embodiment, through the processes shown in FIGS. 5 to 7, the first protective layer 31 and the second protective layer 32 are formed on the light emitting element 20.

Then, an antireflection base film (not shown in the drawing) such as the above-mentioned silicon oxynitride (SiON) film is formed on the first protective layer 31 and the second protective layer 32. Subsequently, a photoresist layer (not shown in the drawing) is formed on the antireflection base film, and openings are provided on the second protective layer 32 through the photolithography.

Thereafter, through etching performed when the photoresist layer is used as a mask, the portions of the antireflection base film formed on the second protective layer 32 are removed, and the photoresist layer is removed. Thereby, the antireflection film 53 is formed on the first protective layer 31.

Subsequently, in a manner similar to that of the first embodiment, through the processes shown in FIGS. 8 to 10, the color filter layer CF, the third protective layer 33, the sealing resin layer 41, and the sealing substrate 42 are formed. Thus, the display device 100C shown in FIG. 13 is completely formed.

In the display device 100C, the antireflection film 53 is provided between the color filter layer CF and the first protective layer 31 of the color change member 30. Therefore, it is possible to increase an amount of light, which is generated by the light emitting layer 23C and is incident onto the color filter layer CF, by suppressing reflection of the emitted light caused by the difference in the refractive index between the color filter layer CF and the first protective layer 31. Accordingly, it is possible to increase the light extraction efficiency.

Modification Examples 4-1 and 4-2

Figure 14:
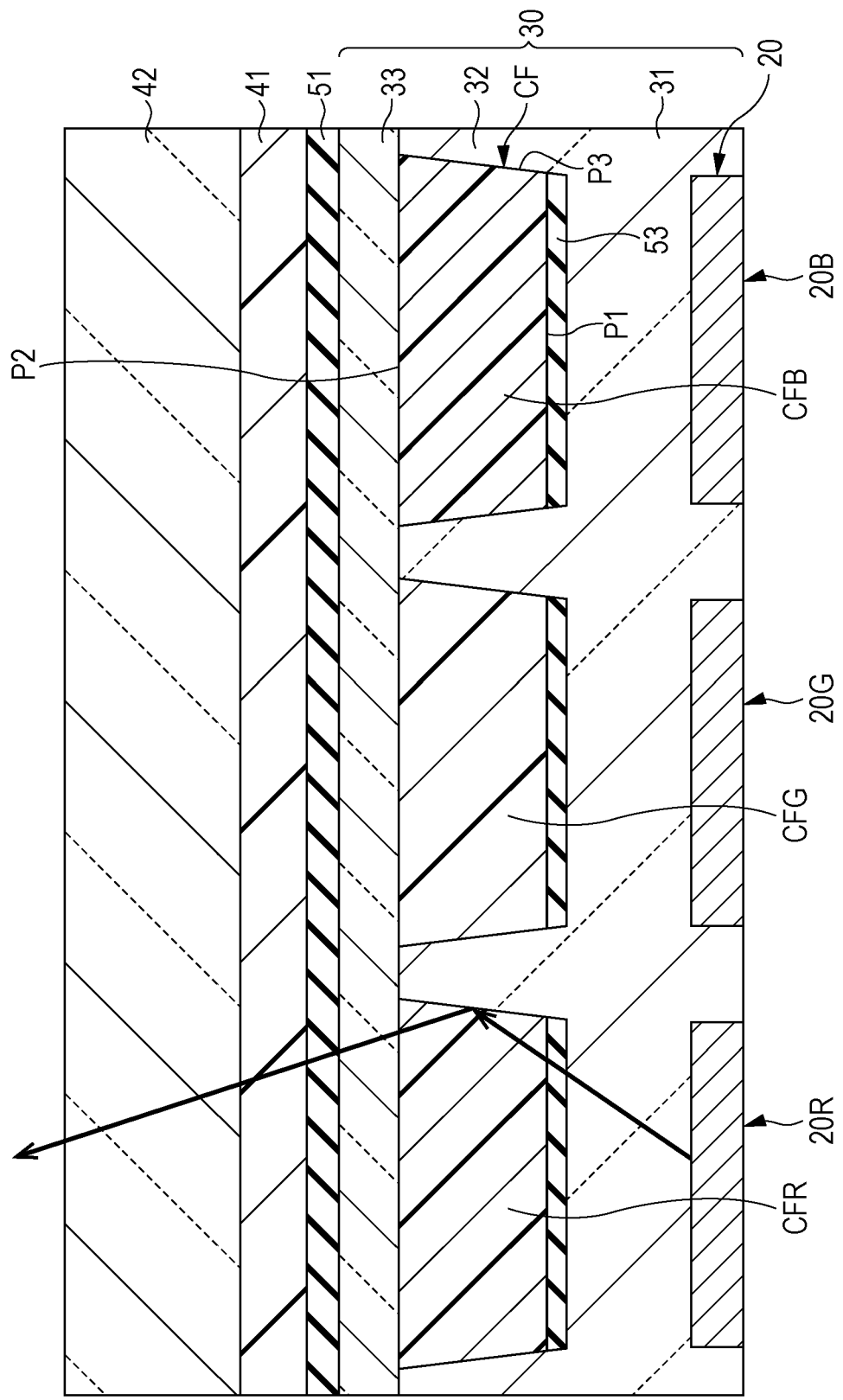
FIG. 14 is a cross-sectional view illustrating a schematic configuration of three adjacent pixels in a display device according to Modification Example 4-1.
Figure 15:
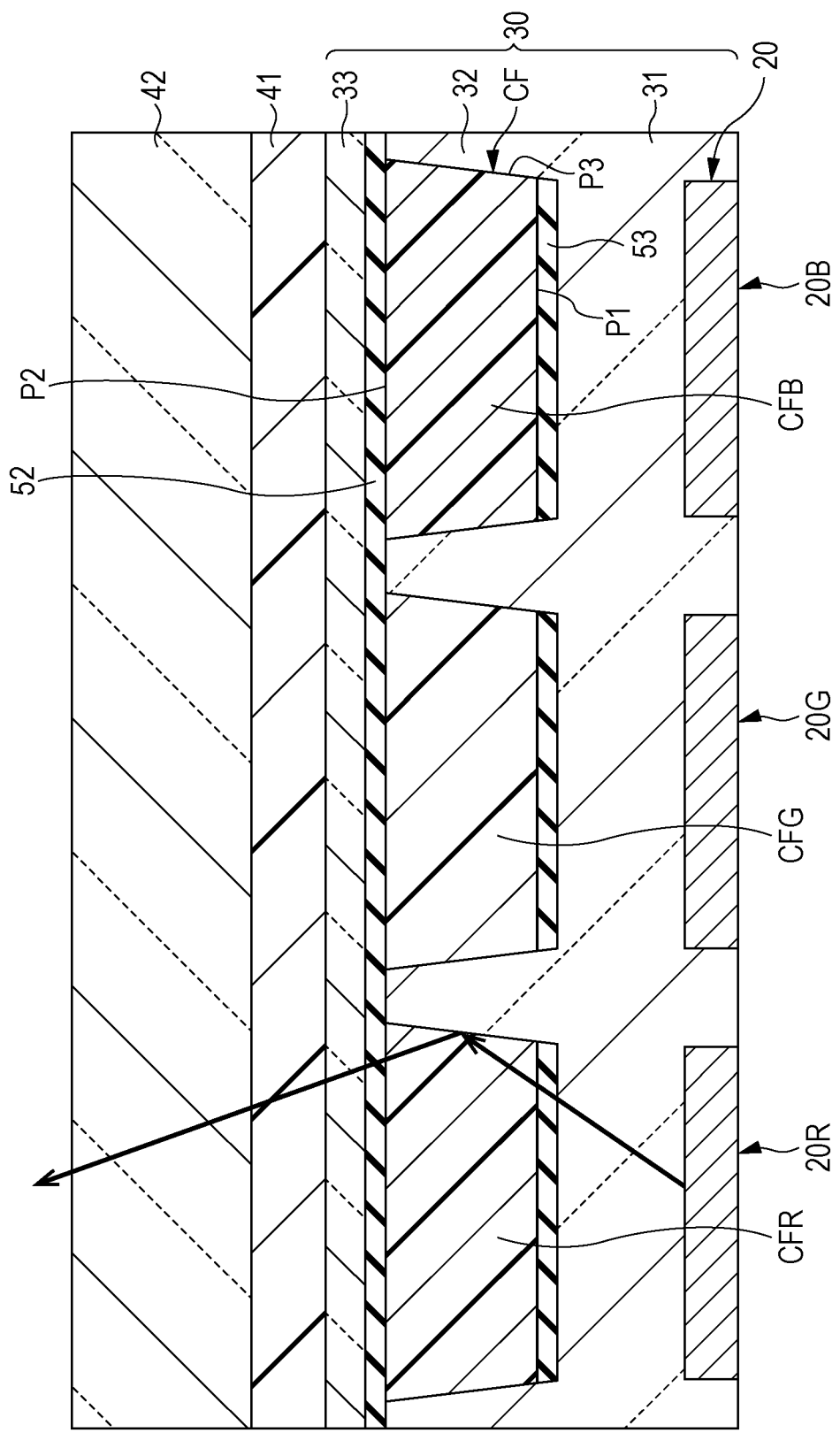
FIG. 15 is a cross-sectional view illustrating a schematic configuration of three adjacent pixels in a display device according to Modification Example 4-2.

It should be noted that the present embodiment may be combined with the second or third embodiment. That is, for example as shown in FIG. 14, in the display device 100C of the present embodiment, in a manner similar to that of the second embodiment, the antireflection film 51 may be provided between the third protective layer 33 of the color change member 30 and the sealing resin layer 41. Alternatively, for example as shown in FIG. 15, in the display device 100C of the present embodiment, in a manner similar to that of the third embodiment, the antireflection film 52 may be provided between the third protective layer 33 and the color filter layer CF of the color change member 30.

Further, although not shown in the drawing, the present embodiment may be combined with both of the second and third embodiments. That is, in the display device 100C of the present embodiment, in a manner similar to that of the second embodiment, the antireflection film 51 may be provided between the third protective layer 33 of the color change member 30 and the sealing resin layer 41, and in a manner similar to that of the third embodiment, the antireflection film 52 may be provided between the third protective layer 33 and the color filter layer CF of the color change member 30.

Fifth Embodiment

Figure 16:
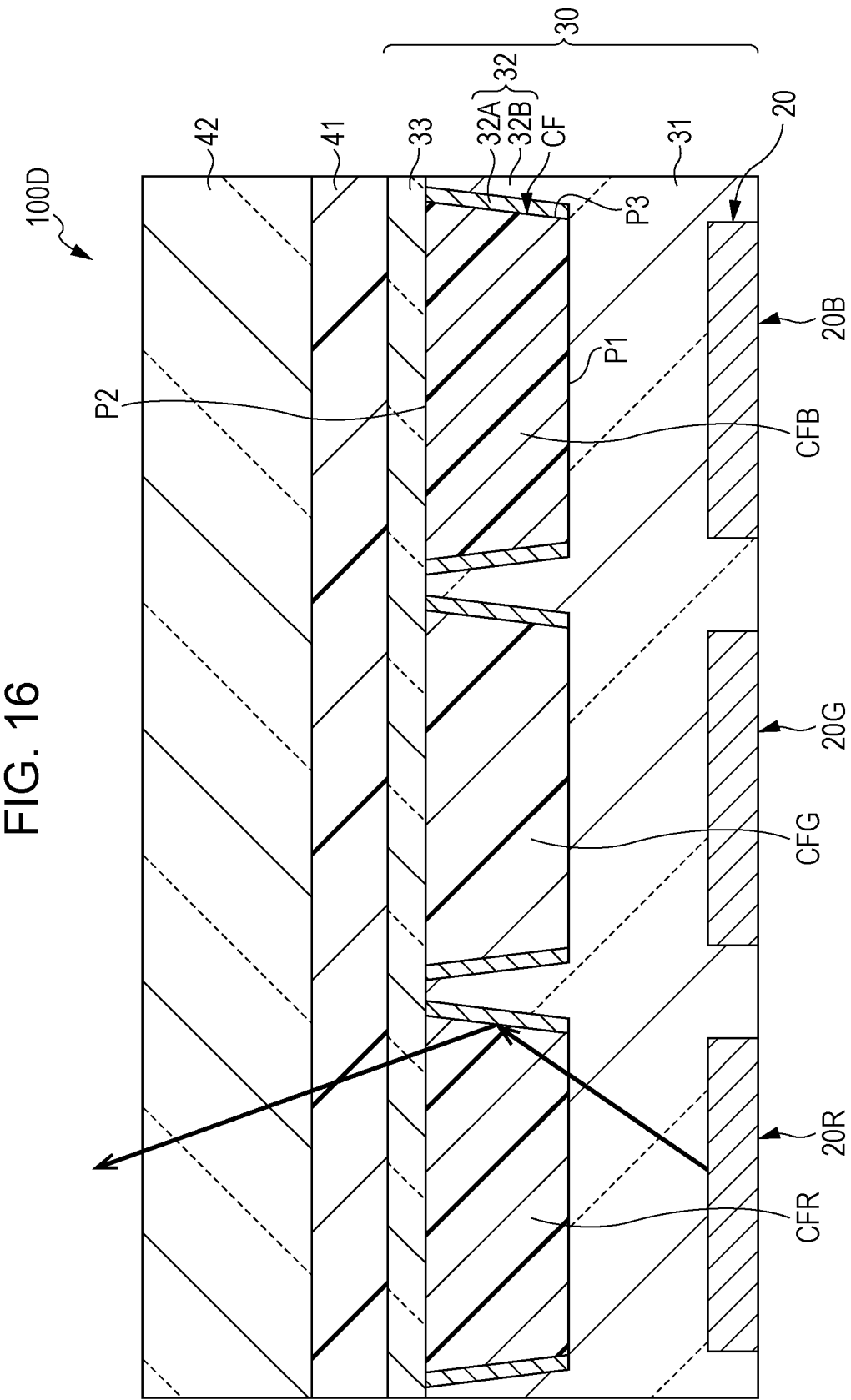
FIG. 16 is a cross-sectional view illustrating a schematic configuration of three adjacent pixels in a display device according to a fifth embodiment of the present disclosure.

FIG. 16 is a schematic cross-sectional configuration of three adjacent pixels PX in a display device 100D according to a fifth embodiment of the present disclosure. The display device 100D has the same configuration as the display device 100 according to the first embodiment except that the second protective layer 32 of the color change member 30 includes a metal film 32A. Accordingly, the corresponding components will be referenced by the same numerals and signs.

Specifically, the second protective layer 32 has a laminated structure including the metal film 32A, for example, a structure in which the metal film 32A and a transparent film 32B are laminated. The metal film 32A is formed as a metal film having high reflectivity or high light blocking ability. Examples of the metal film include a titanium (Ti) film, an aluminum (Al) film, a tungsten (W) film, and the like. Similarly to the first protective layer 31 of the first embodiment, it is preferable that the transparent film 32B is formed as a transparent inorganic base film that has a high transmittance and a high passivation ability. Examples of the film include a silicon nitride (SiN) film, a silicon oxynitride (SiON) film, an aluminum oxide film ($Al_2O_3$), and the like.

In the present embodiment, the second protective layer 32 includes the metal film 32A. Therefore, in addition to the effect of the first embodiment, the side surface P3 of the color filter layer CF can be protected by the metal film 32A, and it is possible to prevent mixing of colors. That is, light, which reaches the side surface P3 of the color filter layer CF, is reflected by the metal film 32A, and is thus prevented from being incident into the adjacent color filter layer CF.

For example, the display device 100D can be manufactured as follows.

FIGS. 17 to 20 show a method of manufacturing the display device 100D in a processing order. It should be noted that the same processes as those in the first embodiment will be described with reference to FIGS. 5 to 10. First, in a manner similar to that of the first embodiment, through the process shown in FIG. 5, the light emitting element 20 and the protective layer base film 31A are formed on the substrate 10 (refer to FIG. 4).

Subsequently, in a manner similar to that of the first embodiment, through the processes shown in FIGS. 6 and 7, the photoresist layer PR1 is formed on the protective layer base film 31A, through etching performed when the photoresist layer PR1 is used as a mask, the protective layer base film 31A is etched, and the photoresist layer PR1 is removed. Thereby, the first protective layer 31 is formed in a region of the light incident surface P1 of the color filter layer CF, and the transparent film 32B of the second protective layer 32 is formed in a region of the side surface P3 of the color filter layer CF.

Figure 17:
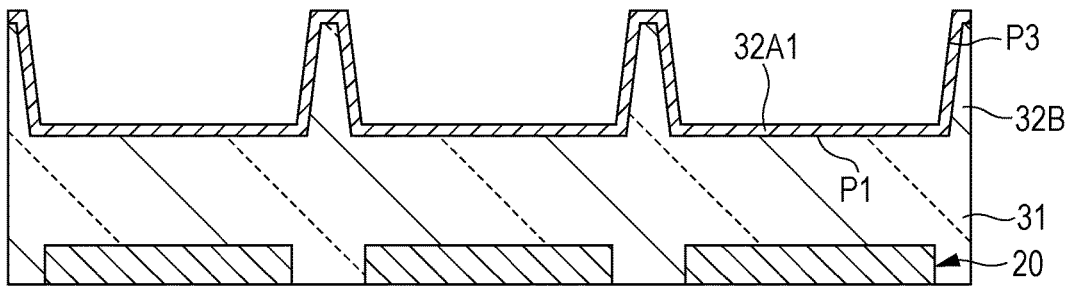
FIG. 17 is a cross-sectional view illustrating a method of manufacturing the display device shown in FIG. 16 in a processing order.
Figure 18:
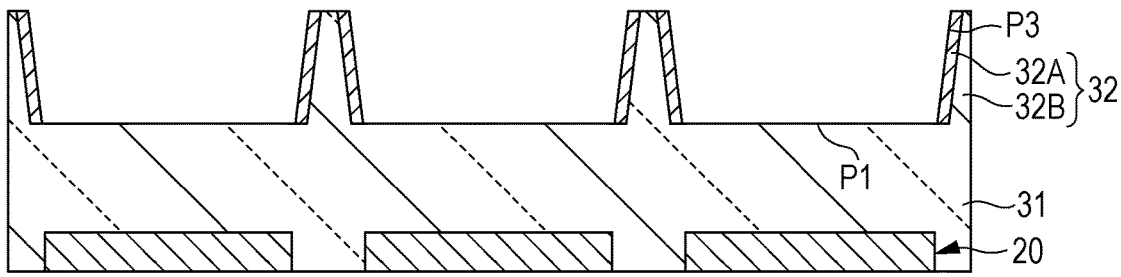
FIG. 18 is a cross-sectional view illustrating a process subsequent to the process of FIG. 17.

After the first protective layer 31 and the transparent film 32B of the second protective layer 32 are formed, as shown in FIG. 17, a metal base film 32A1 is formed on the first protective layer 31 and the transparent film 32B of the second protective layer 32. Subsequently, as shown in FIG. 18, by removing the metal base film 32A1 of the first protective layer 31 through etch back of the metal base film 32A1, the metal film 32A of the second protective film 32 is formed in a region of the side surface P3 of the color filter layer CF. In such a manner, the second protective layer 32 having a structure, in which the metal film 32A and the transparent film 32B are laminated, is formed.

Figure 19:
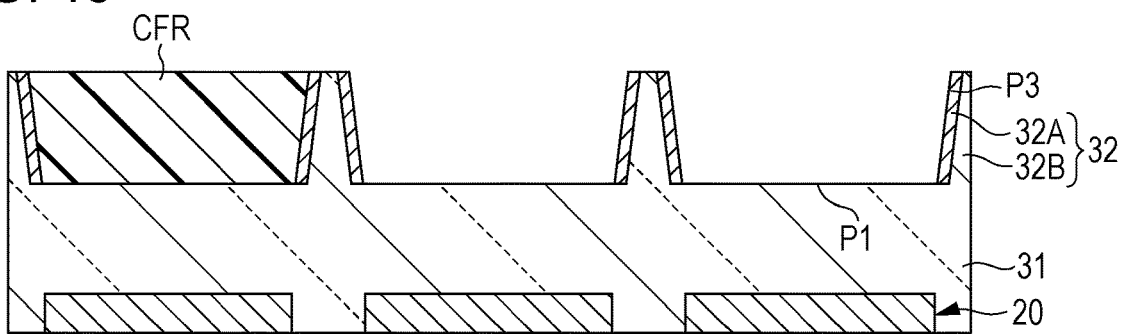
FIG. 19 is a cross-sectional view illustrating a process subsequent to the process of FIG. 18.

Thereafter, as shown in FIG. 19, the red filter CFR is formed on the first protective layer 31 and the second protective layer 32 by using a negative photoresist.

Figure 20:
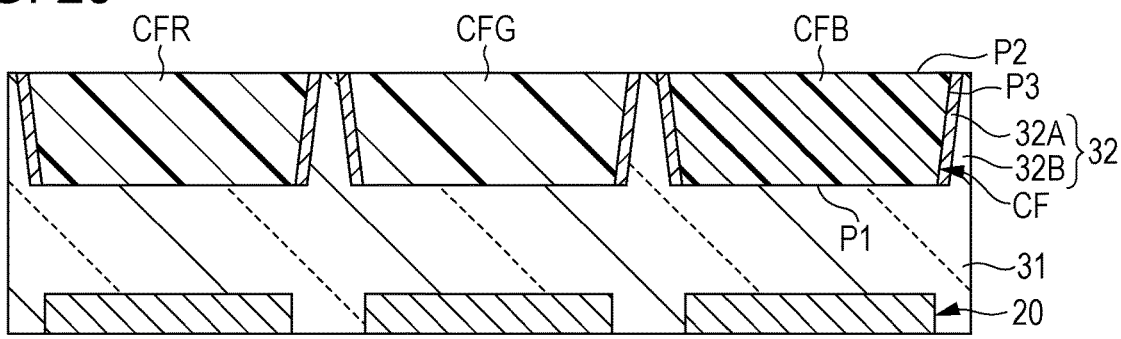
FIG. 20 is a cross-sectional view illustrating a process subsequent to the process of FIG. 19.

Subsequently, as shown in FIG. 20, similarly to the red filter CFR, the blue filter CFB and the green filter CFG are sequentially formed using negative photoresists. Thereby, the color filter layer CF is formed.

Thereafter, in a manner similar to that of the first embodiment, through the process shown in FIG. 10, as shown in FIG. 16, the third protective layer 33 is formed on the light emission surface P2 of the color filter layer CF and second protective layer 32.

Finally, as shown in FIG. 16, the sealing resin layer 41 is formed on the third protective layer 33, and the sealing substrate 42 is bonded to the third protective layer 33 through the sealing resin layer 41. Thus, the display device 100D shown in FIG. 16 is completely formed.

Modification Examples 5-1 to 5-3

Figure 21:
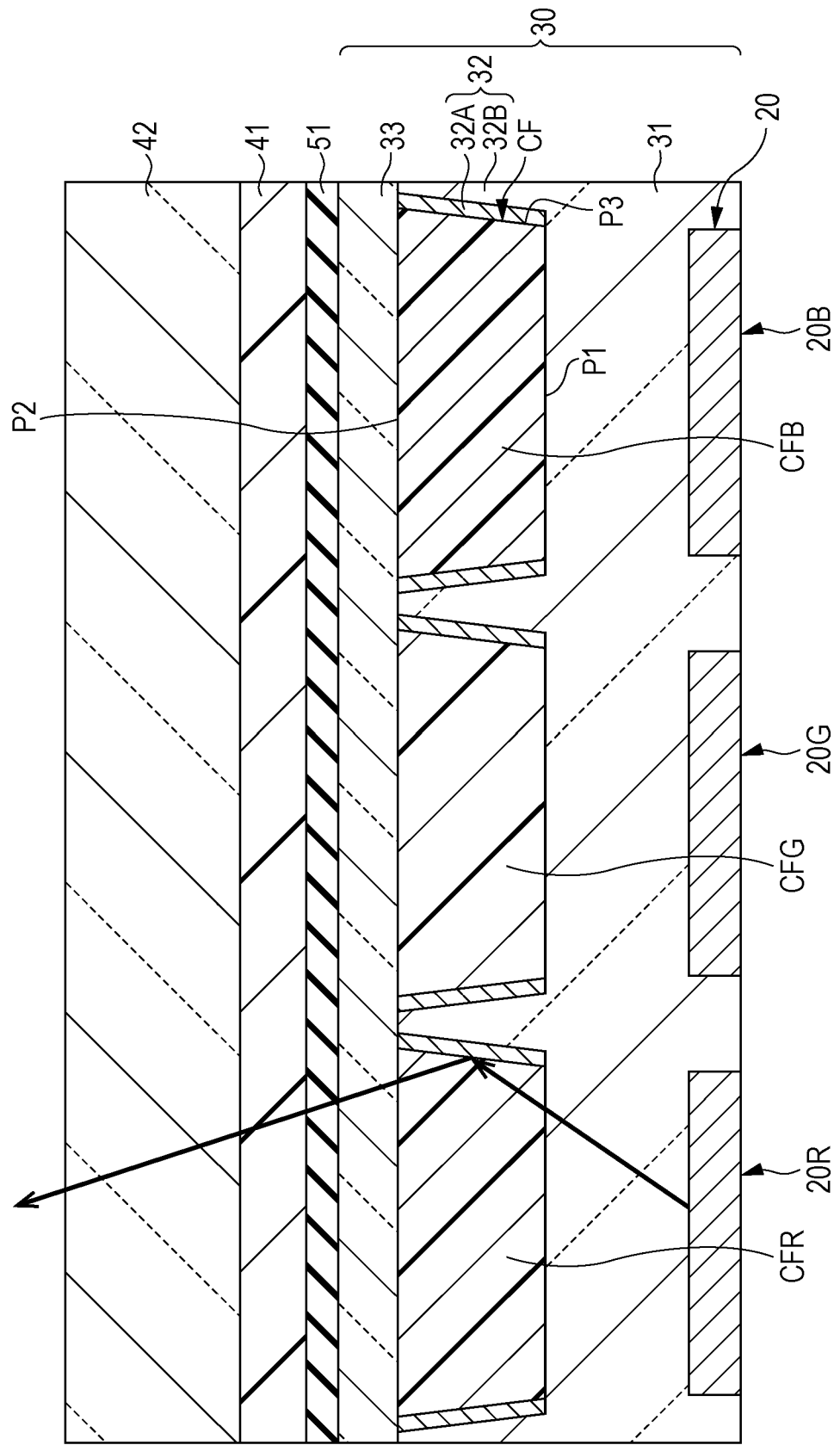
FIG. 21 is a cross-sectional view illustrating a schematic configuration of three adjacent pixels in a display device according to Modification Example 5-1.
Figure 22:
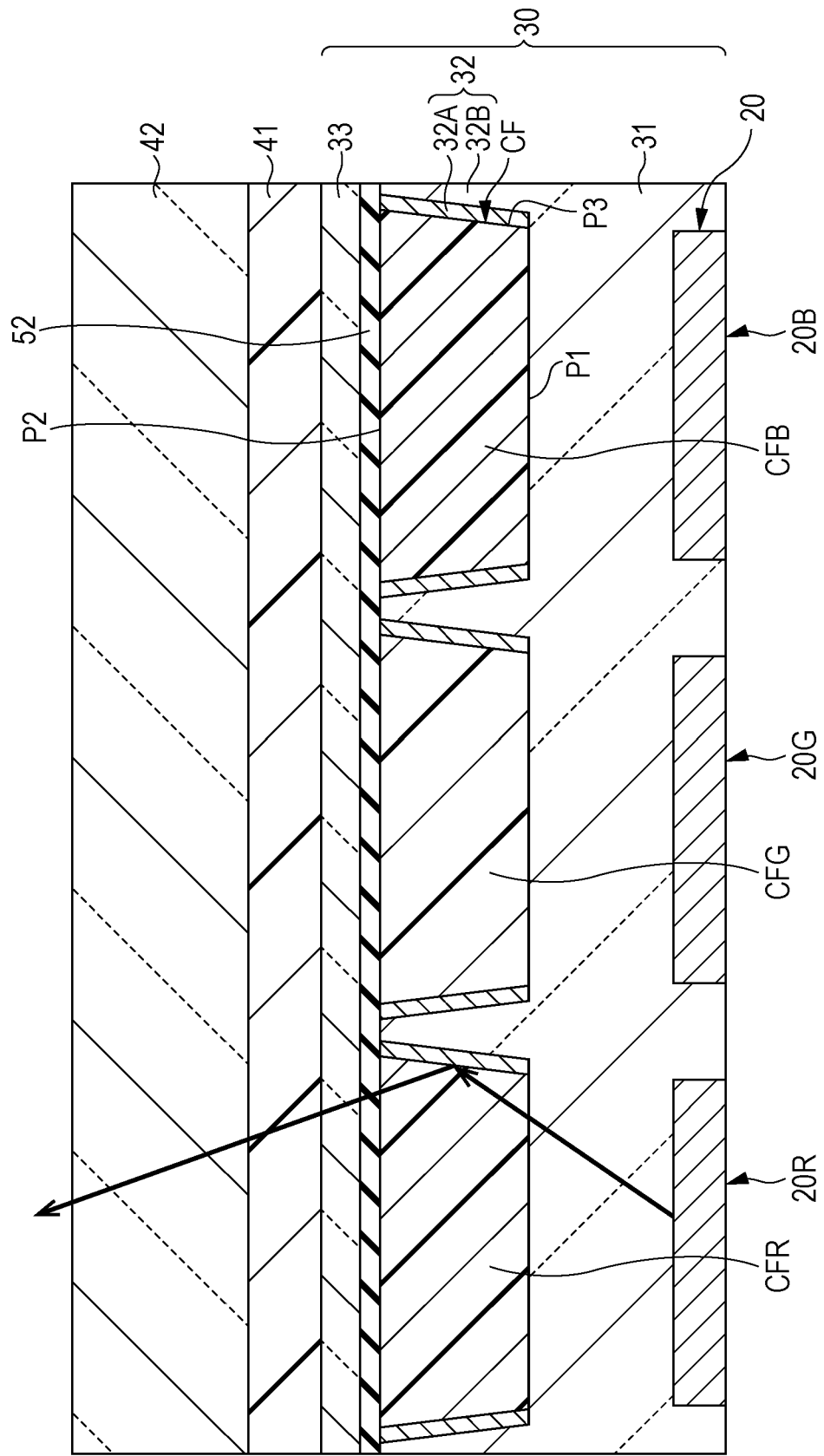
FIG. 22 is a cross-sectional view illustrating a schematic configuration of three adjacent pixels in a display device according to Modification Example 5-2.
Figure 23:
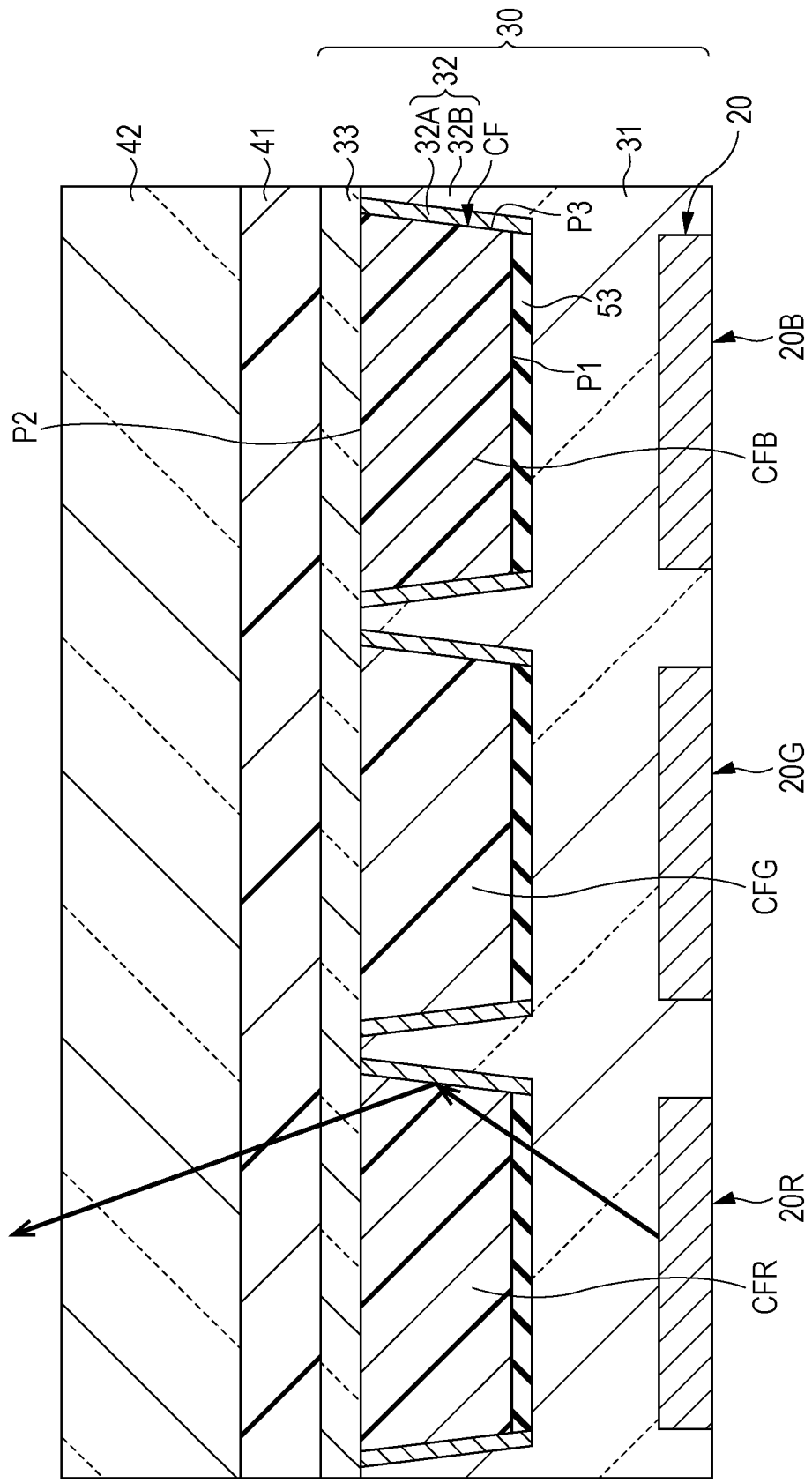
FIG. 23 is a cross-sectional view illustrating a schematic configuration of three adjacent pixels in a display device according to Modification Example 5-3.

It should be noted that the present embodiment may be combined with any one of the second to fourth embodiments. That is, for example as shown in FIG. 21, in the display device 100D of the present embodiment, in a manner similar to that of the second embodiment, the antireflection film 51 may be provided between the third protective layer 33 of the color change member 30 and the sealing resin layer 41. Alternatively, for example as shown in FIG. 22, in the display device 100D of the present embodiment, in a manner similar to that of the third embodiment, the antireflection film 52 may be provided between the third protective layer 33 and the color filter layer CF of the color change member 30. Further, for example as shown in FIG. 23, in the display device 100D of the present embodiment, in a manner similar to that of the fourth embodiment, the antireflection film 53 may be provided between the first protective layer 33 and the color filter layer CF of the color change member 30.

Further, although not shown in the drawing, the present embodiment may be combined with two or three of the second to fourth embodiments. That is, in the display device 100D of the present embodiment, in a manner similar to that of the second embodiment, the antireflection film 51 may be provided between the third protective layer 33 of the color change member 30 and the sealing resin layer 41, and in a manner similar to that of the third embodiment, the antireflection film 52 may be provided between the third protective layer 33 and the color filter layer CF of the color change member 30. Alternatively, in the display device 100D of the present embodiment, in a manner similar to that of the second embodiment, the antireflection film 51 may be provided between the third protective layer 33 of the color change member 30 and the sealing resin layer 41, and in a manner similar to that of the fourth embodiment, the antireflection film 53 may be provided between the first protective layer 31 and the color filter layer CF of the color change member 30. Further, in the display device 100D of the present embodiment, all the antireflection films 51 to 53 may be provided.

Sixth Embodiment

Figure 24:
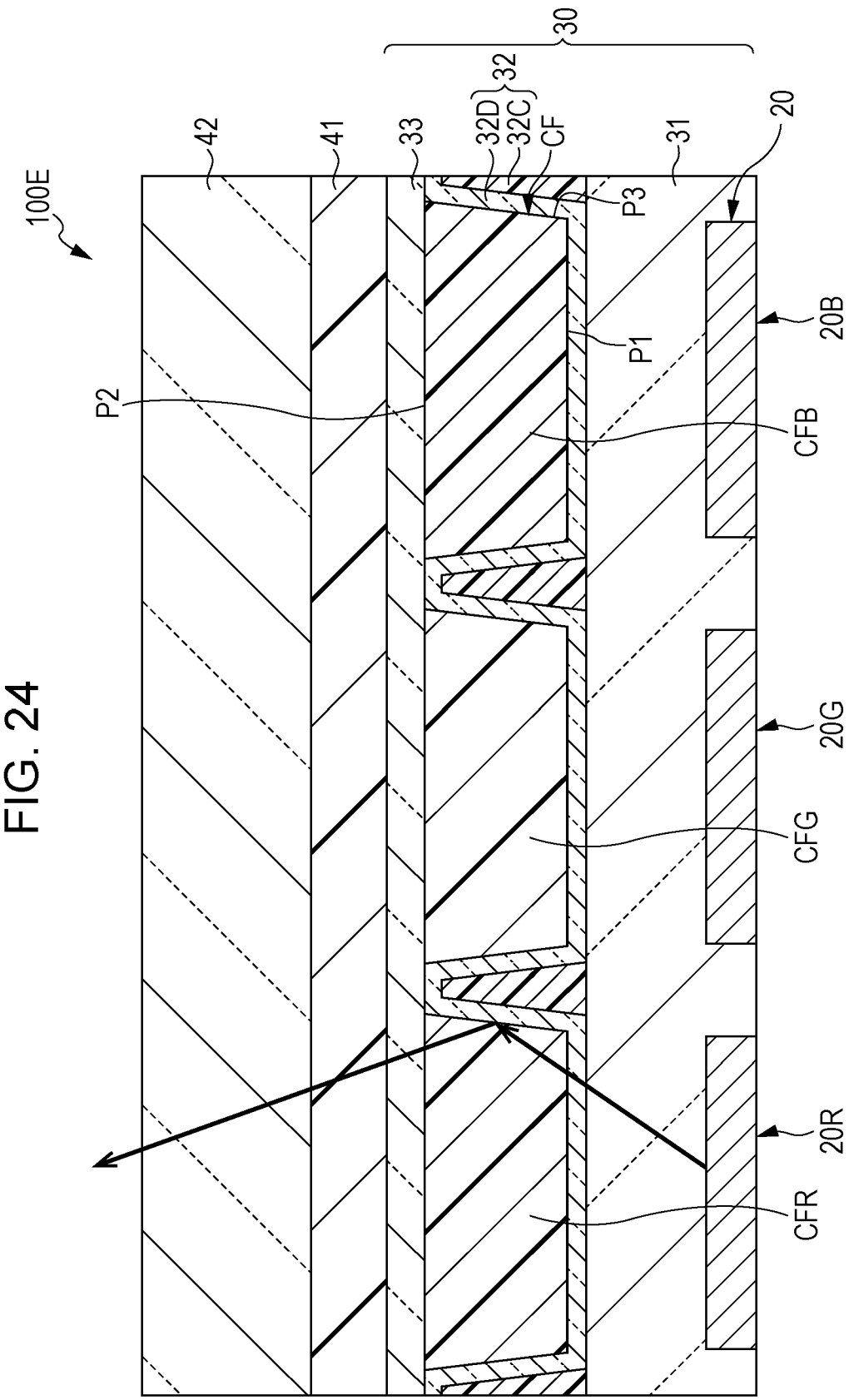
FIG. 24 is a cross-sectional view illustrating a schematic configuration of three adjacent pixels in a display device according to a sixth embodiment of the present disclosure.

FIG. 24 is a schematic cross-sectional configuration of three adjacent pixels PX in a display device 100E according to a sixth embodiment of the present disclosure. The display device 100E has the same configuration as the display device 100 according to the first embodiment except that the second protective layer 32 of the color change member 30 includes a black resin film 32C. Accordingly, the corresponding components will be referenced by the same numerals and signs.

Specifically, the second protective layer 32 of the color change member 30 has a structure in which the inside black resin film 32C and an outside transparent film 32D are laminated. The black resin film 32C is formed as, for example, a black resin film (black filter) into which a black coloring agent is mixed and of which the optical density is 1 or more. Similarly to the second protective layer 32 of the first embodiment, it is preferable that the transparent film 32D is formed as a transparent inorganic base film that has a high transmittance and a high passivation ability. Examples of the film include a silicon nitride (SiN) film, a silicon oxynitride (SiON) film, an aluminum oxide film ($Al_2O_3$), and the like.

In the present embodiment, as described above, the second protective layer 32 includes the black resin film 32C. Thereby, in the present embodiment, in addition to the effect of the first embodiment, by providing a function of a light blocking wall to the second protective layer 32, it is possible to prevent mixing of colors. That is, by providing the black resin film 32C, light, which is incident onto the color filter layer CF and is transmitted through the side surface P3, is absorbed by the black resin film 32C, and is prevented from being incident into the adjacent color filter layer CF.

It should be noted that the black resin film 32C may be provided on at least a part of the side surface P3 of the color filter layer CF. In order to prevent mixing of colors, it suffices that the black resin film 32C is provided on at least a part of the side surface P3 of the color filter layer CF in the vicinity of the light emitting element 20.

For example, the display device 100E can be manufactured as follows.

FIGS. 25 to 29 show a method of manufacturing the display device 100E in a processing order. It should be noted that the same processes as those in the first embodiment will be described with reference to FIGS. 5 to 10. First, in a manner similar to that of the first embodiment, through the process shown in FIG. 5, the light emitting element 20 is formed on the substrate 10 (refer to FIG. 4).

Figure 25:
FIG. 25 is a cross-sectional view illustrating a method of manufacturing the display device shown in FIG. 24 in a processing order.

Then, as shown in FIG. 25, a protective layer base film 31A is formed on the light emitting element 20. At this time, the protective layer base film 31A is formed as a layer that has a planar upper surface.

Figure 26:
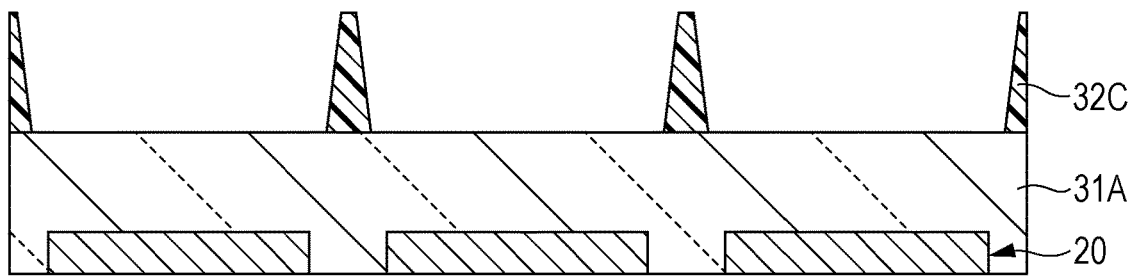
FIG. 26 is a cross-sectional view illustrating a process subsequent to the process of FIG. 25.

Subsequently, as shown in FIG. 26, the black resin film 32C is formed on the protective layer base film 31A by using a negative photoresist.

Figure 27:
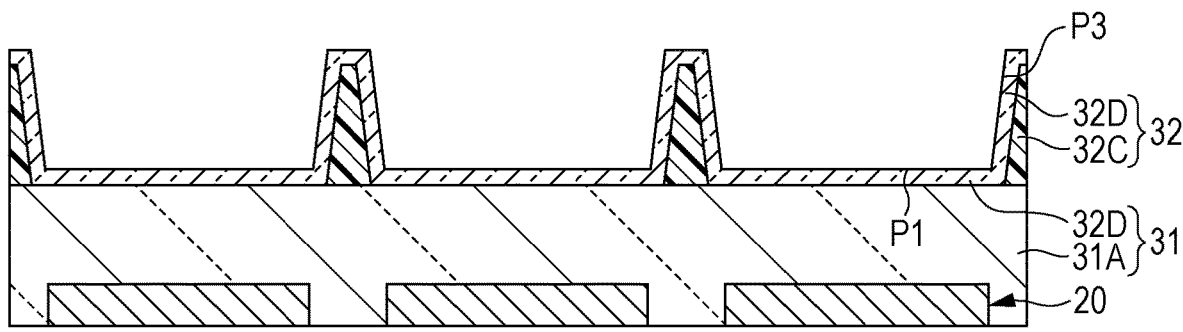
FIG. 27 is a cross-sectional view illustrating a process subsequent to the process of FIG. 26.

Thereafter, as shown in FIG. 27, the transparent film 32D, which is formed as the above-mentioned transparent inorganic base film made of SiN or the like, is formed on the protective layer base film 31A and the black resin film 32C through, for example, a CVD method. Thereby, the first protective layer 31 is formed of the protective layer base film 31A and the transparent film 32D, on the light incident surface P1 of the color filter layer CF. Additionally, the second protective layer 32 is formed of the black resin film 32C and the transparent film 32D, on the side surface P3 of the color filter layer CF.

Figure 28:
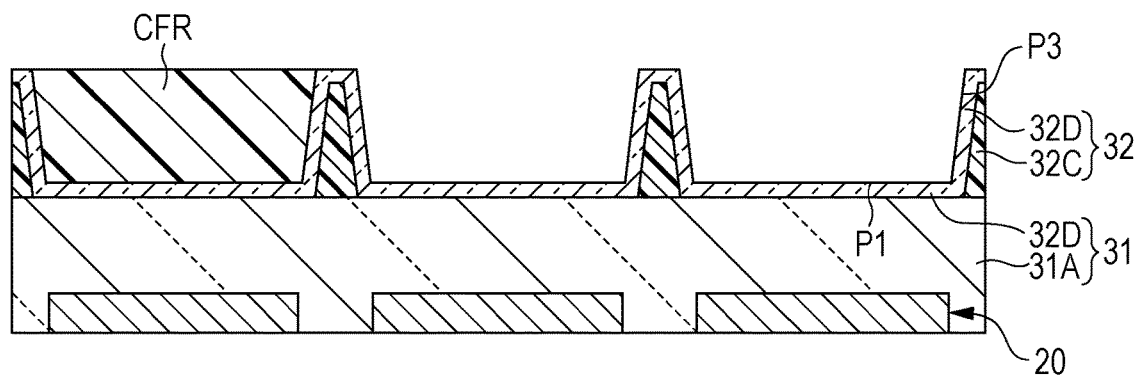
FIG. 28 is a cross-sectional view illustrating a process subsequent to the process of FIG. 27.

Subsequently, as shown in FIG. 28, the red filter CFR is formed on the first protective layer 31 and the second protective layer 32 by using a negative photoresist.

Figure 29:
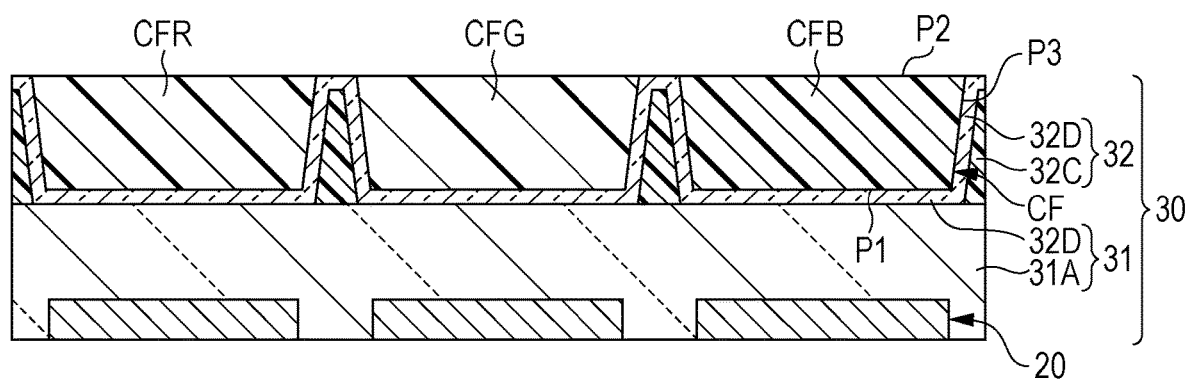
FIG. 29 is a cross-sectional view illustrating a process subsequent to the process of FIG. 28.

Thereafter, as shown in FIG. 29, similarly to the red filter CFR, the blue filter CFB and the green filter CFG are sequentially formed using negative photoresists. Thereby, the color filter layer CF is formed.

Subsequently, in a manner similar to that of the first embodiment, through the process shown in FIG. 10, as shown in FIG. 24, the third protective layer 33 is formed on the light emission surface P2 of the color filter layer CF and second protective layer 32.

Finally, as shown in FIG. 24, the sealing resin layer 41 is formed on the third protective layer 33, and the sealing substrate 42 is bonded to the third protective layer 33 through the sealing resin layer 41. Thus, the display device 100E shown in FIG. 24 is completely formed.

Modification Examples 6-1 to 6-3

Figure 30:
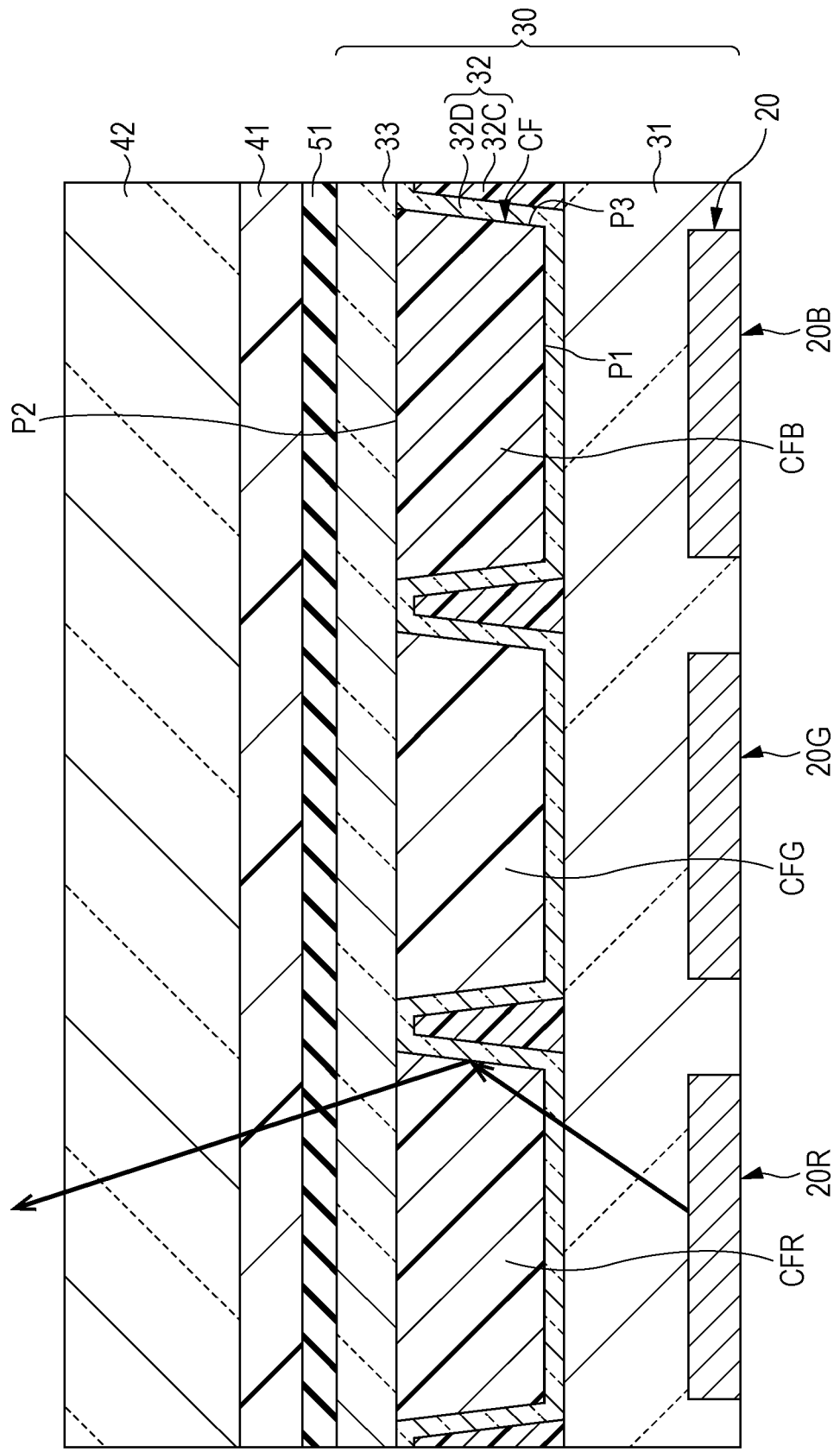
FIG. 30 is a cross-sectional view illustrating a schematic configuration of three adjacent pixels in a display device according to Modification Example 6-1.
Figure 31:
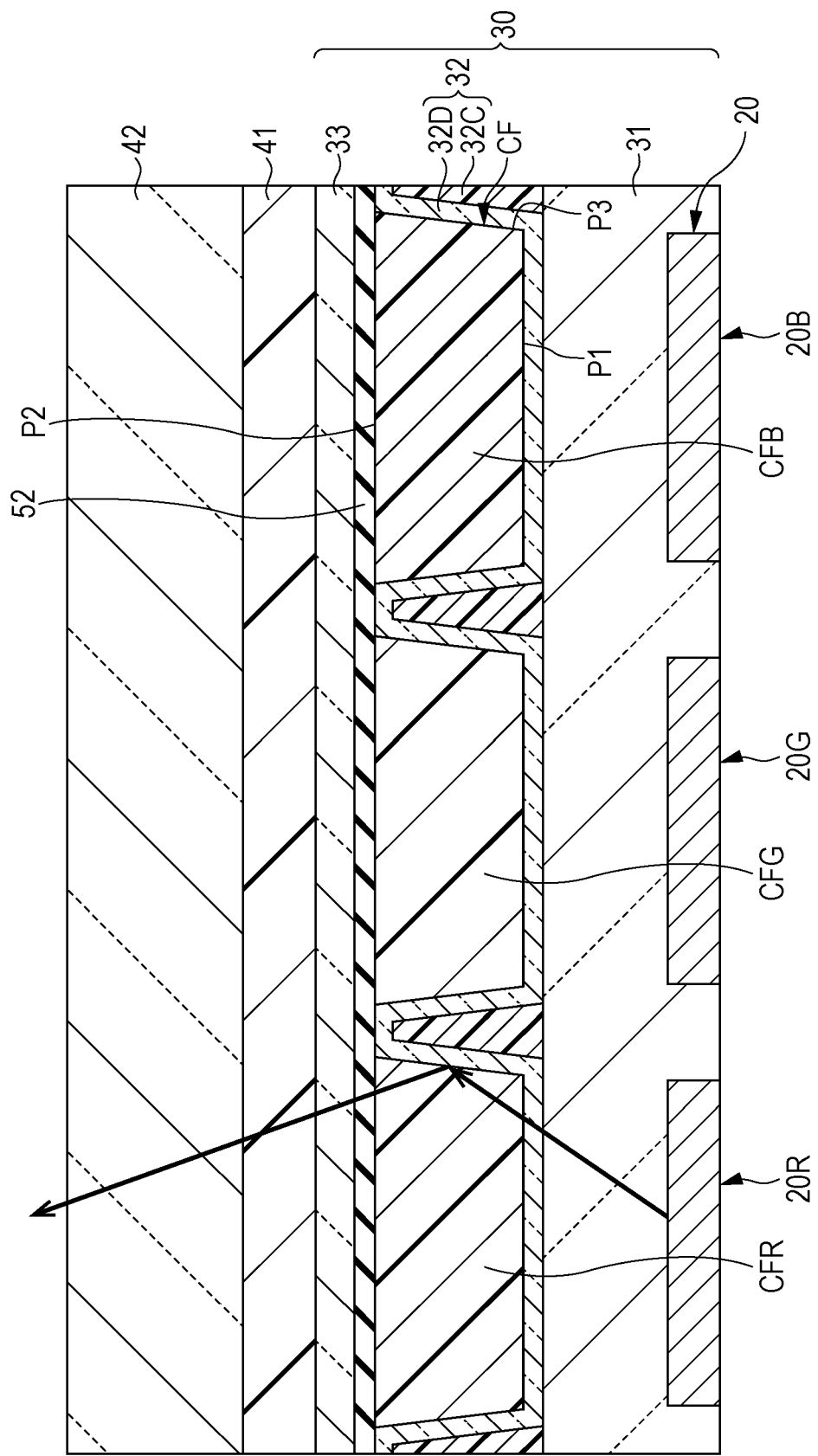
FIG. 31 is a cross-sectional view illustrating a schematic configuration of three adjacent pixels in a display device according to Modification Example 6-2.
Figure 32:
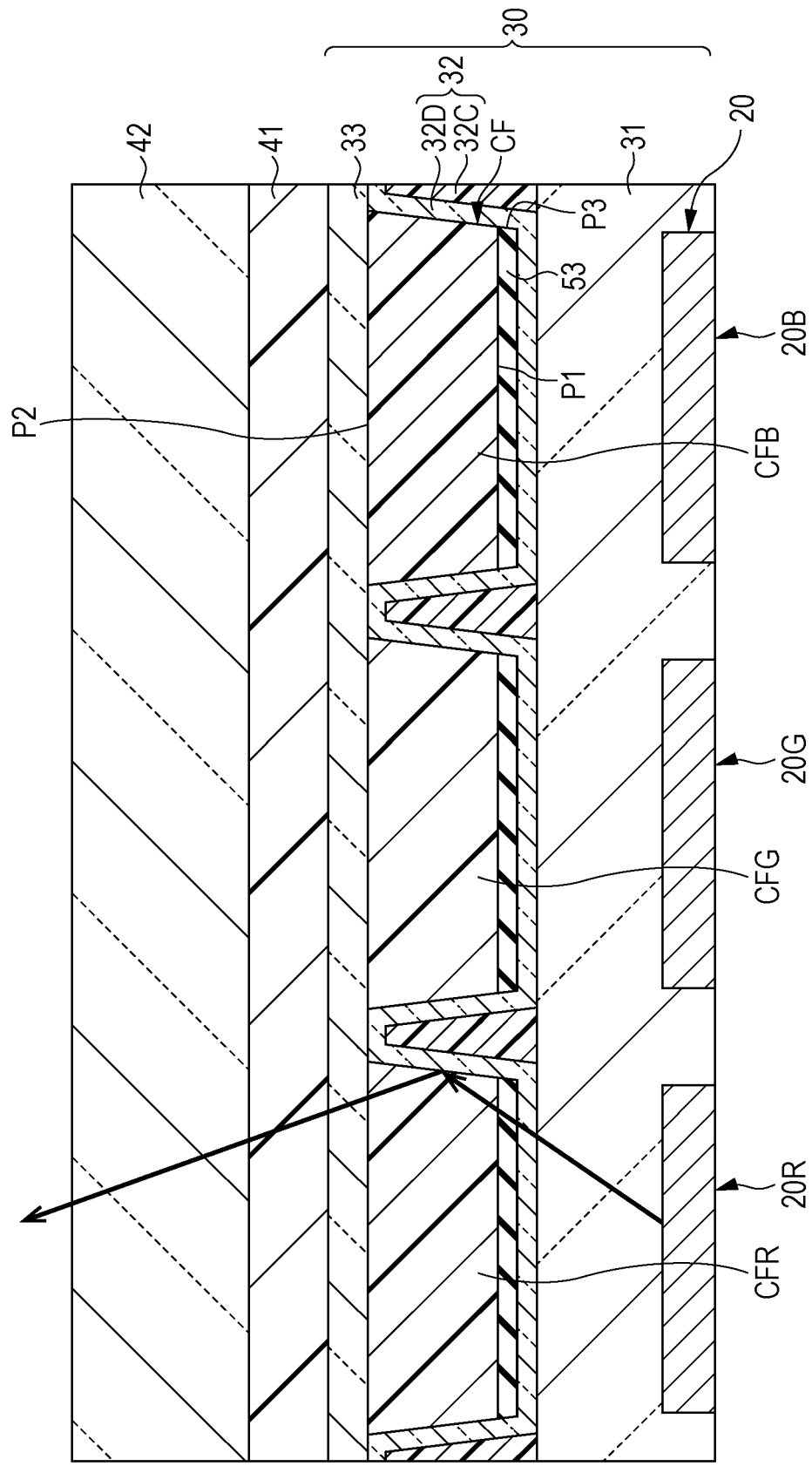
FIG. 32 is a cross-sectional view illustrating a schematic configuration of three adjacent pixels in a display device according to Modification Example 6-3.

It should be noted that the present embodiment may be combined with any one of the second to fourth embodiments. That is, for example as shown in FIG. 30, in the display device 100E of the present embodiment, in a manner similar to that of the second embodiment, the antireflection film 51 may be provided between the third protective layer 33 of the color change member 30 and the sealing resin layer 41. Alternatively, for example as shown in FIG. 31, in the display device 100E of the present embodiment, in a manner similar to that of the third embodiment, the antireflection film 52 may be provided between the third protective layer 33 and the color filter layer CF of the color change member 30. Further, for example as shown in FIG. 32, in the display device 100E of the present embodiment, in a manner similar to that of the fourth embodiment, the antireflection film 53 may be provided between the first protective layer 33 and the color filter layer CF of the color change member 30.

Further, although not shown in the drawing, the present embodiment may be combined with two or three of the second to fourth embodiments. That is, in the display device 100E of the present embodiment, in a manner similar to that of the second embodiment, the antireflection film 51 may be provided between the third protective layer 33 of the color change member 30 and the sealing resin layer 41, and in a manner similar to that of the third embodiment, the antireflection film 52 may be provided between the third protective layer 33 and the color filter layer CF of the color change member 30. Alternatively, in the display device 100E of the present embodiment, in a manner similar to that of the second embodiment, the antireflection film 51 may be provided between the third protective layer 33 of the color change member 30 and the sealing resin layer 41, and in a manner similar to that of the fourth embodiment, the antireflection film 53 may be provided between the first protective layer 31 and the color filter layer CF of the color change member 30. Further, in the display device 100E of the present embodiment, all the antireflection films 51 to 53 may be provided.

Seventh Embodiment

Figure 33:
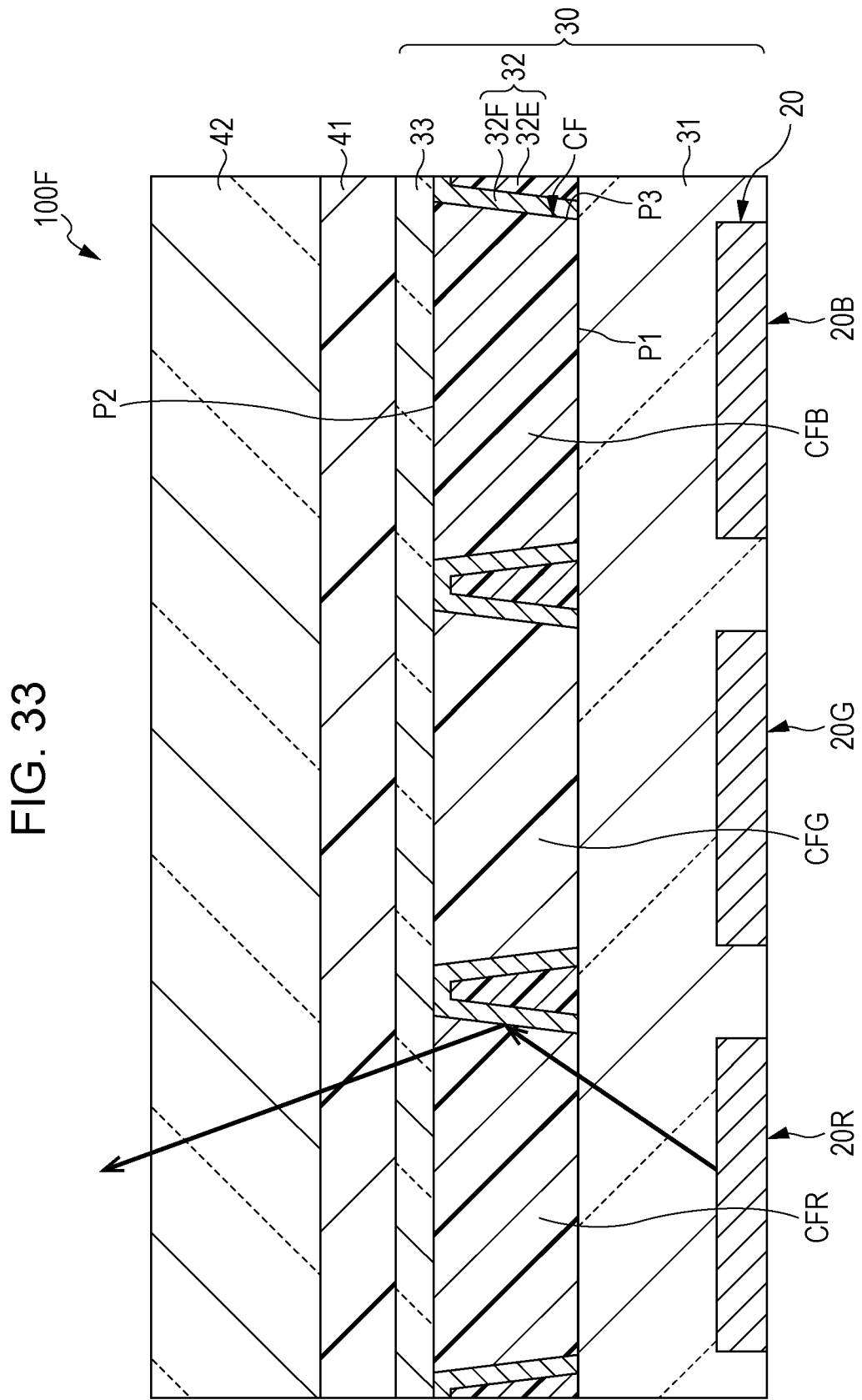
FIG. 33 is a cross-sectional view illustrating a schematic configuration of three adjacent pixels in a display device according to a seventh embodiment of the present disclosure.

FIG. 33 is a schematic cross-sectional configuration of three adjacent pixels PX in a display device 100F according to a seventh embodiment of the present disclosure. The display device 100F has the same configuration as the display device 100 according to the first embodiment except that the second protective layer 32 of the color change member 30 includes a metal film 32F. Accordingly, the corresponding components will be referenced by the same numerals and signs.

Specifically, the second protective layer 32 of the color change member 30 has a structure in which an inside resin film 32E and the outside metal film 32F are laminated. Similarly to the color filter layer CF, the resin film 32E is formed as a resin film that has a chromatic color such as red, green, or blue. It is needless to say that the resin film 32E may be a resin film that has an achromatic color such as black or transparent. Similarly to the metal film 32A of the fifth embodiment, the metal film 32F is formed as a metal film having high reflectivity or high light blocking ability. Examples of the metal film include a titanium (Ti) film, an aluminum (Al) film, a tungsten (W) film, and the like.

In the present embodiment, as described above, the second protective layer 32 includes the metal film 32F. Thereby, in the present embodiment, in addition to the effect of the first embodiment, similarly to the fifth embodiment, the side wall of the color filter layer CF is protected by the metal film 32F, and it is possible to prevent mixing of colors. That is, light, which reaches the side surface P3 of the color filter layer CF, is reflected by the metal film 32F, and is thus prevented from being incident into the adjacent color filter layer CF.

For example, the display device 100F can be manufactured as follows.

FIGS. 34 to 39 show a method of manufacturing the display device 100F in a processing order. It should be noted that the same processes as those in the first embodiment will be described with reference to FIGS. 5 to 10. First, in a manner similar to that of the first embodiment, through the process shown in FIG. 5, the light emitting element 20 is formed on the substrate 10 (refer to FIG. 4).

Figure 34:
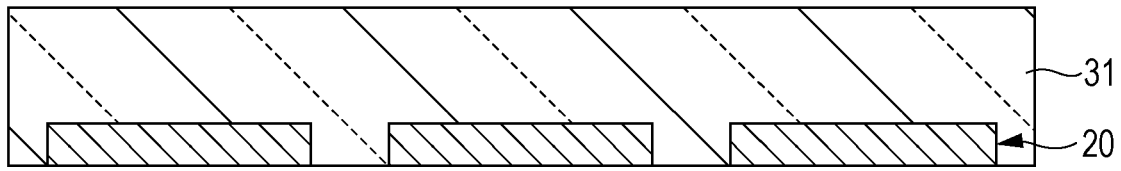
FIG. 34 is a cross-sectional view illustrating a method of manufacturing the display device shown in FIG. 33 in a processing order.

Then, as shown in FIG. 34, the first protective layer 31 is formed on the light emitting element 20. At this time, the first protective layer 31 is formed as a layer that has a planar upper surface.

Figure 35:
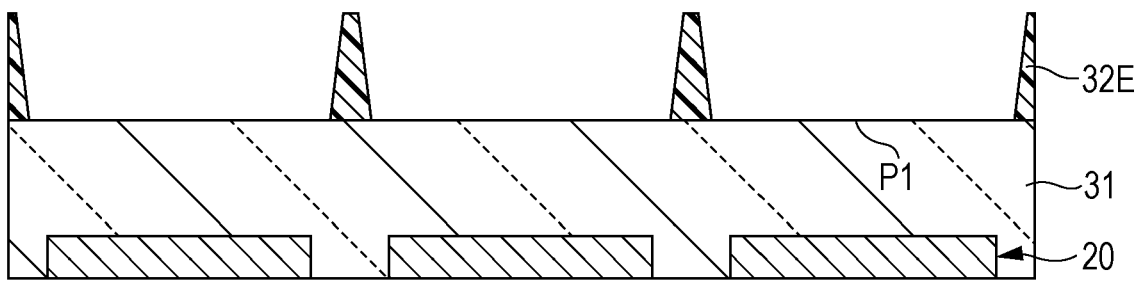
FIG. 35 is a cross-sectional view illustrating a process subsequent to the process of FIG. 34.

Subsequently, as shown in FIG. 35, a resin film 32E, which is made of for example the same material as the green filter CFG, is formed on the first protective layer 31 by using a negative photoresist.

Alternatively, the resin film 32E may be formed in the following manner. The entire surface of the first protective layer 31 is coated with resin, and lithography is performed to process only the region of the light incident surface P1 of the color filter layer CF. Thereafter, through etching, the resin film 32E is formed in a region of the side surface P3 of the color filter layer CF.

Figure 36:
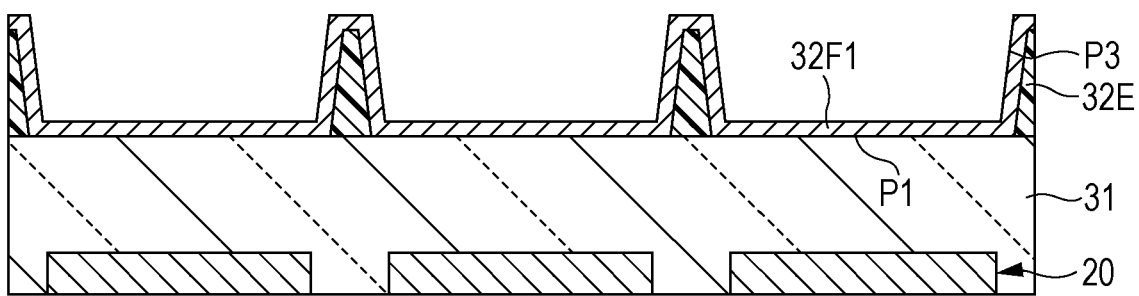
FIG. 36 is a cross-sectional view illustrating a process subsequent to the process of FIG. 35.

Then, as shown in FIG. 36, a metal base film 32F1 is formed on the first protective layer 31 and the resin film 32E.

Figure 37:
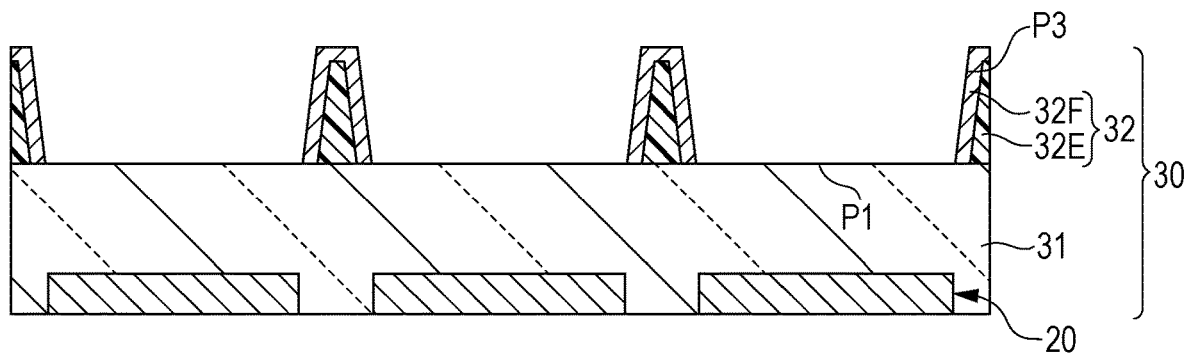
FIG. 37 is a cross-sectional view illustrating a process subsequent to the process of FIG. 36.

Subsequently, as shown in FIG. 37, by removing the metal base film 32F1 on the first protective layer 31 through etch back of the metal base film 32F1, the metal film 32F is formed on a surface of the resin film 32E.

Alternatively, for example, the metal film 32F can be formed as follows. After the metal base film 32F1 is formed, lithography is performed to provide openings in the region of the light incident surface P1 of the color filter layer CF. Thereafter, through etching, portions of the metal base film 32F1 formed on the first protective layer 31 are removed, and the photoresist layer is removed. Thereby, the metal film 32F is formed on a surface of the resin film 32E.

In such a manner, the first protective layer 31 is formed on the light incident surface P1 of the color filter layer CF. In addition, the second protective layer 32 is formed of the resin film 32E and the metal film 32F, on the side surface P3 of the color filter layer CF.

Figure 38:
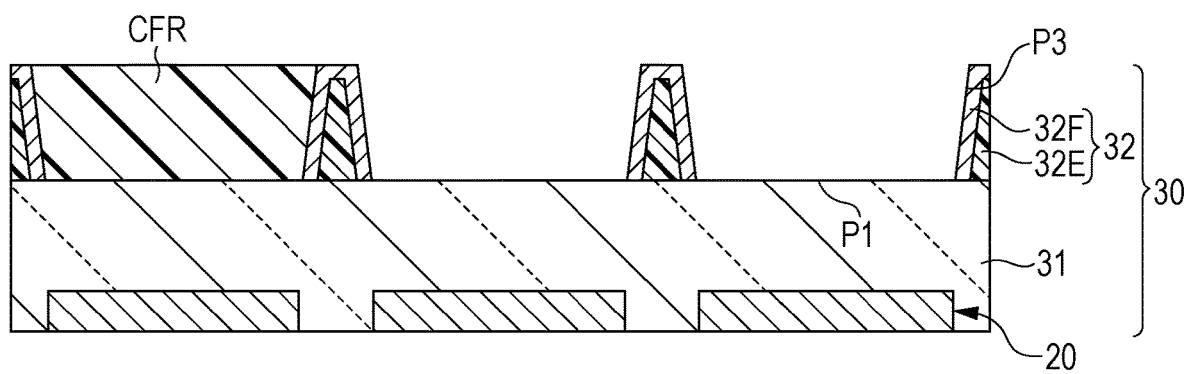
FIG. 38 is a cross-sectional view illustrating a process subsequent to the process of FIG. 37.

Thereafter, as shown in FIG. 38, the red filter CFR is formed on the first protective layer 31 and the second protective layer 32 by using a negative photoresist.

Figure 39:
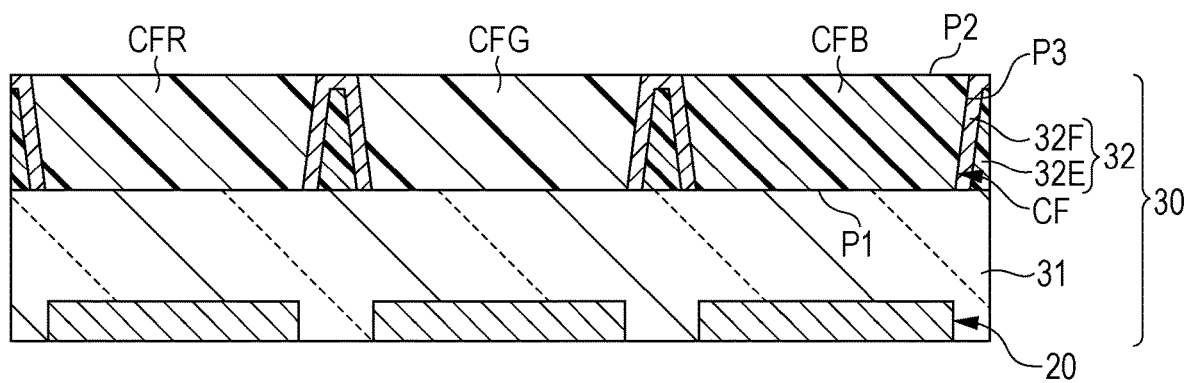
FIG. 39 is a cross-sectional view illustrating a process subsequent to the process of FIG. 38.

Subsequently, as shown in FIG. 39, similarly to the red filter CFR, a blue filter CFB and a green filter CFG are sequentially formed using negative photoresists. Thereby, the color filter layer CF is formed.

Thereafter, in a manner similar to that of the first embodiment, through the process shown in FIG. 10, as shown in FIG. 33, the third protective layer 33 is formed on the light emission surface P2 of the color filter layer CF and second protective layer 32.

Finally, as shown in FIG. 33, the sealing resin layer 41 is formed on the third protective layer 33, and the sealing substrate 42 is bonded to the third protective layer 33 through the sealing resin layer 41. Thus, the display device 100F shown in FIG. 33 is completely formed.

Modification Examples 7-1 to 7-3

Figure 40:
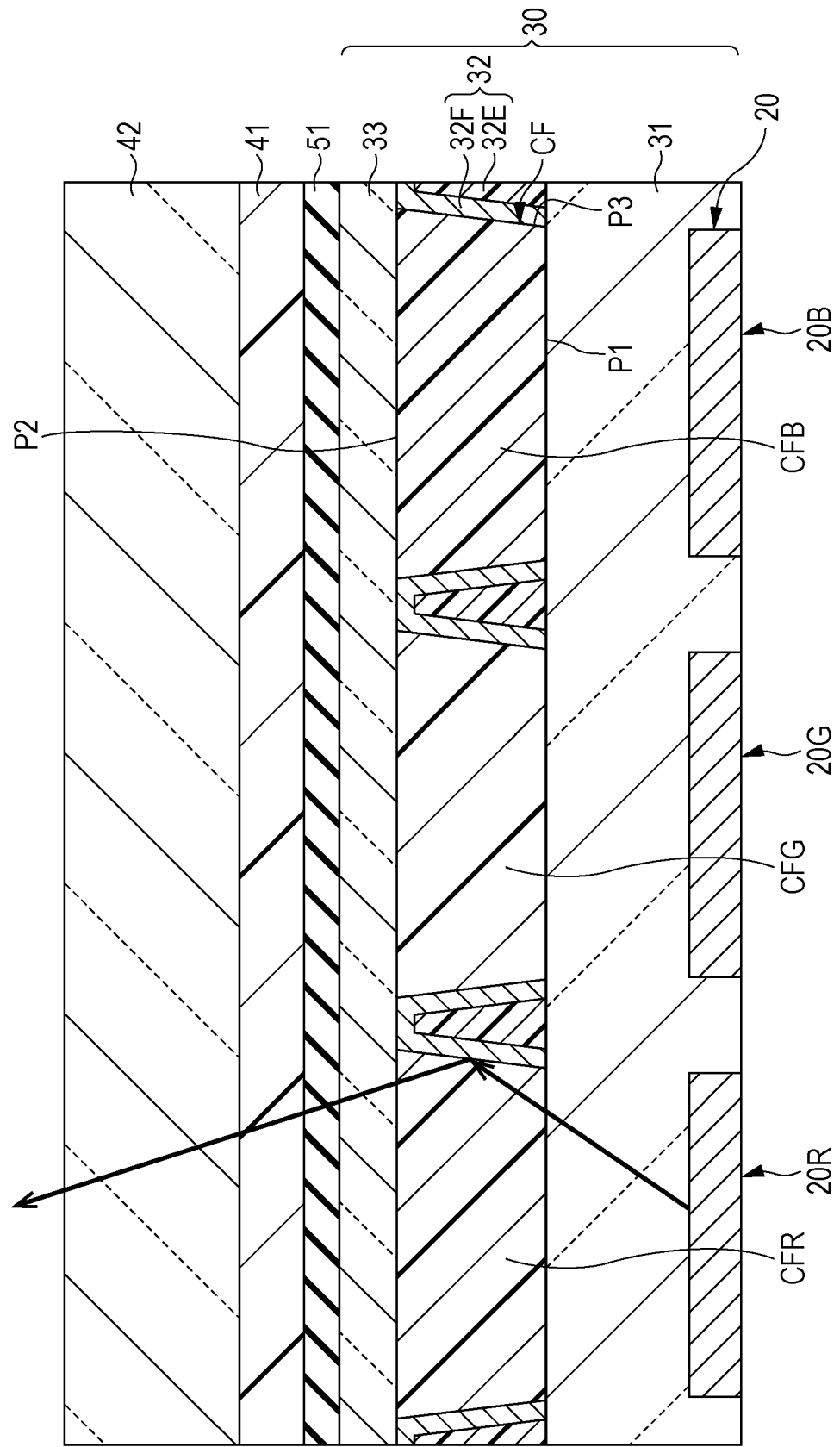
FIG. 40 is a cross-sectional view illustrating a schematic configuration of three adjacent pixels in a display device according to Modification Example 7-1.
Figure 41:
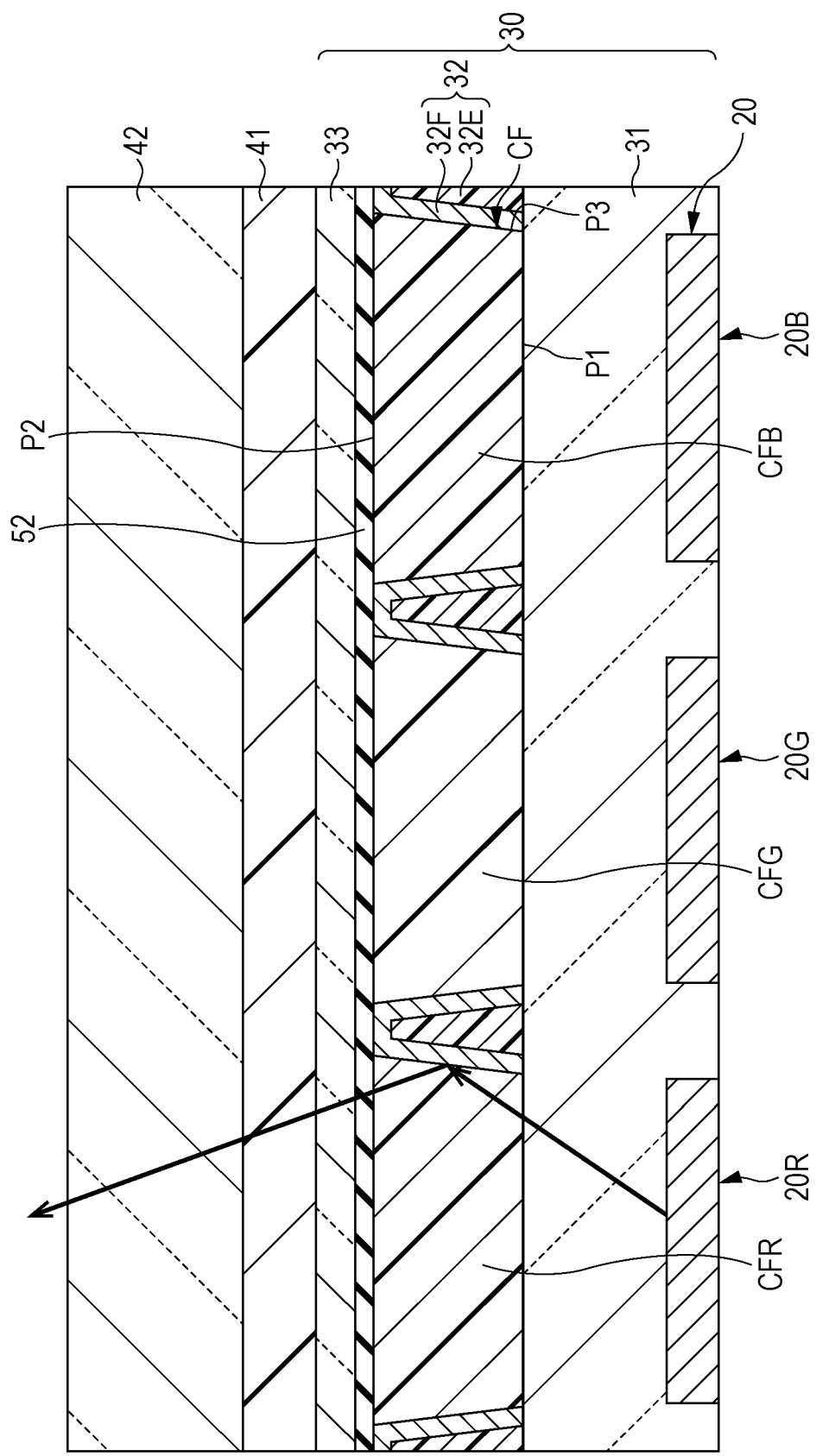
FIG. 41 is a cross-sectional view illustrating a schematic configuration of three adjacent pixels in a display device according to Modification Example 7-2.
Figure 42:
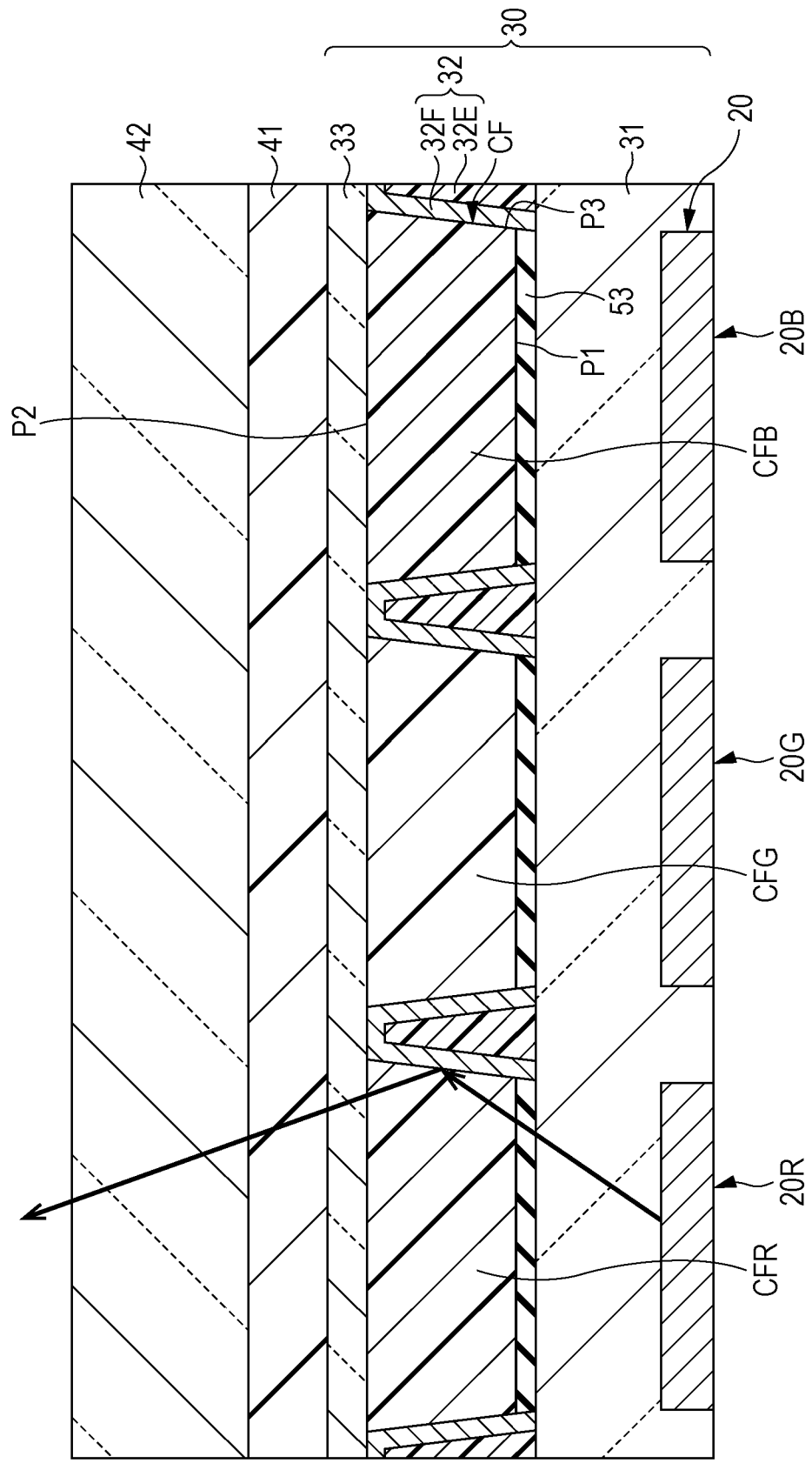
FIG. 42 is a cross-sectional view illustrating a schematic configuration of three adjacent pixels in a display device according to Modification Example 7-3.

It should be noted that the present embodiment may be combined with any one of the second to fourth embodiments. That is, for example as shown in FIG. 40, in the display device 100F of the present embodiment, in a manner similar to that of the second embodiment, the antireflection film 51 may be provided between the third protective layer 33 of the color change member 30 and the sealing resin layer 41. Alternatively, for example as shown in FIG. 41, in the display device 100F of the present embodiment, in a manner similar to that of the third embodiment, the antireflection film 52 may be provided between the third protective layer 33 and the color filter layer CF of the color change member 30. Further, for example as shown in FIG. 42, in the display device 100F of the present embodiment, in a manner similar to that of the fourth embodiment, the antireflection film 53 may be provided between the first protective layer 33 and the color filter layer CF of the color change member 30.

Further, although not shown in the drawing, the present embodiment may be combined with two or three of the second to fourth embodiments. That is, in the display device 100F of the present embodiment, in a manner similar to that of the second embodiment, the antireflection film 51 may be provided between the third protective layer 33 of the color change member 30 and the sealing resin layer 41, and in a manner similar to that of the third embodiment, the antireflection film 52 may be provided between the third protective layer 33 and the color filter layer CF of the color change member 30. Alternatively, in the display device 100F of the present embodiment, in a manner similar to that of the second embodiment, the antireflection film 51 may be provided between the third protective layer 33 of the color change member 30 and the sealing resin layer 41, and in a manner similar to that of the fourth embodiment, the antireflection film 53 may be provided between the first protective layer 31 and the color filter layer CF of the color change member 30. Further, in the display device 100F of the present embodiment, all the antireflection films 51 to 53 may be provided.

Eighth Embodiment

Figure 43:
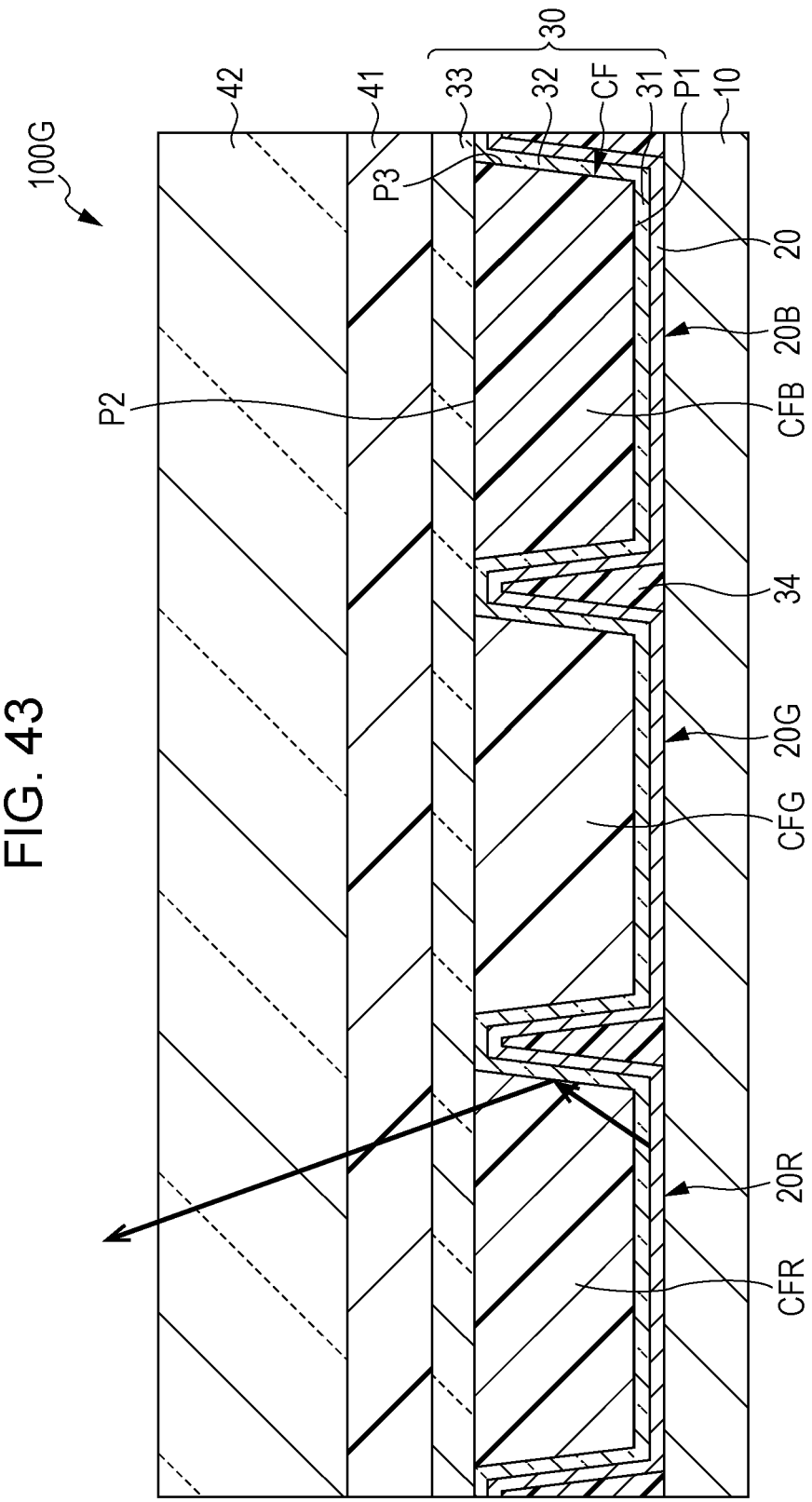
FIG. 43 is a cross-sectional view illustrating a schematic configuration of three adjacent pixels in a display device according to an eighth embodiment of the present disclosure.

FIG. 43 is a schematic cross-sectional configuration of three adjacent pixels PX in a display device 100G according to an eighth embodiment of the present disclosure. The display device 100G has the same configuration as the display device 100 according to the first embodiment except that the light emitting element 20 is provided along the light incident surface P1 and the side surface P3 of the color filter layer CF. Accordingly, the corresponding components will be referenced by the same numerals and signs.

Specifically, the light emitting element 20 is provided on the upper surface of the substrate 10 and a surface of a side wall 34 which is provided on the substrate 10. The side wall 34 is made of, for example, the same material as the first protective layer 31 and the second protective layer 32, or a black resin film. The first protective layer 31 and the second protective layer 32 formed as transparent films are provided on the surface of the light emitting element 20.

In the present embodiment, as described above, the light emitting element 20 is provided along the light incident surface P1 and the side surface P3 of the color filter layer CF. Therefore, light, which is emitted from the light emitting element 20, is incident from not only the light incident surface P1 of the color filter layer CF but also the side surface P3. Accordingly, the light use efficiency of the light emitting element 20 increases, and thus characteristics thereof are improved.

For example, the display device 100G can be manufactured as follows.

Figure 44:
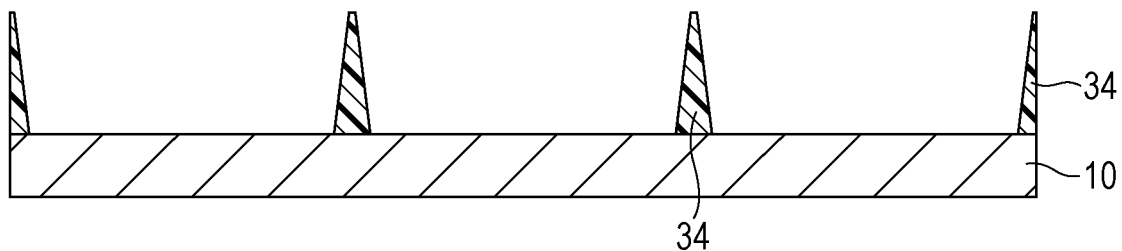
FIG. 44 is a cross-sectional view illustrating a method of manufacturing the display device shown in FIG. 43 in a processing order.

FIGS. 44 to 48 show a method of manufacturing the display device 100G in a processing order. It should be noted that the same processes as those in the first embodiment will be described with reference to FIGS. 5 to 10. First, as shown in FIG. 44, a side wall base film (not shown in the drawing) is formed on the substrate 10, lithography is performed on the side wall base film, and the side wall 34 is formed through taper etching.

Figure 45:
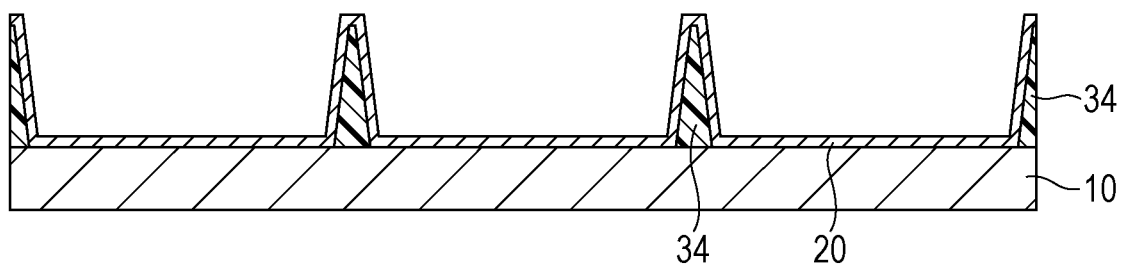
FIG. 45 is a cross-sectional view illustrating a process subsequent to the process of FIG. 44.

Thereafter, as shown in FIG. 45, the light emitting element 20 is formed on the substrate 10 and the side wall 34. Thereby, the light emitting element 20 is formed in a region of the light incident surface P1 and the side surface P3 of the color filter layer CF.

Figure 46:
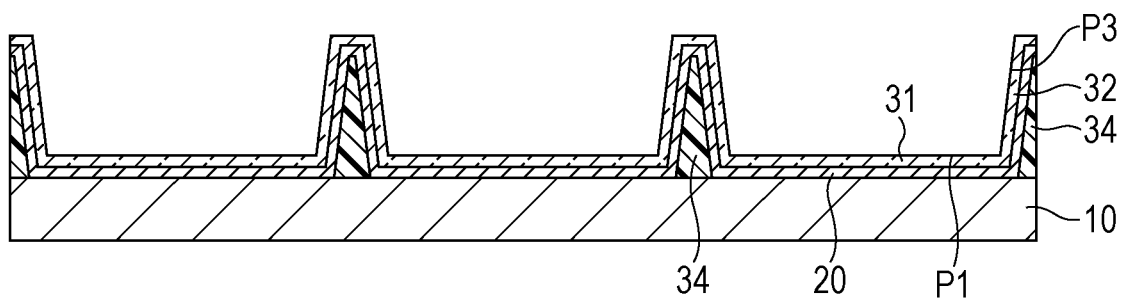
FIG. 46 is a cross-sectional view illustrating a process subsequent to the process of FIG. 45.

Subsequently, as shown in FIG. 46, the first protective layer 31 and the second protective layer 32 are formed as transparent films on the light emitting element 20. Thereby, the first protective layer 31 is formed in a region of the light incident surface P1 of the color filter layer CF, and the second protective layer 32 is formed in a region of the side surface P3 of the color filter layer CF.

Figure 47:
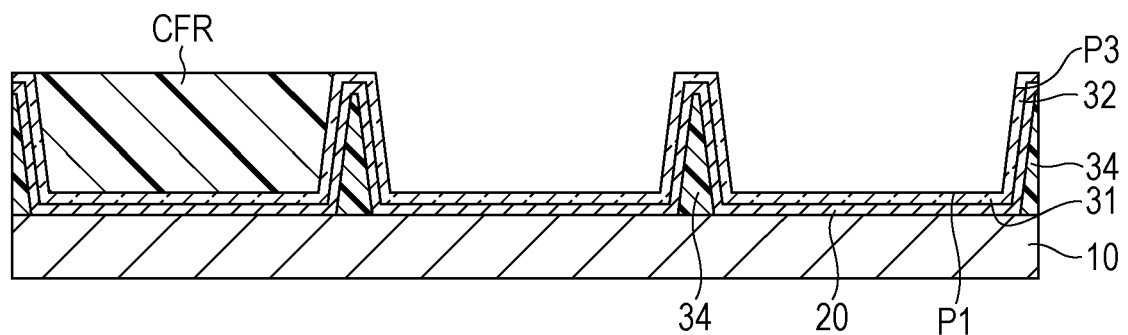
FIG. 47 is a cross-sectional view illustrating a process subsequent to the process of FIG. 46.

Thereafter, as shown in FIG. 47, the red filter CFR is formed on the first protective layer 31 and the second protective layer 32 by using a negative photoresist.

Figure 48:
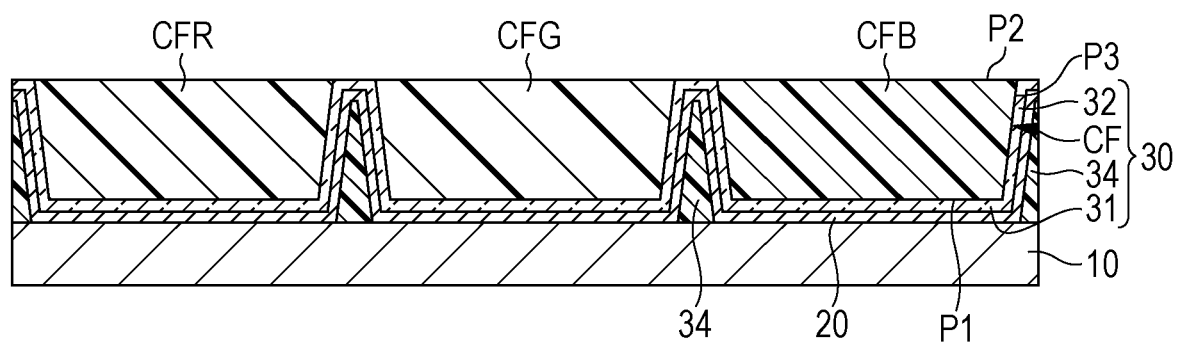
FIG. 48 is a cross-sectional view illustrating a process subsequent to the process of FIG. 47.

Subsequently, as shown in FIG. 48, similarly to the red filter CFR, a blue filter CFB and a green filter CFG are sequentially formed using negative photoresists. Thereby, the color filter layer CF is formed.

Thereafter, in a manner similar to that of the first embodiment, through the process shown in FIG. 10, as shown in FIG. 43, the third protective layer 33 is formed on the light emission surface P2 of the color filter layer CF and second protective layer 32.

Finally, as shown in FIG. 43, the sealing resin layer 41 is formed on the third protective layer 33, and the sealing substrate 42 is bonded to the third protective layer 33 through the sealing resin layer 41. Thus, the display device 100G shown in FIG. 43 is completely formed.

Modification Examples 8-1 to 8-3

Figure 49:
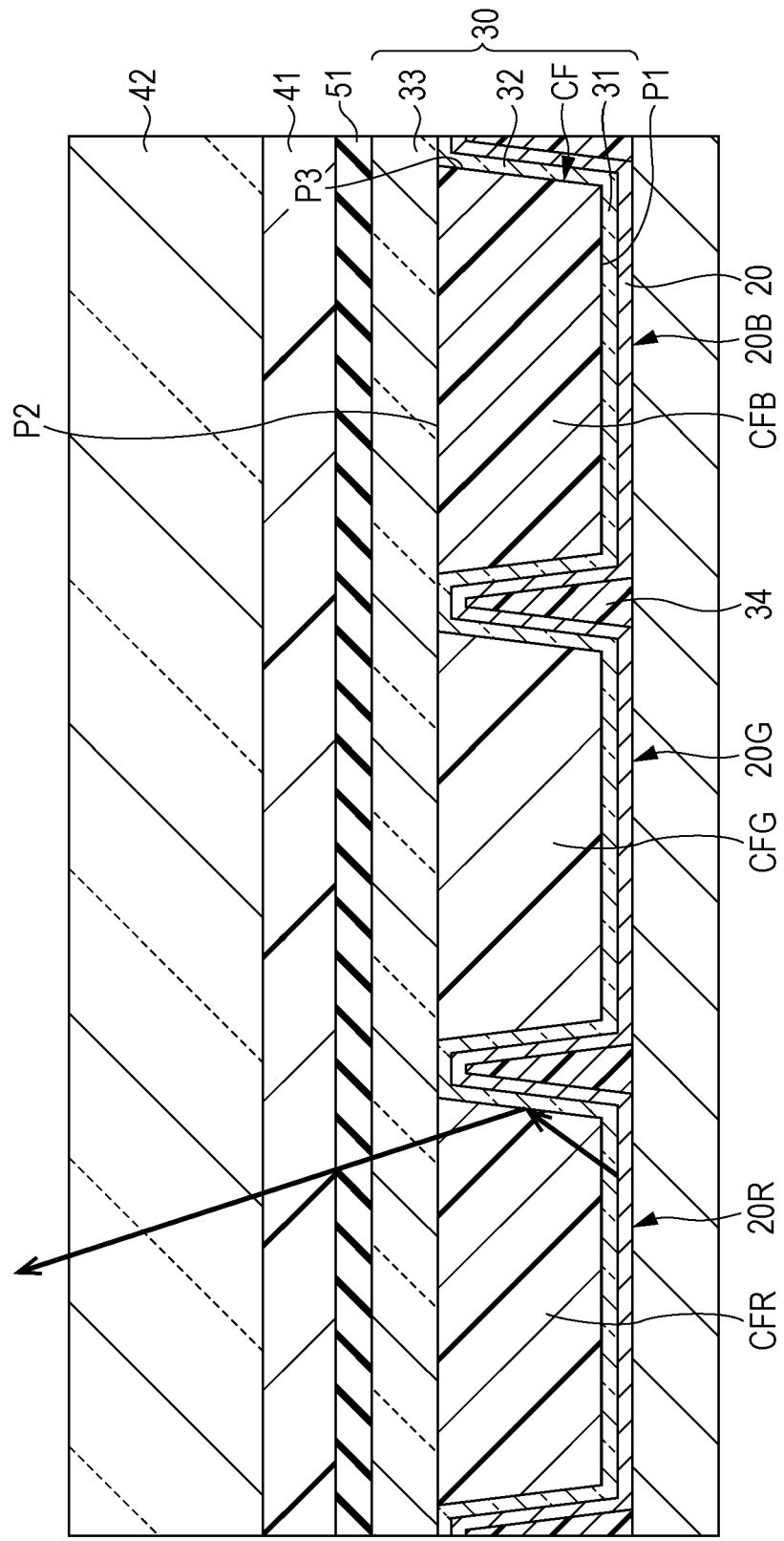
FIG. 49 is a cross-sectional view illustrating a schematic configuration of three adjacent pixels in a display device according to Modification Example 8-1.
Figure 50:
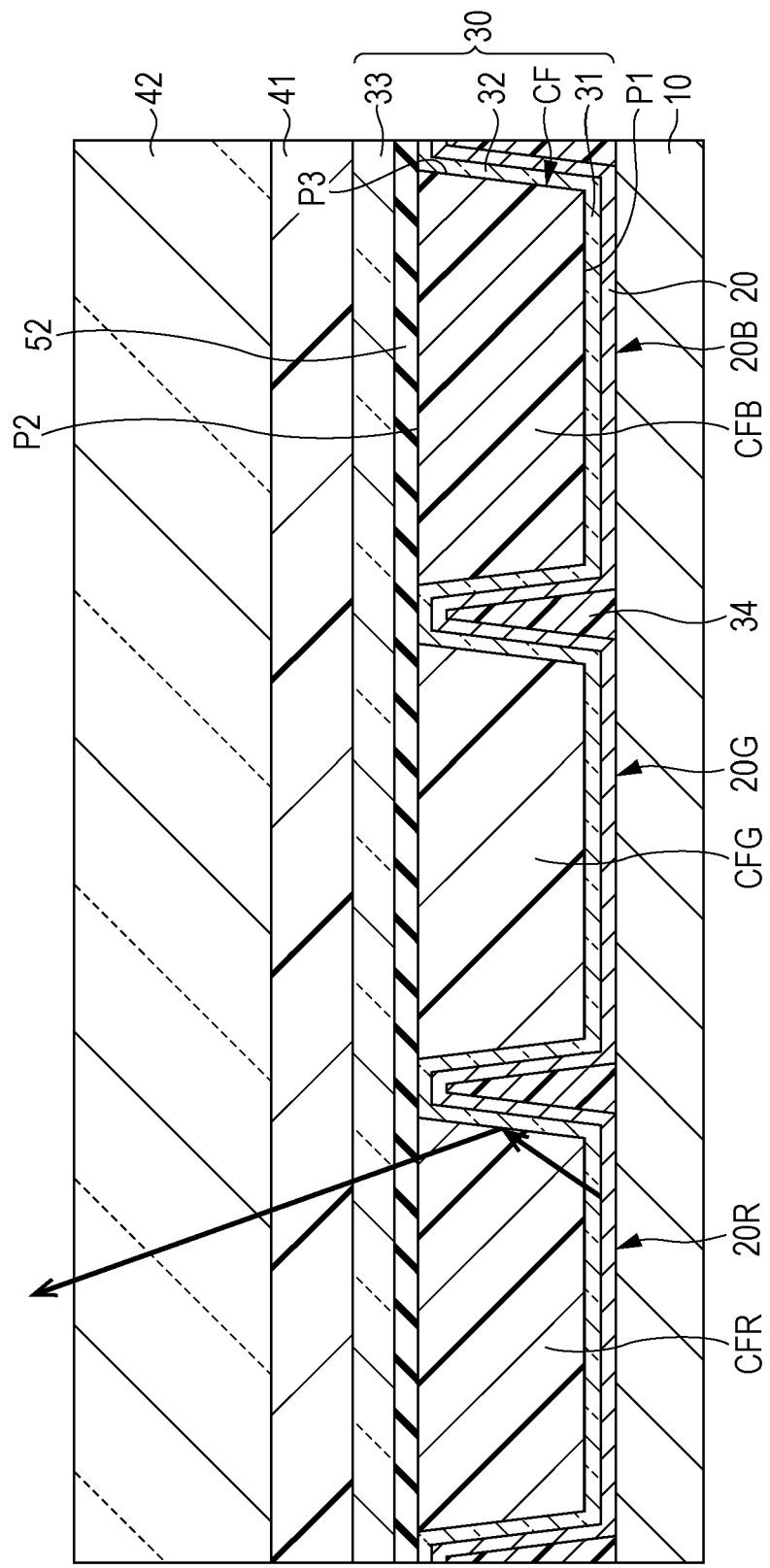
FIG. 50 is a cross-sectional view illustrating a schematic configuration of three adjacent pixels in a display device according to Modification Example 8-2.
Figure 51:
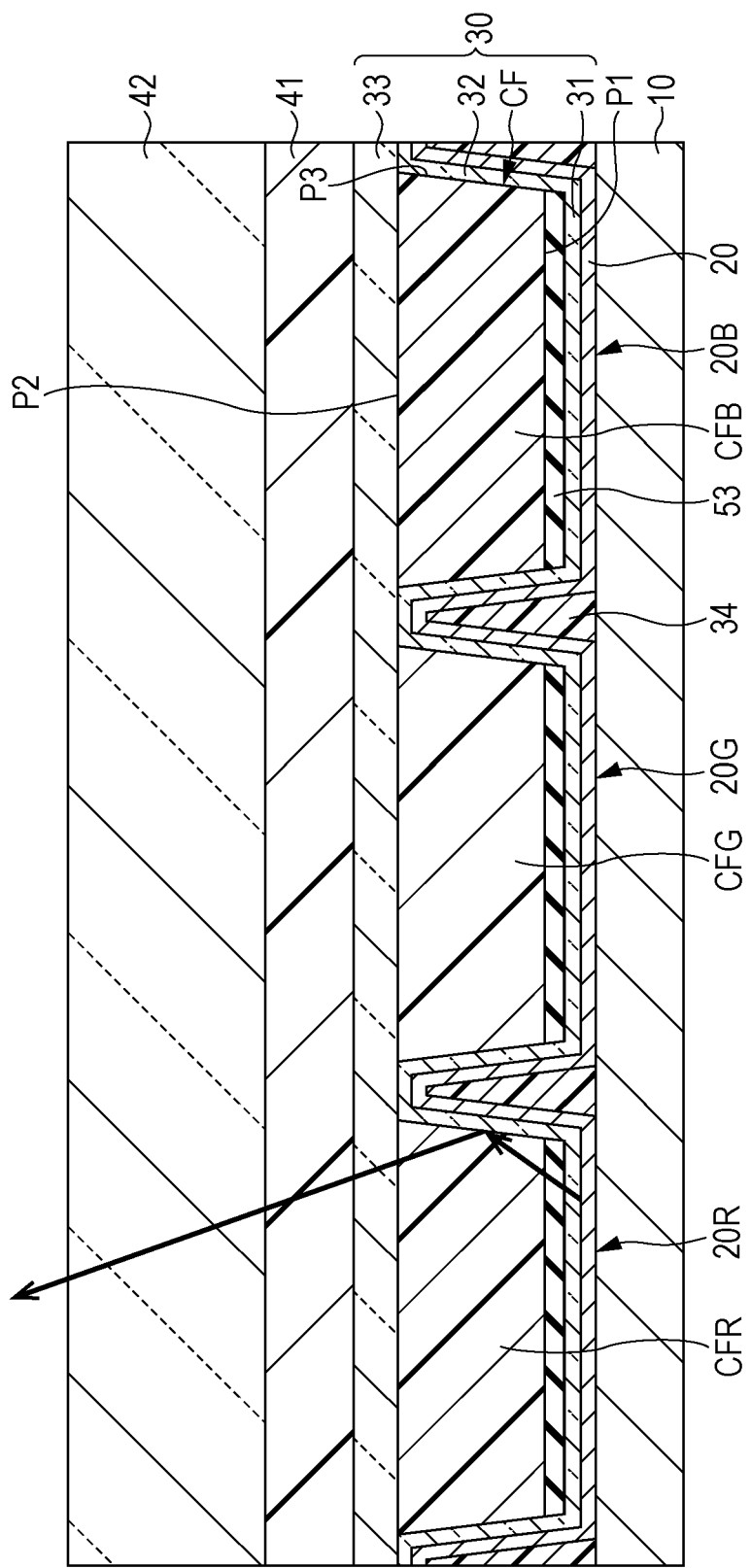
FIG. 51 is a cross-sectional view illustrating a schematic configuration of three adjacent pixels in a display device according to Modification Example 8-3.

It should be noted that the present embodiment may be combined with any one of the second to fourth embodiments. That is, for example as shown in FIG. 49, in the display device 100G of the present embodiment, in a manner similar to that of the second embodiment, the antireflection film 51 may be provided between the third protective layer 33 of the color change member 30 and the sealing resin layer 41. Alternatively, for example as shown in FIG. 50, in the display device 100G of the present embodiment, in a manner similar to that of the third embodiment, the antireflection film 52 may be provided between the third protective layer 33 and the color filter layer CF of the color change member 30. Further, for example as shown in FIG. 51, in the display device 100G of the present embodiment, in a manner similar to that of the fourth embodiment, the antireflection film 53 may be provided between the first protective layer 33 and the color filter layer CF of the color change member 30.

Further, although not shown in the drawing, the present embodiment may be combined with two or three of the second to fourth embodiments. That is, in the display device 100G of the present embodiment, in a manner similar to that of the second embodiment, the antireflection film 51 may be provided between the third protective layer 33 of the color change member 30 and the sealing resin layer 41, and in a manner similar to that of the third embodiment, the antireflection film 52 may be provided between the third protective layer 33 and the color filter layer CF of the color change member 30. Alternatively, in the display device 100G of the present embodiment, in a manner similar to that of the second embodiment, the antireflection film 51 may be provided between the third protective layer 33 of the color change member 30 and the sealing resin layer 41, and in a manner similar to that of the fourth embodiment, the antireflection film 53 may be provided between the first protective layer 31 and the color filter layer CF of the color change member 30. Further, in the display device 100G of the present embodiment, all the antireflection films 51 to 53 may be provided.

Ninth Embodiment

Figure 52:
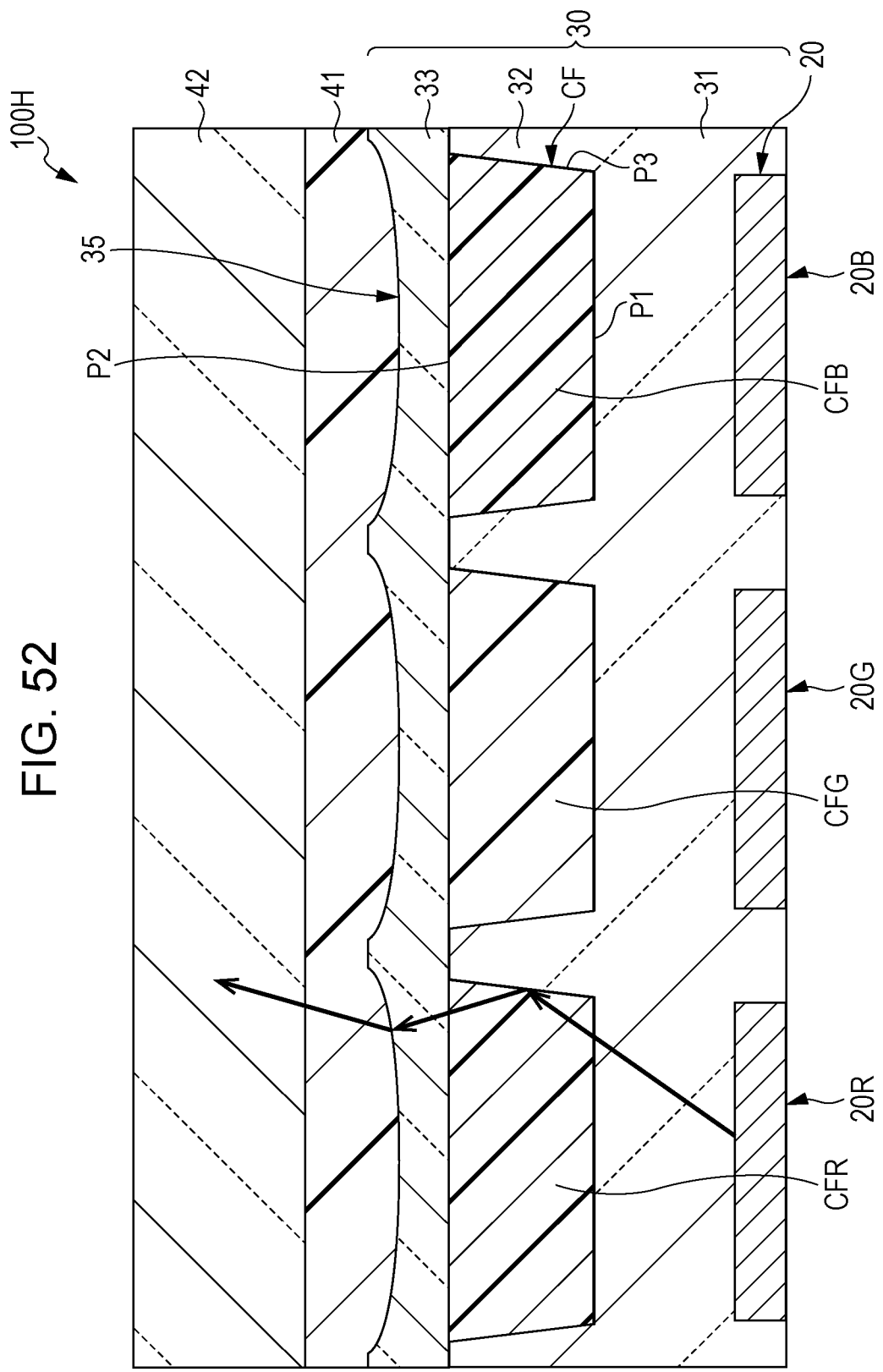
FIG. 52 is a cross-sectional view illustrating a schematic configuration of three adjacent pixels in a display device according to a ninth embodiment of the present disclosure.

FIG. 52 is a schematic cross-sectional configuration of three adjacent pixels PX in a display device 100H according to a ninth embodiment of the present disclosure. The display device 100H has the same configuration as the display device 100 according to the first embodiment except that the third protective layer 33 of the color change member 30 has a curved portion 35 provided on a surface opposite to the upper surface (light emission surface P2). Accordingly, the corresponding components will be referenced by the same numerals and signs.

In the present embodiment, as described above, the curved portion 35 is provided on the upper surface of the third protective layer 33. The curved portion 35 has a three-dimensionally curved shape which is convex downward (toward the color filter layer CF). Thereby, in the present embodiment, in addition to the effect of the first embodiment, by using the curved portion 35, it is possible to provide a function of an on-chip lens to the sealing resin layer 41, and thus it is possible to improve angle-of-view characteristics. That is, the light, which is incident into the sealing resin layer 41 through the curved portion 35, can be further dispersed outward. Accordingly, angle-of-view dependencies based on a color and a luminance of an image are reduced, and thus changes in color and luminance of the image caused by change in angle of view are minimized.

The display device 100H can be manufactured in a similar manner to that of the first embodiment except that the curved portion 35 is formed on the upper surface of the third protective layer 33.

Figure 53:
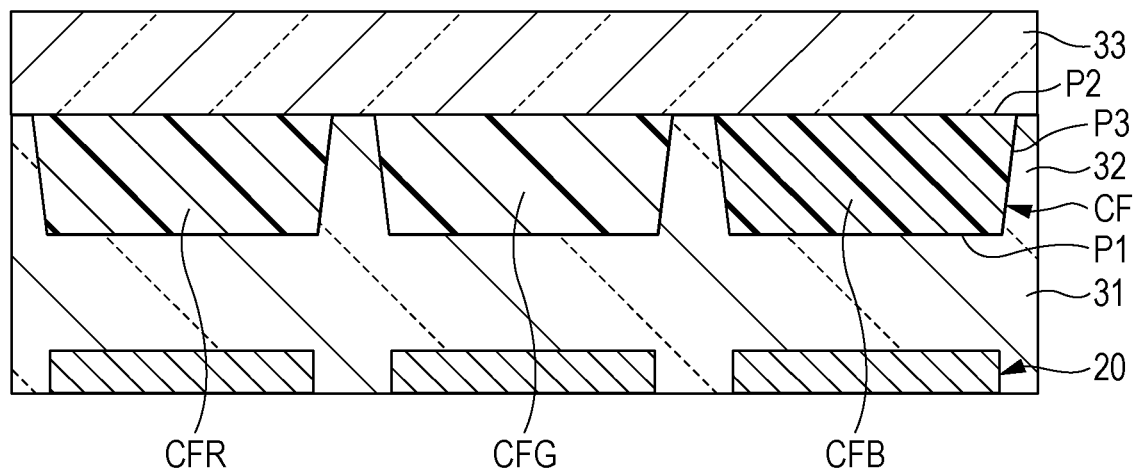
FIG. 53 is a cross-sectional view illustrating a first method of forming curved portions shown in FIG. 52 in a processing order.
Figure 54:
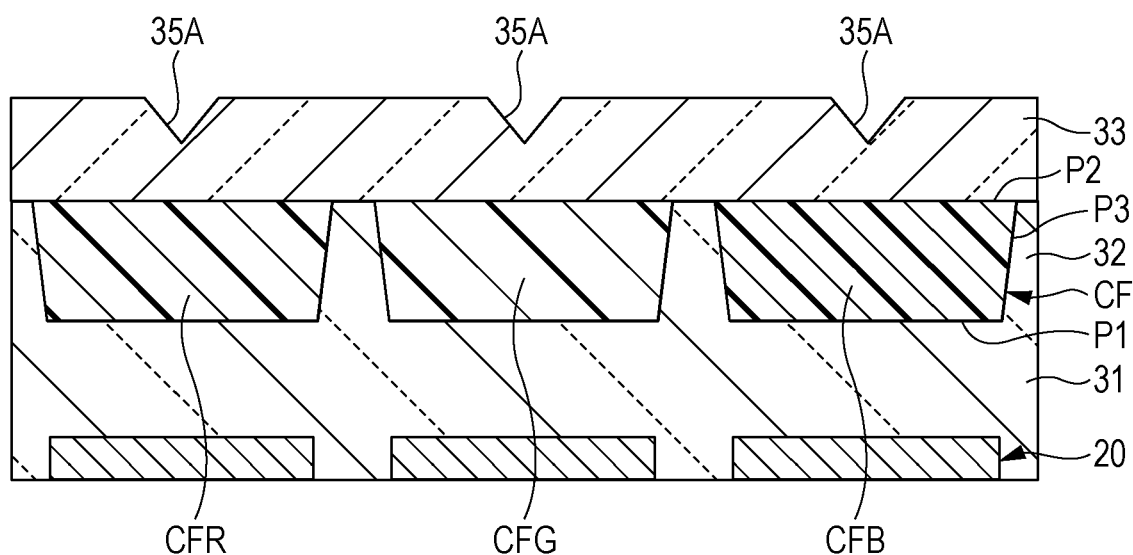
FIG. 54 is a cross-sectional view illustrating a process subsequent to the process of FIG. 53.
Figure 55:
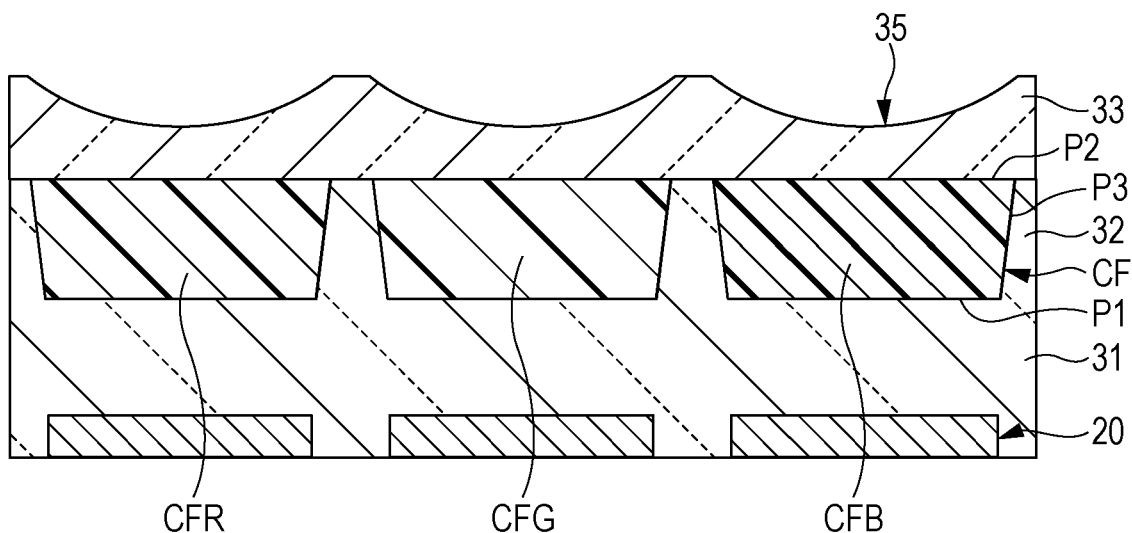
FIG. 55 is a cross-sectional view illustrating a process subsequent to the process of FIG. 54.

FIGS. 53 to 55 show a first method of forming the curved portion 35 in a processing order. First, as shown in FIG. 53, the third protective layer 33 made of SiN is formed on the light emission surface P2 of the color filter layer CF and the second protective layer 32.

Then, as shown in FIG. 54, through resist pattern forming and etching, holes 35A, each of which has a wedge shape, are formed on the upper surface of the third protective layer 33.

Subsequently, as shown in FIG. 55, through isotropic etching such as wet etching, the curved portion 35 having a lens shape is formed on the upper surface of the third protective layer 33.

Figure 56:
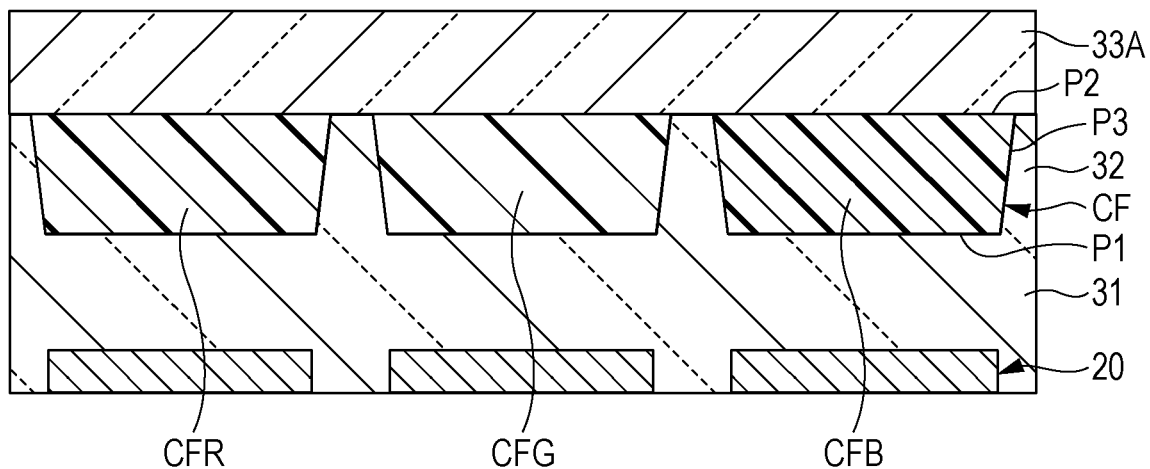
FIG. 56 is a cross-sectional view illustrating a second method of forming curved portions shown in FIG. 52 in a processing order.

FIGS. 56 to 60 show a second method of forming the curved portion 35 in a processing order. First, as shown in FIG. 56, a lower third protective layer 33A made of SiN is formed on the light emission surface P2 of the color filter layer CF and the second protective layer 32.

Figure 57:
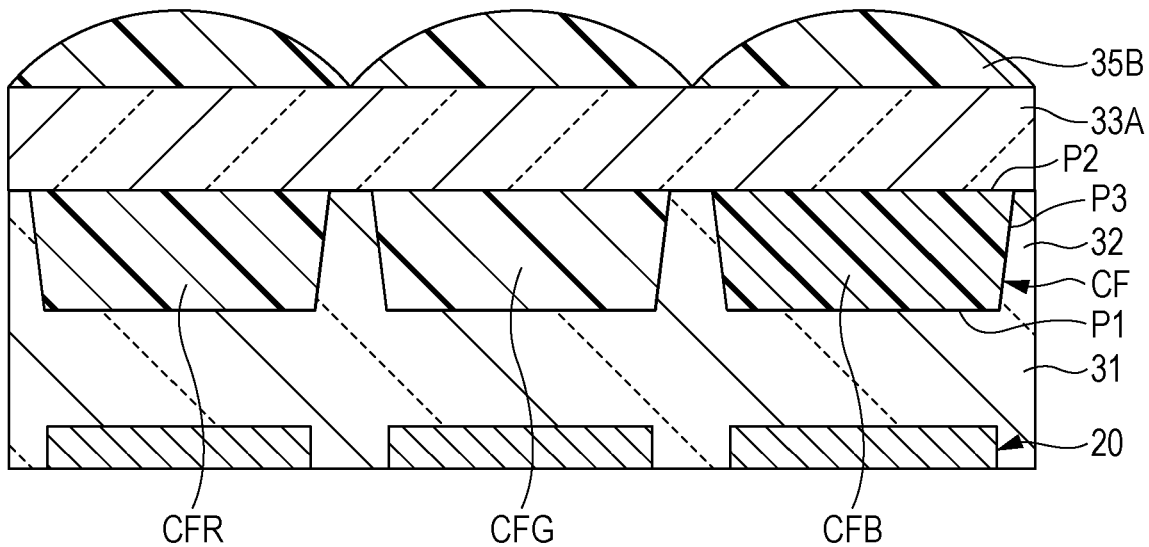
FIG. 57 is a cross-sectional view illustrating a process subsequent to the process of FIG. 56.

Next, through resist pattern forming and pattern reflow, as shown in FIG. 57, a resist film 35B having a curved shape, which is convex upward, is formed on the lower third protective layer 33A.

Figure 58:
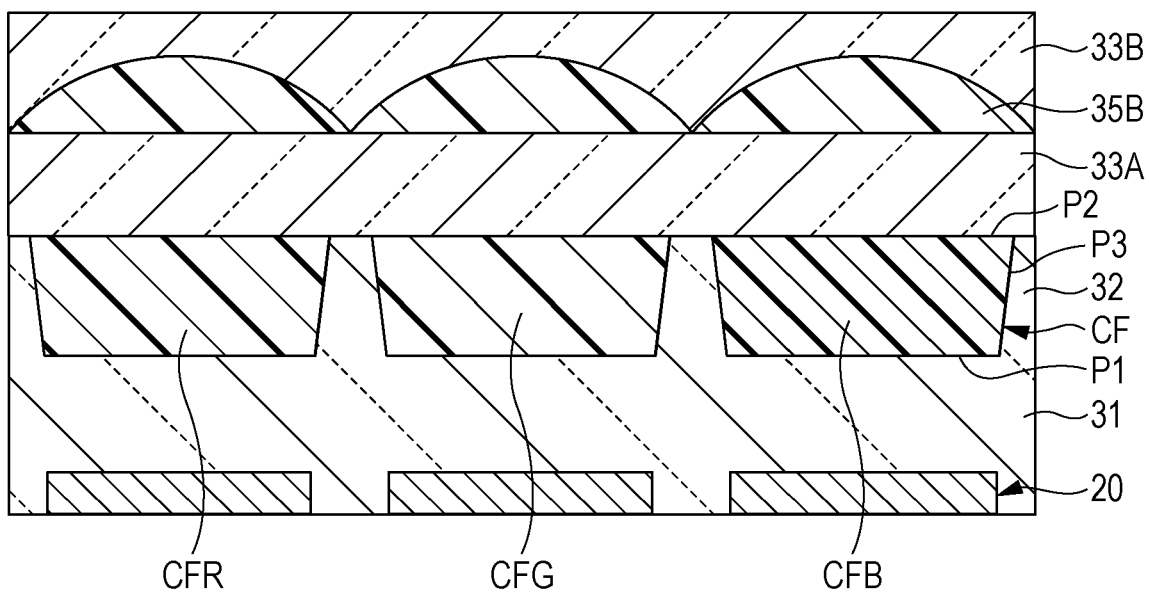
FIG. 58 is a cross-sectional view illustrating a process subsequent to the process of FIG. 57.

Subsequently, as shown in FIG. 58, an upper third protective layer 33B made of SiN is further formed on the resist film 35B having a curved shape which is convex upward.

Figure 59:
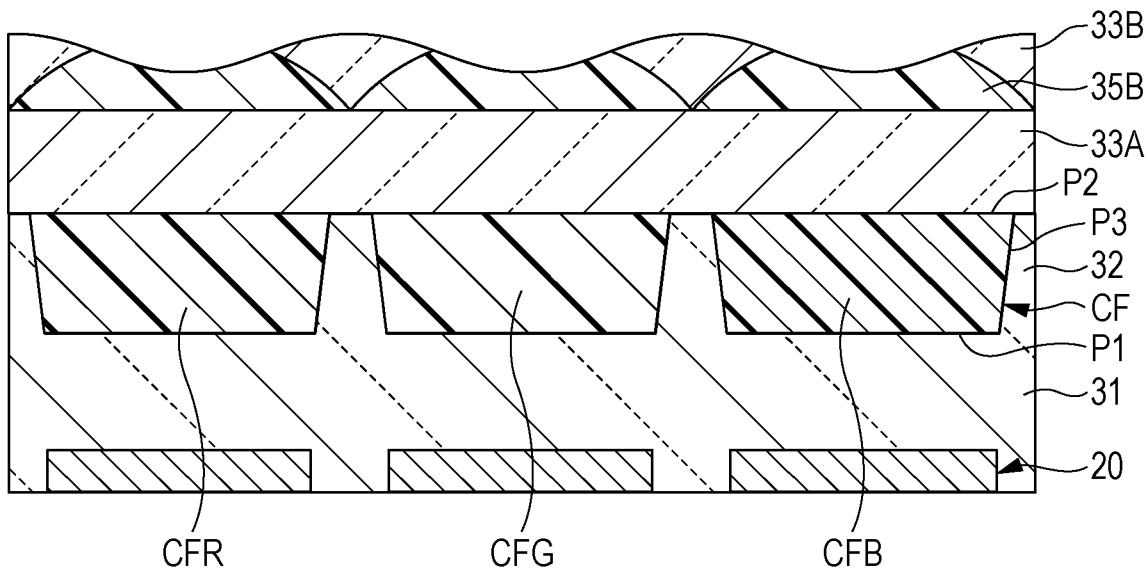
FIG. 59 is a cross-sectional view illustrating a process subsequent to the process of FIG. 58.
Figure 60:
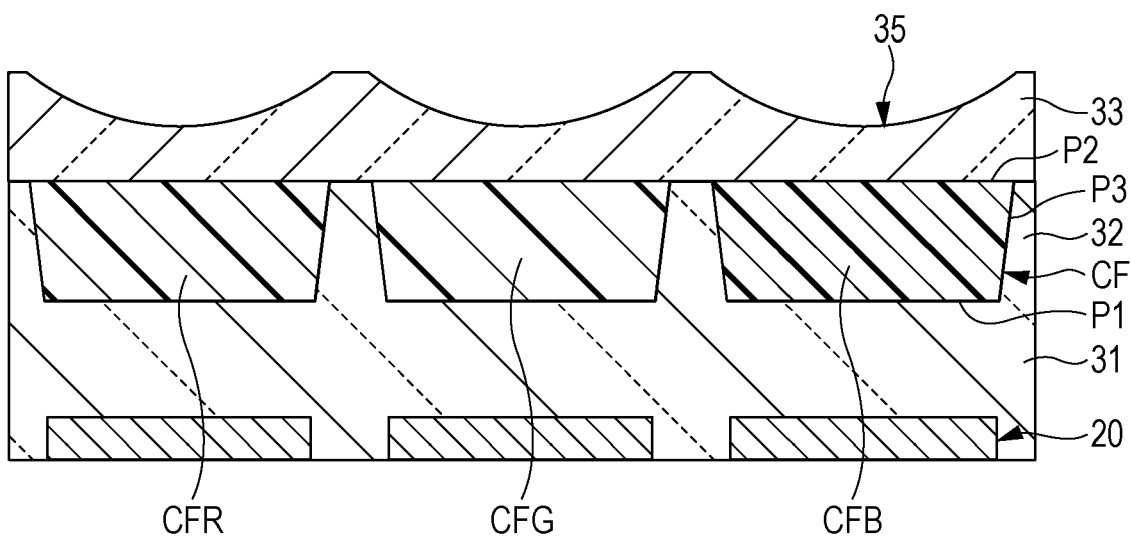
FIG. 60 is a cross-sectional view illustrating a process subsequent to the process of FIG. 59.

Thereafter, etch back is performed on the entire surface under a condition in which the etch rate of the resist film 35B increases and the etch rate of the upper third protective layer 33B made of SiN decreases. Thereby, as shown in FIG. 59, the curved shape of the resist film 35B convex upward is reversely transferred onto the upper third protective layer 33B and the lower third protective layer 33A. FIG. 59 shows an intermediate state of the reverse transfer. By continuously performing etch back from the state shown in FIG. 59, as shown in FIG. 60, the third protective layer 33 having the curved portion 35 is formed on the upper surface.

Modification Examples 9-1 to 9-3

Figure 61:
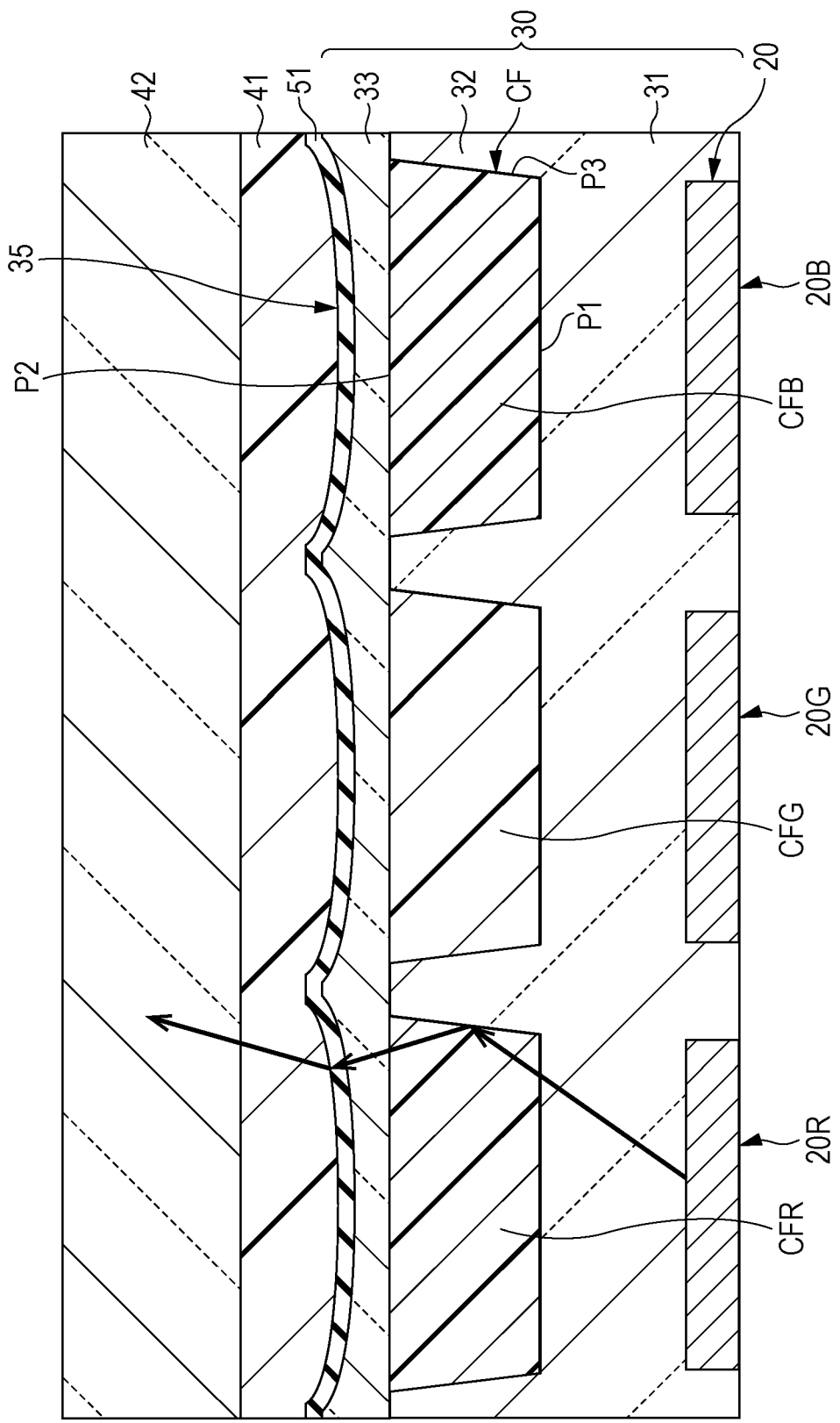
FIG. 61 is a cross-sectional view illustrating a schematic configuration of three adjacent pixels in a display device according to Modification Example 9-1.
Figure 62:
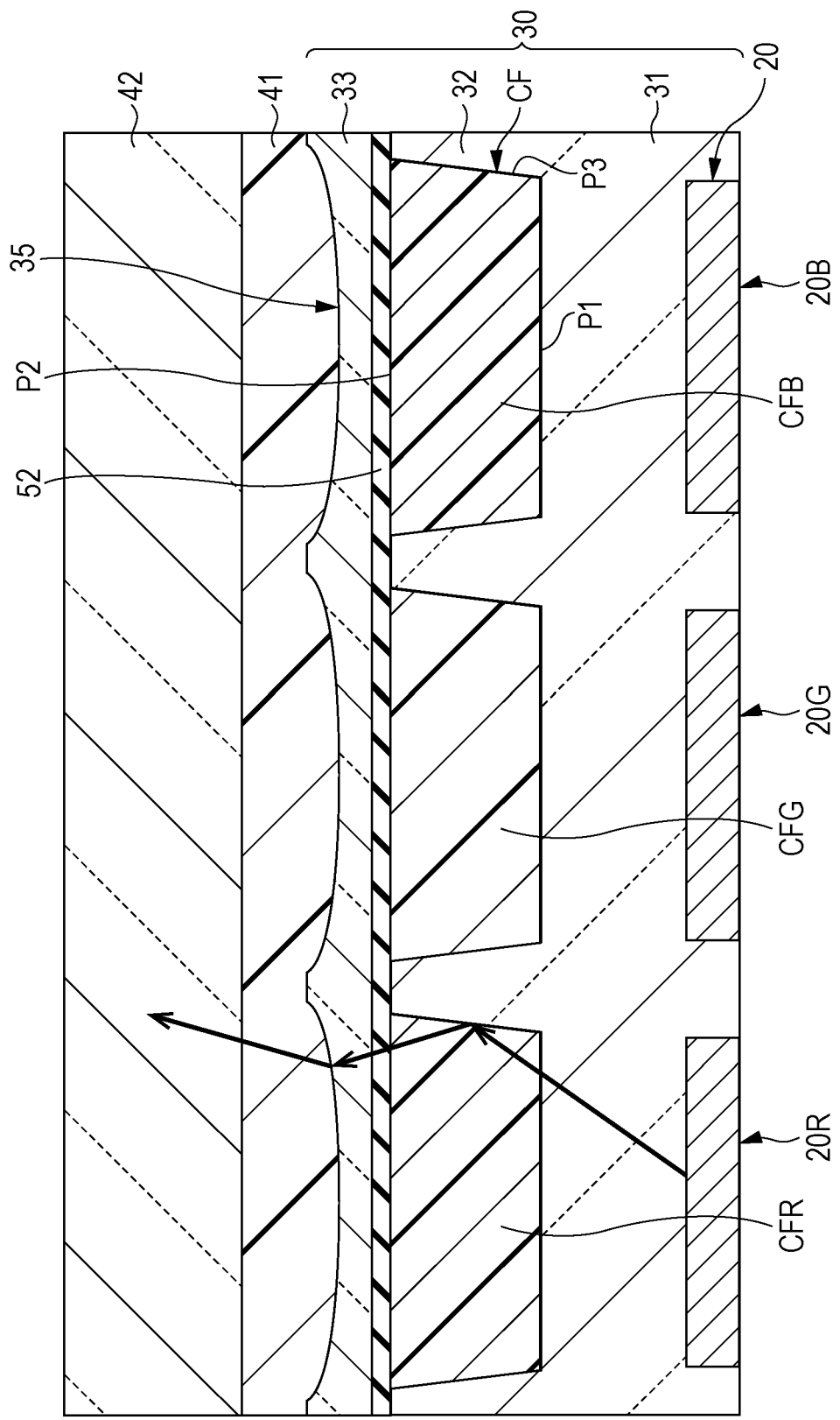
FIG. 62 is a cross-sectional view illustrating a schematic configuration of three adjacent pixels in a display device according to Modification Example 9-2.
Figure 63:
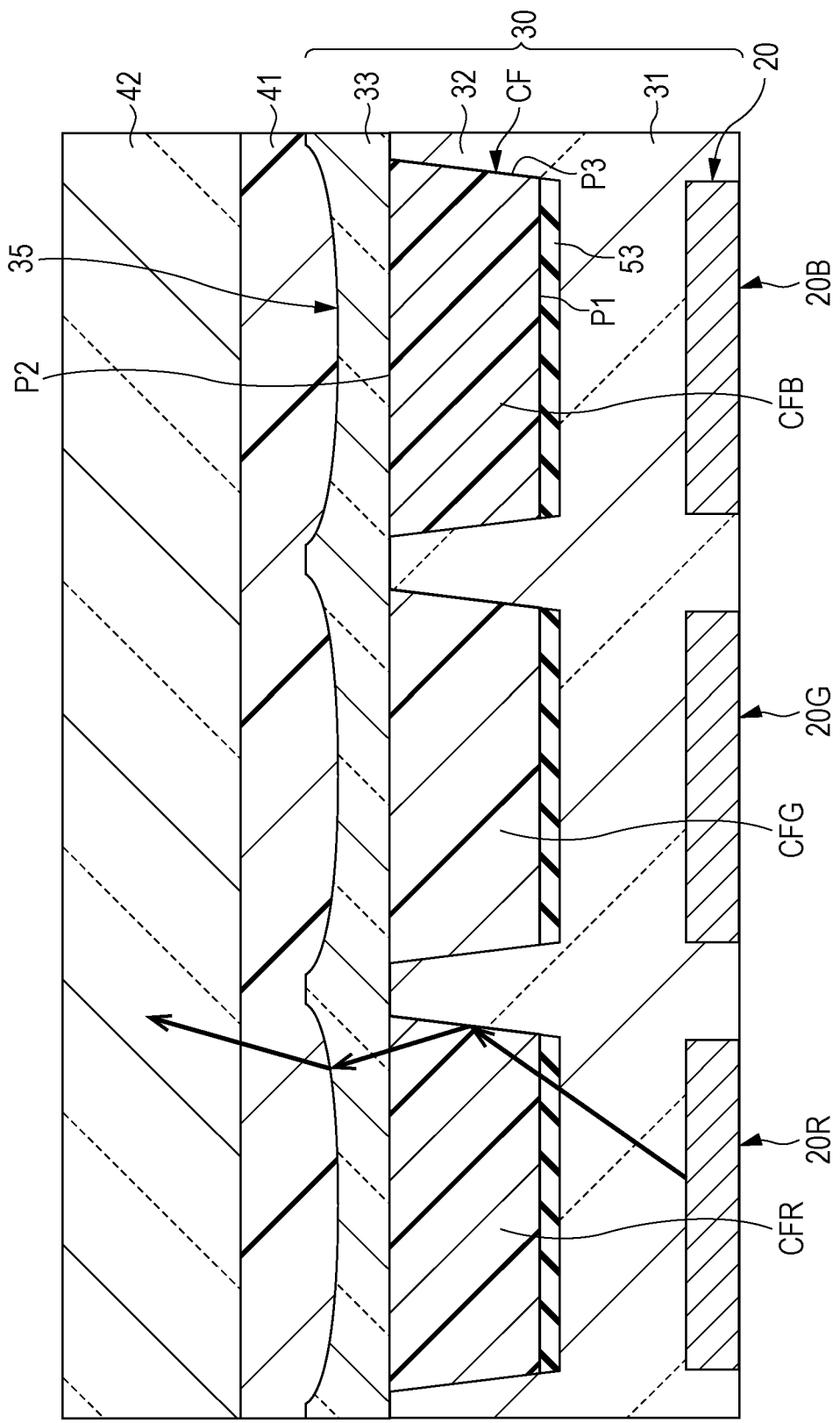
FIG. 63 is a cross-sectional view illustrating a schematic configuration of three adjacent pixels in a display device according to Modification Example 9-3.

It should be noted that the present embodiment may be combined with any one of the second to fourth embodiments. That is, for example as shown in FIG. 61, in the display device 100H of the present embodiment, in a manner similar to that of the second embodiment, the antireflection film 51 may be provided between the third protective layer 33 of the color change member 30 and the sealing resin layer 41. Alternatively, for example as shown in FIG. 62, in the display device 100H of the present embodiment, in a manner similar to that of the third embodiment, the antireflection film 52 may be provided between the third protective layer 33 and the color filter layer CF of the color change member 30. Further, for example as shown in FIG. 63, in the display device 100H of the present embodiment, in a manner similar to that of the fourth embodiment, the antireflection film 53 may be provided between the first protective layer 33 and the color filter layer CF of the color change member 30.

Further, although not shown in the drawing, the present embodiment may be combined with two or three of the second to fourth embodiments. That is, in the display device 100H of the present embodiment, in a manner similar to that of the second embodiment, the antireflection film 51 may be provided between the third protective layer 33 of the color change member 30 and the sealing resin layer 41, and in a manner similar to that of the third embodiment, the antireflection film 52 may be provided between the third protective layer 33 and the color filter layer CF of the color change member 30. Alternatively, in the display device 100H of the present embodiment, in a manner similar to that of the second embodiment, the antireflection film 51 may be provided between the third protective layer 33 of the color change member 30 and the sealing resin layer 41, and in a manner similar to that of the fourth embodiment, the antireflection film 53 may be provided between the first protective layer 31 and the color filter layer CF of the color change member 30. Further, in the display device 100H of the present embodiment, all the antireflection films 51 to 53 may be provided.

Additionally, although not shown in the drawings, the present embodiment may be combined with any one of the fifth to eighth embodiments. That is, in the display device 100H of the present embodiment, in a manner similar to that of the fifth embodiment, the second protective layer 32 of the color change member 30 may include the metal film 32A. Alternatively, in the display device 100H of the present embodiment, in a manner similar to that of the sixth embodiment, the second protective layer 32 of the color change member 30 may have a structure in which the inside black resin film 32C and the outside transparent film 32D are laminated. Further, in the display device 100H of the present embodiment, in a manner similar to that of the seventh embodiment, the second protective layer 32 of the color change member 30 may have a structure in which the inside resin film 32E and the outside metal film 32F are laminated. Furthermore, in the display device 100H of the present embodiment, in a manner similar to that of the eighth embodiment, the light emitting element 20 may be provided along the light incident surface P1 and the side surface P3 of the color filter layer CF.

In addition, although not shown in the drawings, the present embodiment may be combined with the modification examples of the fifth to eighth embodiments.

Tenth Embodiment

Figure 64:
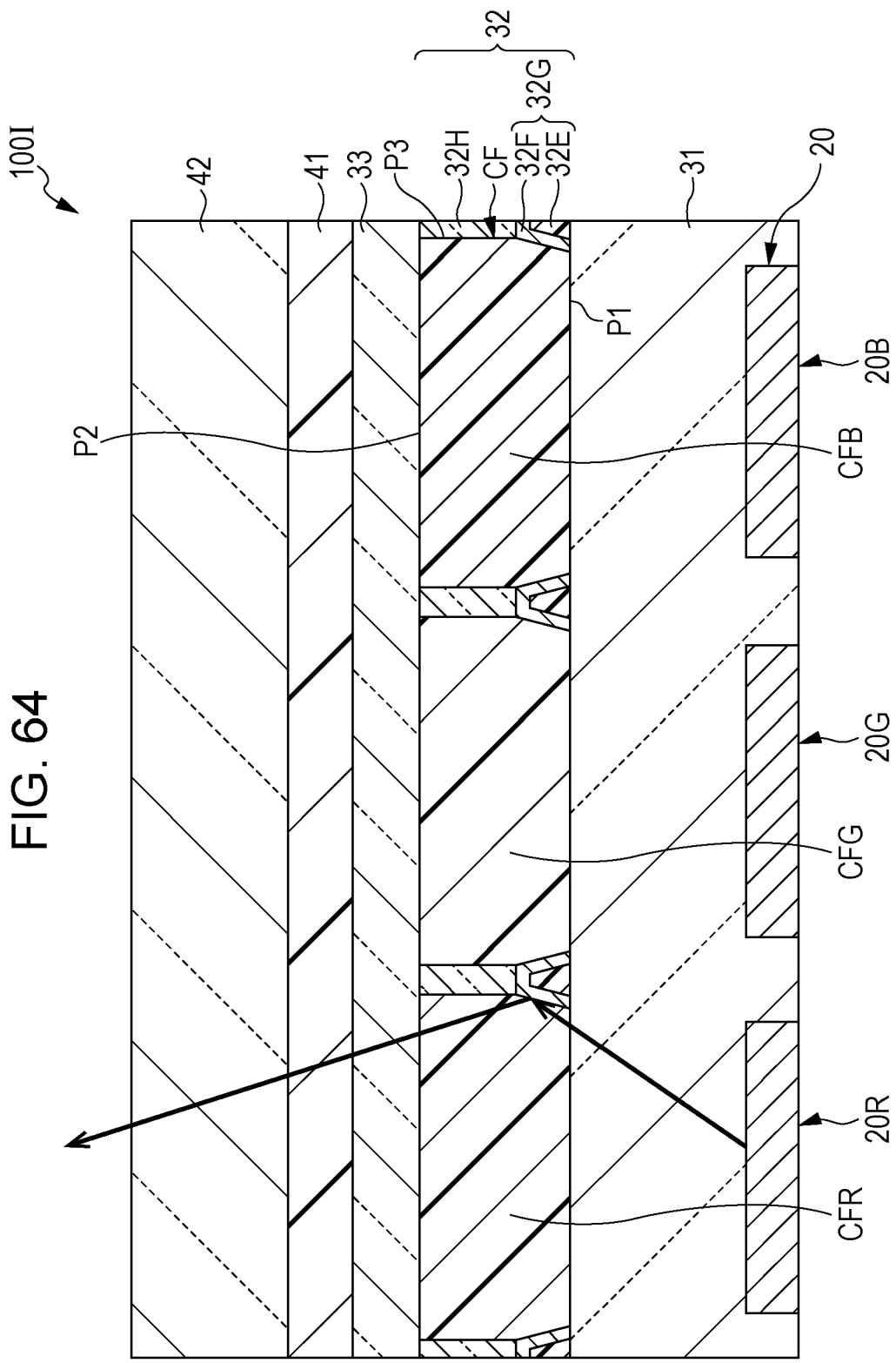
FIG. 64 is a cross-sectional view illustrating a schematic configuration of three adjacent pixels in a display device according to a tenth embodiment of the present disclosure.

FIG. 64 is a schematic cross-sectional configuration of three adjacent pixels PX in a display device 100I according to a tenth embodiment of the present disclosure. The display device 100I has the same configuration as the display devices 100 and 100F according to the first and seventh embodiments except that the second protective layer 32 of the color change member 30 has the metal film 32F provided on a part of the side surface P3 of the color filter layer CF. Accordingly, the corresponding components will be referenced by the same numerals and signs.

Specifically, the second protective layer 32 has a lower second protective layer 32G and an upper second protective layer 32H. In a manner similar to that of the seventh embodiment, the lower second protective layer 32G has a structure in which the inside resin film 32E and the outside metal film 32F are laminated. Similarly to the color filter layer CF, the resin film 32E is formed as a resin film that has a chromatic color such as red, green, or blue. It is needless to say that the resin film 32E may be a resin film that has an achromatic color such as black or transparent. Similarly to the metal film 32A of the fifth embodiment, the metal film 32F is formed as a metal film having high reflectivity or high light blocking ability. Examples of the metal film include a titanium (Ti) film, an aluminum (Al) film, a tungsten (W) film, and the like.

Similarly to the second protective layer 32 of the first embodiment, it is preferable that the upper second protective layer 32H is formed as a transparent inorganic base film that has a high transmittance and a high passivation ability. Examples of the film include a silicon nitride (SiN) film, a silicon oxynitride (SiON) film, an aluminum oxide film ($Al_2O_3$), and the like.

In the present embodiment, as described above, the second protective layer 32 of the color change member 30 has the metal film 32F provided on a part of the side surface P3 of the color filter layer CF. Thereby, in the present embodiment, in addition to the effect of the first embodiment, similarly to the seventh embodiment, a part of the side surface P3 of the color filter layer CF is protected by the metal film 32F, and it is possible to prevent mixing of colors. That is, light, which reaches the side surface P3 of the color filter layer CF, is reflected by the metal film 32F, and is thus prevented from being incident into the adjacent color filter layer CF. Further, in order to prevent mixing of colors, it suffices that the metal film 32F is provided on at least a part of the side surface P3 of the color filter layer CF. Furthermore, since an aspect ratio of the inside resin film 32E can be decreased, the process of forming the inside resin film 32E becomes easy, and thus it is possible to simplify the manufacturing process.

For example, the display device 100I can be manufactured as follows.

FIGS. 65 to 71 show a method of manufacturing the display device 100I in a processing order. It should be noted that the same processes as those in the first embodiment will be described with reference to FIGS. 5 to 10. First, in a manner similar to that of the first embodiment, through the process shown in FIG. 5, the light emitting element 20 is formed on the substrate 10 (refer to FIG. 4).

Figure 65:
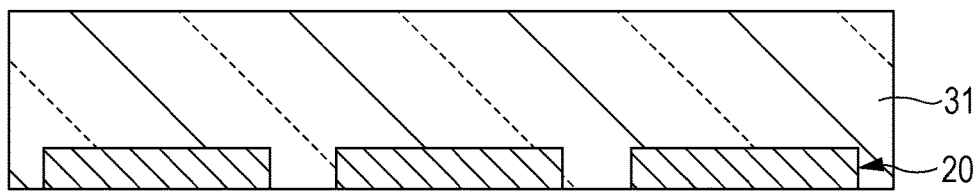
FIG. 65 is a cross-sectional view illustrating a method of manufacturing the display device shown in FIG. 64 in a processing order.

Then, as shown in FIG. 65, the first protective layer 31 is formed on the light emitting element 20. At this time, the first protective layer 31 is formed as a layer that has a planar upper surface.

Figure 66:
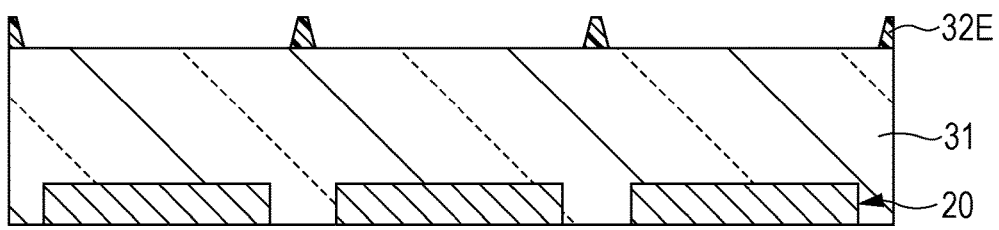
FIG. 66 is a cross-sectional view illustrating a process subsequent to the process of FIG. 65.

Subsequently, as shown in FIG. 66, the resin film 32E, which has a low aspect ratio and is made of for example the same material as the green filter CFG, is formed on the first protective layer 31 by using a negative photoresist. At this time, a height of the resin film 32E is set such that the resin film 32E is provided on a part of the side surface P3 of the color filter layer CF.

Figure 67:
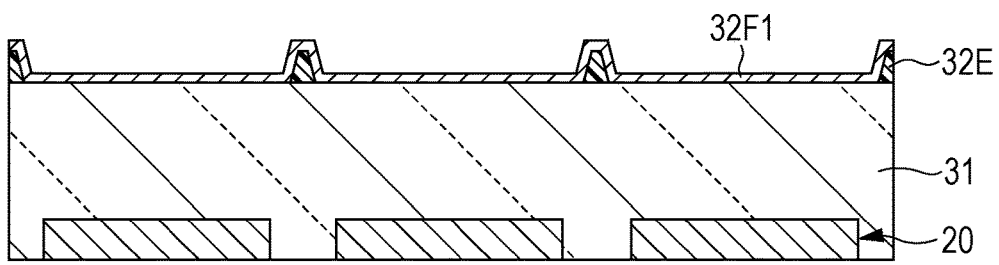
FIG. 67 is a cross-sectional view illustrating a process subsequent to the process of FIG. 66.

Thereafter, as shown in FIG. 67, a metal base film 32F1 is formed on the first protective layer 31 and the resin film 32E.

Figure 68:
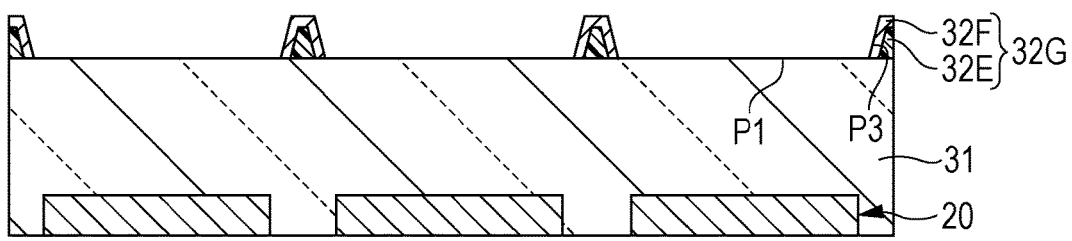
FIG. 68 is a cross-sectional view illustrating a process subsequent to the process of FIG. 67.

Subsequently, as shown in FIG. 68, by removing the metal base film 32F1 on the first protective layer 31 through etch back of the metal base film 32F1, the metal film 32F is formed on a surface of the resin film 32E.

Alternatively, for example, the metal film 32F can be formed as follows. After the metal base film 32F1 is formed, lithography is performed to provide openings in the region of the light incident surface P1 of the color filter layer CF. Thereafter, through etching, portions of the metal base film 32F1 formed on the first protective layer 31 are removed, and the photoresist layer is removed.

In such a manner, the first protective layer 31 is formed on the light incident surface P1 of the color filter layer CF. In addition, the lower second protective layer 32G is formed of the resin film 32E and the metal film 32F, on the side surface P3 of the color filter layer CF.

Figure 69:
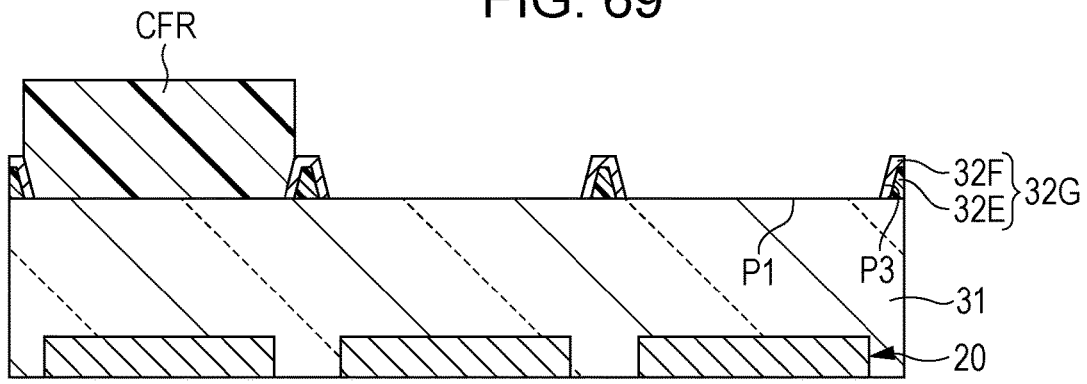
FIG. 69 is a cross-sectional view illustrating a process subsequent to the process of FIG. 68.

Thereafter, as shown in FIG. 69, the red filter CFR is formed on the first protective layer 31 and the lower second protective layer 32G by using a negative photoresist.

Figure 70:
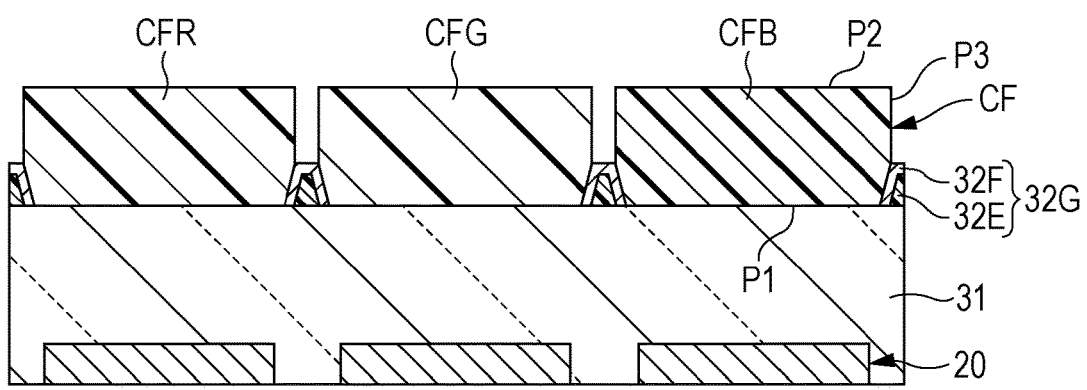
FIG. 70 is a cross-sectional view illustrating a process subsequent to the process of FIG. 69.

Subsequently, as shown in FIG. 70, similarly to the red filter CFR, a blue filter CFB and a green filter CFG are sequentially formed using negative photoresists. Thereby, the color filter layer CF is formed.

Figure 71:
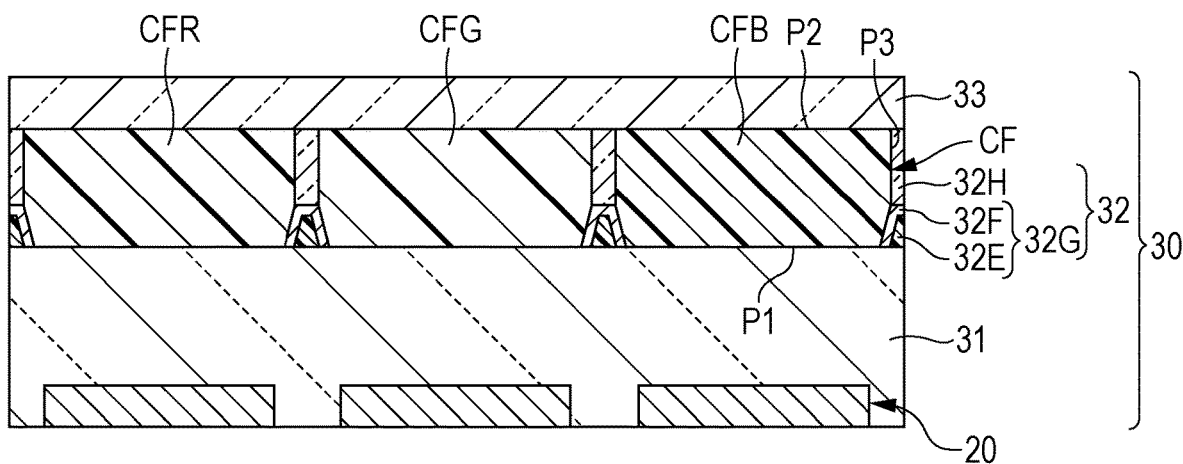
FIG. 71 is a cross-sectional view illustrating a process subsequent to the process of FIG. 70.

Thereafter, as shown in FIG. 71, an upper second protective layer 32H is embedded into the gaps between the side surfaces P3 of the adjacent color filter layers CF. Subsequently, the third protective layer 33 is formed on the light emission surface P2 of the color filter layer CF and the upper second protective layer 32H.

Finally, as shown in FIG. 64, the sealing resin layer 41 is formed on the third protective layer 33, and the sealing substrate 42 is bonded to the third protective layer 33 through the sealing resin layer 41. Thus, the display device 100I shown in FIG. 64 is completely formed.

Additionally, although not shown in the drawings, the present embodiment may be combined with any one of the second to fourth embodiments. Further, although not shown in the drawing, the present embodiment may be combined with two or three of the second to fourth embodiments.

Eleventh Embodiment

Figure 72:
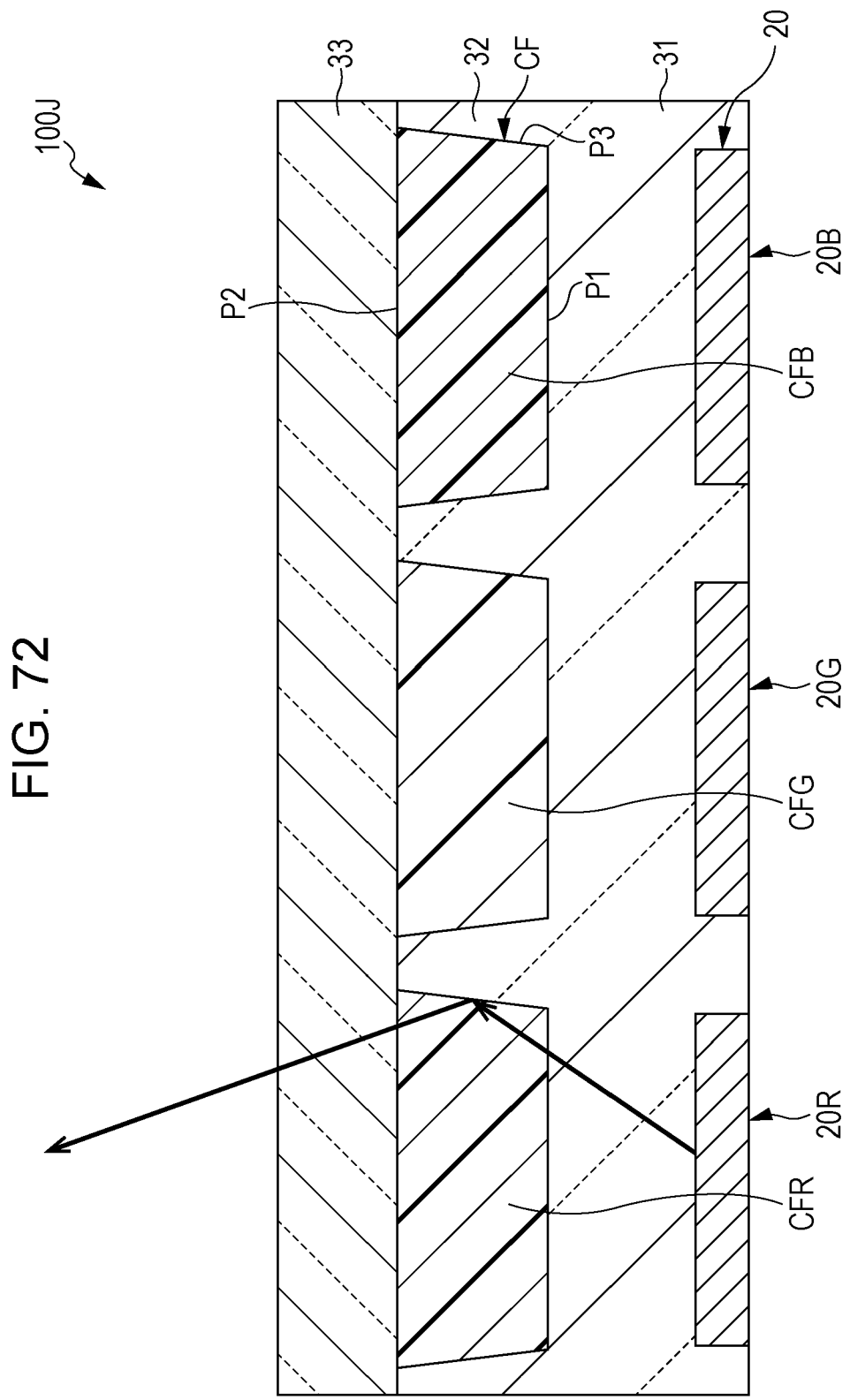
FIG. 72 is a cross-sectional view illustrating a schematic configuration of three adjacent pixels in a display device according to an eleventh embodiment of the present disclosure.

FIG. 72 is a schematic cross-sectional configuration of three adjacent pixels PX in a display device 100J according to an eleventh embodiment of the present disclosure. The display device 100J has the same configuration as the display device 100 according to the first embodiment except that the sealing resin layer 41 and the sealing substrate 42 on the color change member 30 are omitted. Thereby, in the present embodiment, the light emitting element 20 protected by the color change member 30 can be directly mounted as a package in the display device 100 or the other electronic apparatus. As a result, it is possible to achieve reduction in size and thickness.

The display device 100J can be manufactured in a manner similar to that of the first embodiment except that, after the third protective layer 33 of the color change member 30 is formed, the sealing resin layer 41 and the sealing substrate 42 are not provided.

Additionally, although not shown in the drawings, the present embodiment may be combined with any one of the second to fourth embodiments. Further, although not shown in the drawing, the present embodiment may be combined with two or three of the second to fourth embodiments.

In addition, although not shown in the drawings, the present embodiment may be combined with the fifth to tenth embodiments or the modification examples thereof.

Modification Example of Light Emitting Element

In the description of the above-mentioned embodiments, as shown in FIG. 4, the light emitting layer 23C is a white light emitting layer having a structure in which the red light emitting layer 23CR, the blue light emitting layer 23CB, and the green light emitting layer 23CG are laminated, and the white light LW, which is generated from the light emitting layer 23C, is color-separated into the red light LR, the green light LG, and the blue light LB through the color filter layer CF (the red filter CFR, the green filter CFG, and the blue filter CFB).

Figure 73:
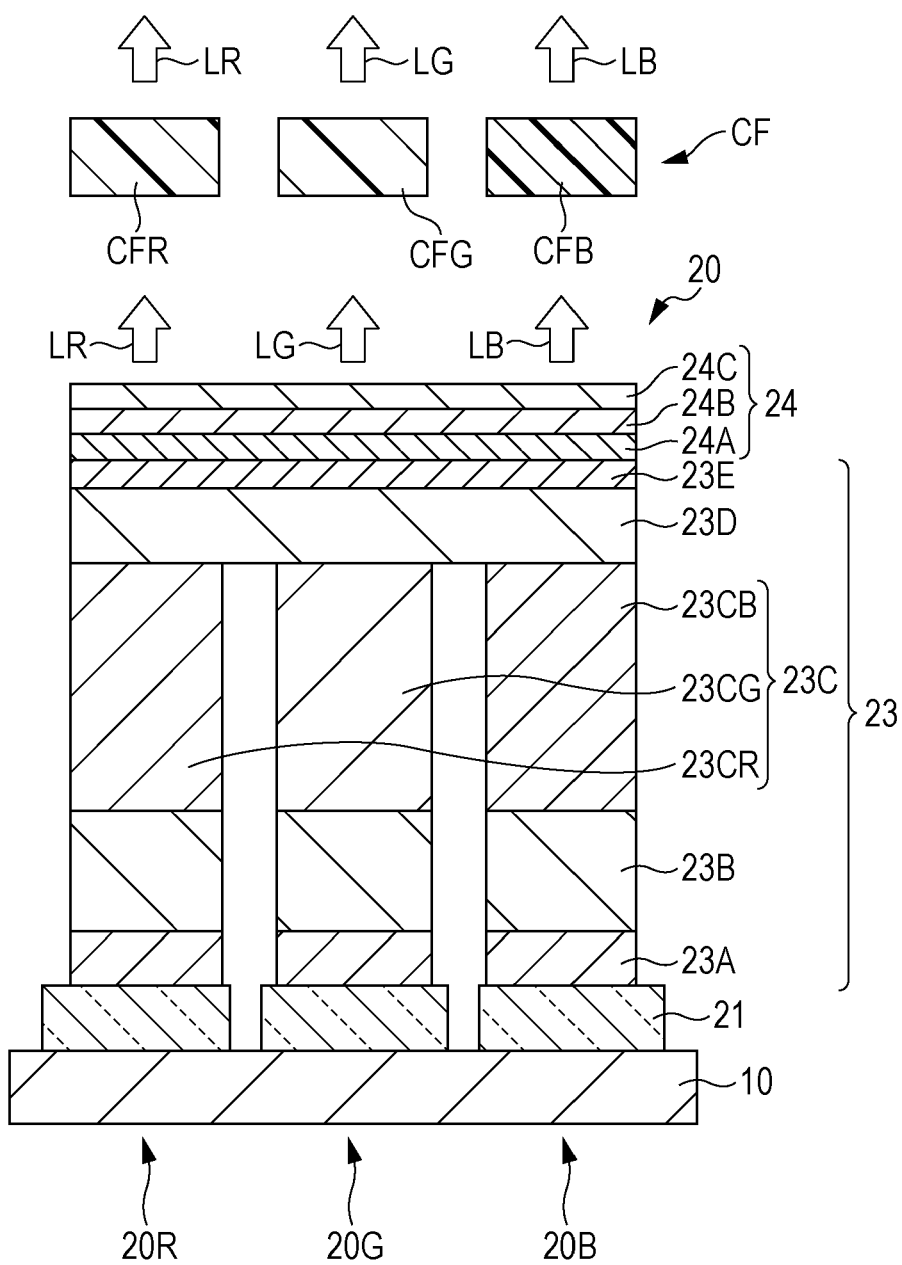
FIG. 73 is a cross-sectional view illustrating a different example of the light emitting element shown in FIG. 3.

However, for example as shown in FIG. 73, the organic layer 23 may have the following configuration: in order from the anode electrode 21 side, the hole injection layer 23A, the hole transport layer 23B, and the light emitting layer 23C (the red light emitting layer 23CR, the green light emitting layer 23CG, and the blue light emitting layer 23CB), the electron transport layer 23D, and the electron injection layer 23E are laminated. In this case, the red light emitting layer 23CR generates red light LR. The green light emitting layer 23CG generates green light LG. The blue light emitting layer 23CB generates blue light LB. As described above, for each separate color, the light emitting layer 23C (the red light emitting layer 23CR, the green light emitting layer 23CG, and the blue light emitting layer 23CB) and the color filter layer CF (the red filter CFR, the green filter CFG, and the blue filter CFB) are used in combination, whereby it is possible to increase the color purity.

In the organic layer 23 shown in FIG. 73, the hole injection layer 23A, the hole transport layer 23B, the electron transport layer 23D, and the electron injection layer 23E are formed as common layers on the entire surface of the pixel array section 102 (refer to FIG. 1) by, for example, the vacuum deposition method. Meanwhile, the red light emitting layer 23CR, the green light emitting layer 23CG, and the yellow light emitting layer 23CY are formed to correspond to the respective colors by, for example, a coating method. The blue light emitting layer 23CB may be formed as common layers on the entire surface of the pixel array section 102 by, for example, the vacuum deposition method, and may be formed to correspond to the respective colors by, for example, a coating method.

Figure 74:
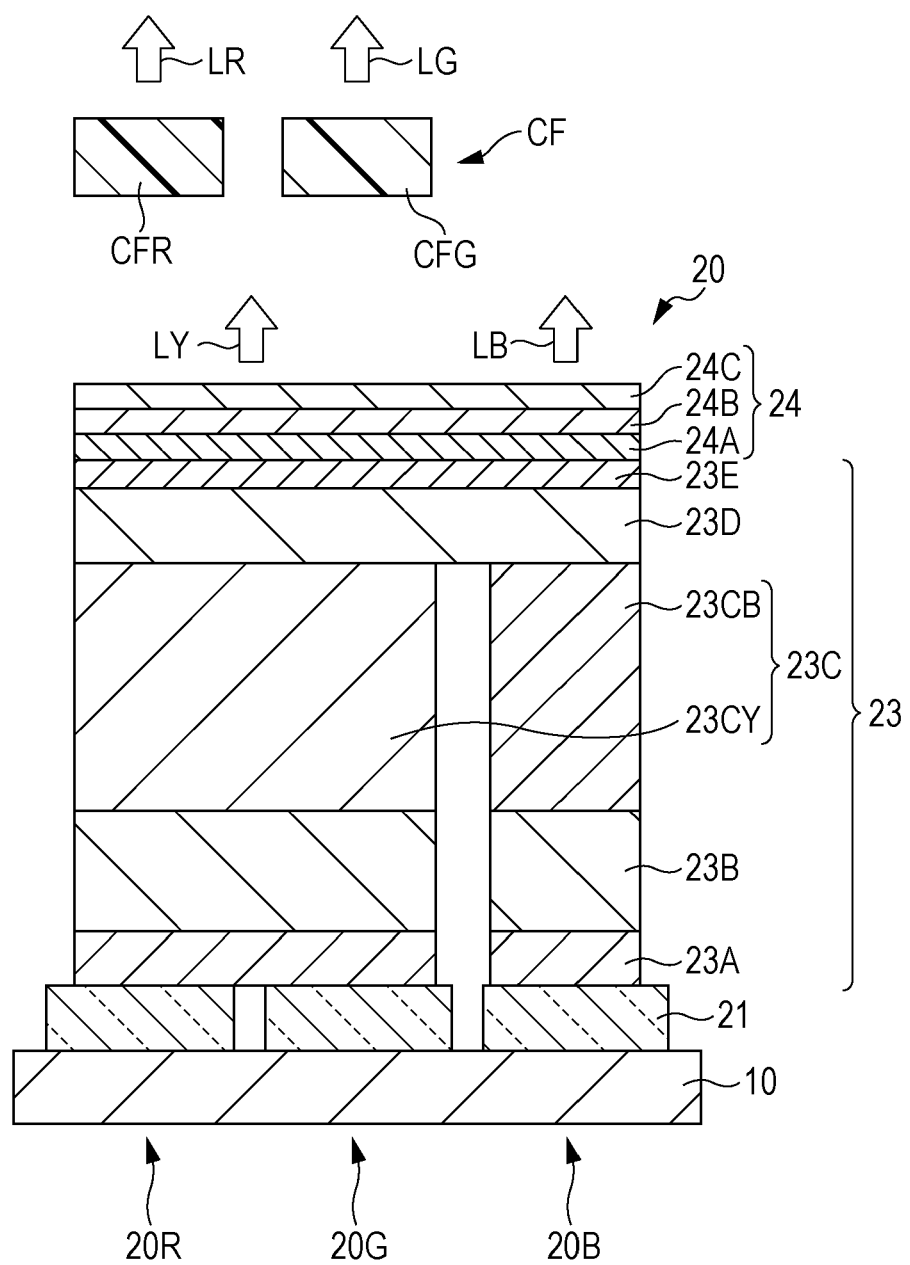
FIG. 74 is a cross-sectional view illustrating a further example of the light emitting element shown in FIG. 3.

Alternatively, for example as shown in FIG. 74, the organic layer 23 may have the following configuration: in order from the anode electrode 21 side, the hole injection layer 23A, the hole transport layer 23B, the light emitting layer 23C (the yellow light emitting layer 23CY and the blue light emitting layer 23CB), the electron transport layer 23D, and the electron injection layer 23E are laminated. In this case, the yellow light emitting layer 23CY generates the yellow light LY. The yellow light LY is color-separated into the red light LR and the green light LG by the color filter layer CF (the red filter CFR and the green filter CFG).

It should be noted that the organic layer 23 and the light emitting layer 23C are not limited to the configurations of the examples shown in FIGS. 4, 73, and 74, and may have different configurations.

Application Examples

Subsequently, referring to FIGS. 75 to 78, application examples of the display devices according to the embodiments will be described. Further, the display devices according to the embodiments are used in electronic viewfinders of digital single-lens reflex cameras, head mount displays, and the other wearable displays, as the above-mentioned micro displays. Furthermore, the display devices can be applied to electronic apparatuses in various fields. Examples of the electronic apparatuses include television apparatuses, computers such as desktops, notebooks, and tablets, monitor apparatuses of game consoles, digital signages, mobile terminal apparatuses such as mobile phones, smart phones, e-book readers, and portable music players, and the like.

Module

Figure 75:
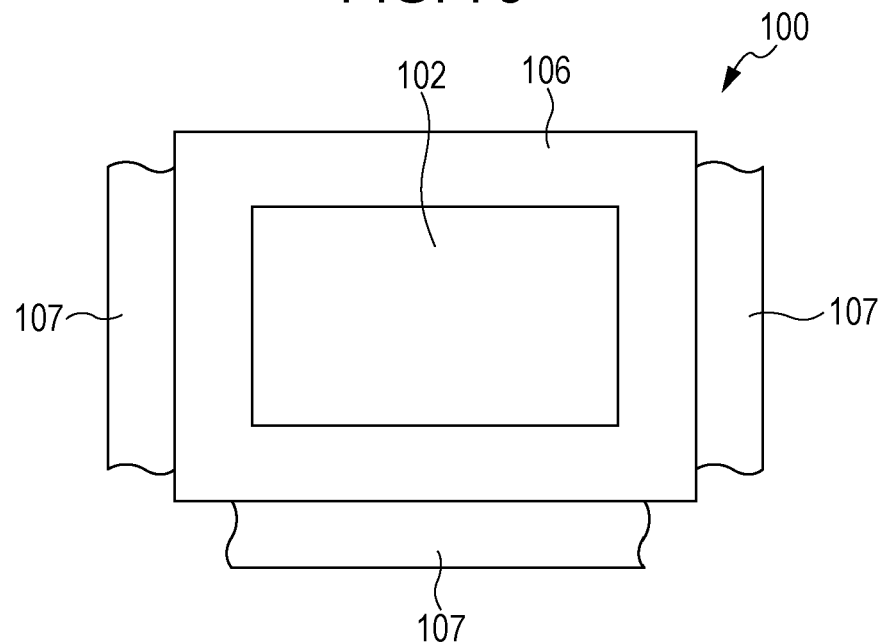
FIG. 75 is a plan view illustrating a schematic configuration of a module including the display device according to the embodiment.

The display device according to the embodiment may be provided as, for example, such a module shown in FIG. 75, in various electronic apparatuses according to Application Examples 1 and 2 to be described later. The module has, for example, the pixel array section 102 (refer to FIG. 1) on the central portion and a peripheral region 106 outside the pixel array section 102. In the peripheral region 106, the driving sections (the signal selector 103, the main scanner 104, and the power supply scanner 105) shown in FIG. 1 are provided, and an external connection terminal (not shown in the drawing), to which the lines of the pixel array section 102 extend, is provided. A flexible printed circuit (FPC) 107 for input and output of signals may be connected to the external connection terminal.

Application Example 1

Figure 76:
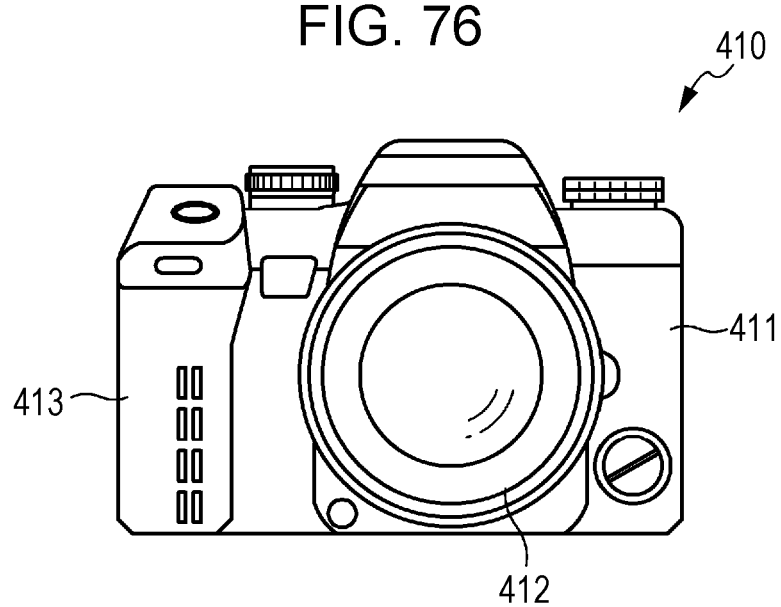
FIG. 76 is a perspective view illustrating an appearance of Application Example 1.
Figure 77:
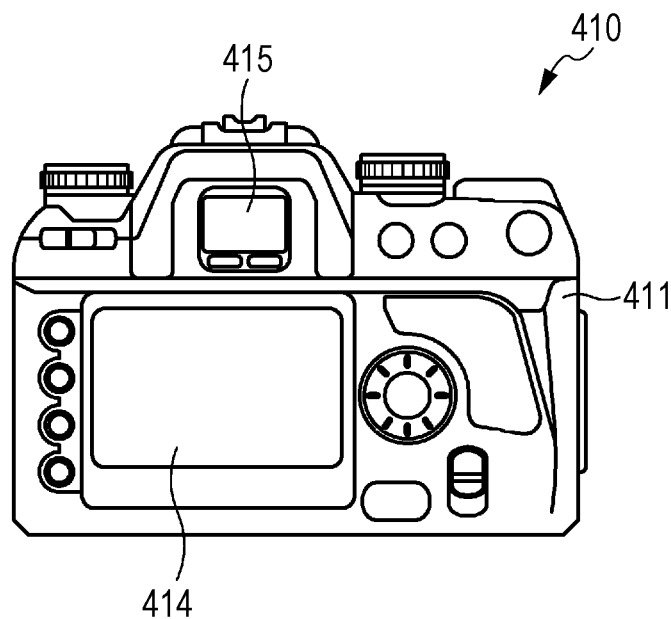
FIG. 77 is a perspective view illustrating an appearance of Application Example 2.

FIGS. 76 and 77 show appearances of an imaging apparatus (interchangeable lens single-lens reflex digital camera) to which the display device according to the embodiments is applied. The imaging apparatus 410 has, for example, an interchangeable photography lens unit (interchangeable lens) 412 on the front right side of a camera main body section (camera body) 411, and a grip section 413 to be gripped by a photographer on the front left side. In the approximately central section of the rear surface of the camera main body section 411, a monitor 414 is provided. A viewfinder (eyepiece window) 415 is provided above the monitor 414. The photographer is able to view an image of a subject light guided from the photography lens unit 412 and determine a picture composition by looking into the viewfinder 415. The viewfinder 415 is formed as the display device according to the embodiments.

Application Example 2

Figure 78:
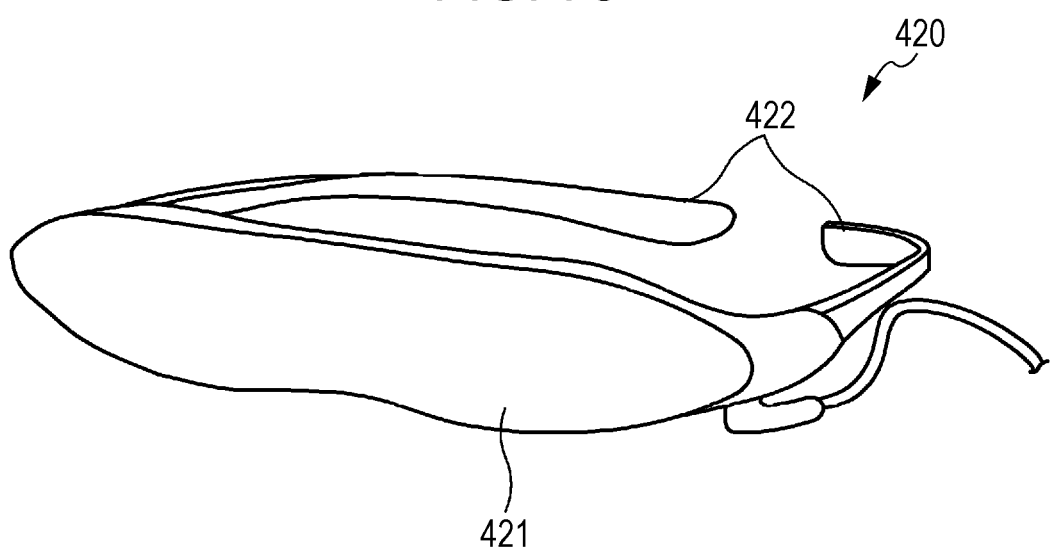
FIG. 78 is a perspective view illustrating an appearance of Application Example 3.

FIG. 78 show an appearance of a head mount display to which the display device of the embodiments is applied. The head mount display 420 has, for example, an ear-hook section 422 to be worn on a user's head on both sides of an eyeglass-shaped display section 421. The display section 421 is constituted of the display device according to the embodiments.

The present technology has been hitherto described with reference to the embodiments, but the present technology is not limited to the embodiments, and may be modified into various forms.

For example, in the embodiments, the description has been given of the exemplary configuration of the on-chip color filter in which the color change member 30 is provided on the light emitting element 20, but the color change member 30 may be provided on the sealing substrate 42.

For example, in the embodiments, the description has been given of the case where the color change member 30 is color filters that change the color of light through light absorption. However, the color change member 30 may be a color conversion layer or a wavelength conversion member that changes the color of light through fluorescence. The color conversion layer or a wavelength conversion member is formed by mixing an organic fluorescent material in the organic material such as photoresist.

For example, in the above embodiment, the description has been given of the case where the light emitting element 20 is an organic EL device. However, the light emitting element 20 may be a different self-light-emitting element such as a light emitting diode (LED), a semiconductor laser, or an inorganic EL element.

For example, in the embodiments, the description has been given of the example of the display device 100 that has the color change member 30 provided on the light extraction side of the light emitting element 20. However, instead of the light emitting element 20, the display device 100 may have a light control element that controls transmission or reflection of light, for example, the color change member 30 on the light extraction side of the liquid crystal element.

In the present disclosure, the color change member 30 is provided on the light extraction side of the light emitting element 20. However, the present disclosure can be applied to a light emitting device such as an illumination application that is not for image display.

For example, in the embodiments, the description has been given of the specific configurations of the display devices 100 and 100A to 100J, but the display devices 100 and 100A to 100J are not limited to having all the components shown in the drawings. Further, some components may be replaced with different components.

In the embodiments, the description has been given of the specific examples of the configuration and the operation of the pixel circuit 101. However, the configuration of the pixel circuit for active matrix driving is not limited to the description of the embodiments, and a capacitor or a transistor may be added as necessary, and a wiring relationship may be modified. In this case, in accordance with the change of the pixel circuit, in addition to the above-mentioned driving sections (the signal selector 103, the main scanner 104, and the power supply scanner 105), a necessary driving circuit may be added. Further, the driving method and the operation of the pixel circuit are not limited to the description of the embodiments, and it is needless to say that the driving method and the operation thereof may be appropriately modified.

For example, the materials, the thicknesses, the film forming methods, the film forming conditions, and the like of the respective layers are not limited to those described in the embodiments, and other materials, other thicknesses, other film-forming methods, and other film-forming conditions may be adopted.

The organic layer 23 may be formed in not only the coating method such as vacuum deposition or discharge coating, but also another coating method such as dipping, a doctor blade method, spin coating, or spray coating, or a printing method such as an ink-jet method, an offset printing method, a relief printing method, an intaglio printing method, a screen printing method, or a micro gravure coating method. Here, a dry process and a wet process may be used in combination in accordance with a property of each member or each layer of the organic layer 23.

In the embodiments, the description has been given of the solid sealing structure. In the structure, the light emitting element 20 is covered by the color change member 30, the sealing resin layer 41, and the sealing substrate 42, and there is no space between the color change member 30 and the sealing substrate 42. However, a cavity sealing structure may be adopted. In the structure, the light emitting element 20 is covered by the color change member 30 and a cover-shaped member (not shown in the drawing), and a space between the color change member 30 and the cover-shaped member remains. In this case, by providing a getter agent (not shown in the drawing) in the space between the cover-shaped member and the third protective layer 33 of the color change member 30, it is preferable to prevent moisture from permeating into the organic layer 23.

In the embodiments, the description has been given of the case where the light emitting element 20 has the anode electrode 21, the organic layer 23, and the cathode electrode 24, in order from the substrate 10 side. However, by reversing the order of the anode electrode 21 and cathode electrode 24, the cathode electrode 24, the organic layer 23, and the anode electrode 21 may be provided in order from the substrate 10 side. Even in this case, it is possible to adopt either the top emission, in which light is extracted from the anode electrode 21 side, or the bottom emission in which light is extracted from the cathode electrode 24 (substrate 10) side.

It should be noted that the effects described in the present specification are just examples and are not limited to this. Further, the present technology may have other effects.

It should be noted that the present technology may adopt the following configurations.

(1)

A color change member including:

a color change layer that has a light incident surface, a light emission surface, and a side surface;

a first protective layer that is provided on the light incident surface of the color change layer; and a second protective layer that is provided on at least a part of the side surface of the color change layer.

(2)

The color change member according to (1), further including a third protective layer that is provided on at least a part of the light emission surface of the color change layer.

(3)

The color change member according to (2), in which at least the first protective layer and the third protective layer among the first protective layer, the second protective layer, and the third protective layer include transparent inorganic base films.

(4)

The color change member according to (3), in which at least the first protective layer and the third protective layer among the first protective layer, the second protective layer, and the third protective layer include at least one of a silicon nitride film, a silicon oxynitride film, and an aluminum oxide film.

(5)

The color change member according to any one of (1) to (4), in which the second protective layer includes a metal film provided on at least a part of the side surface of the color change layer.

(6)

The color change member according to (5), in which the second protective layer includes at least one of a titanium (Ti) film, an aluminum (Al) film, and a tungsten (W) film.

(7)

The color change member according to any one of (1) to (4), in which the second protective layer includes a black resin film provided on at least a part of the side surface of the color change layer.

(8)

The color change member according to any one of (1) to (7), further including an antireflection film that is provided on at least either one side of the light incident surface and the light emission surface of the color change layer.

(9)

The color change member according to any one of (2) to (8), in which the third protective layer has a curved portion provided on a surface opposite to the light emission surface.

(10)
A light emitting device including:
a light emitting element that emits light; and
a color change member that is provided on a light extraction side of the light emitting element,
in which the color change member includes
a color change layer that has a light incident surface, a light emission surface, and a side surface,
a first protective layer that is provided on the light incident surface of the color change layer, and
a second protective layer that is provided on at least a part of the side surface of the color change layer.

(11)
A display device including:
a light control element that controls transmission or reflection of light or a light emitting element that emits light; and
a color change member that is provided on a light extraction side of the light control element or the light emitting element,
in which the color change member includes
a color change layer that has a light incident surface, a light emission surface, and a side surface,
a first protective layer that is provided on the light incident surface of the color change layer, and
a second protective layer that is provided on at least a part of the side surface of the color change layer.

(12)
The display device according to (11), in which the light emitting element is provided along the light incident surface and the side surface of the color change layer.

(13)
An electronic apparatus including
a display device,
in which the display device includes a light control element that controls transmission or reflection of light or a light emitting element that emits light, and a color change member that is provided on a light extraction side of the light control element or the light emitting element, and
in which the color change member includes
a color change layer that has a light incident surface, a light emission surface, and a side surface,
a first protective layer that is provided on the light incident surface of the color change layer, and
a second protective layer that is provided on at least a part of the side surface of the color change layer.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting device comprising:
a light emitting element that emits light;
a color change member that is provided on a light extraction side of the light emitting element;
a sealing substrate that covers the light emitting element with the color change member being provided between the light emitting element and the sealing substrate; and
a sealing resin layer provided between the sealing substrate and the color change member, wherein
the sealing substrate and the sealing resin layer each have a planar structure including parallel upper and lower surfaces that extend continuously across a light emission side of the color change member, and
the color change member includes
a color change layer that has a light incident surface, a light emission surface, and a side surface,
a first protective layer that is provided on the light incident surface of the color change layer, and
a second protective layer that is provided on at least a part of the side surface of the color change layer, wherein
the first protective layer and the second protective layer are integrally formed,
the color change layer includes a plurality of color filters each having a light incident surface, and
the integrally formed first protective layer and second protective layer continuously extends between a light emission side of the light emitting element to the light incident surface of the plurality of color filters.

2. The light emitting device according to claim 1, wherein the light emitting element is configured to emit light having a white color.

3. The light emitting device according to claim 1, wherein the plurality of color filters each have a light emission surface and a side surface, the second protective layer is provided on at least a part of the side surface of each of the color filters, the side surface of each color filter has a tapered shape, and an angle of the tapered shape is such that light traveling obliquely from the light incident surface and impinging on the side surface is extracted via the light emission surface.

4. The light emitting device according to claim 1, wherein the second protective layer includes a metal film.

5. The light emitting device according to claim 1, wherein the second protective layer includes a black resin film.

6. The light emitting device according to claim 1, further comprising an antireflection film that is provided on at least either side of the light incident surface and the light emission surface of the color change layer.

7. The light emitting device according to claim 1, wherein the color change layer is configured to change a color of light by light absorption.

8. The light emitting device according to claim 1, wherein
a light incident side of the sealing substrate is in direct contact with a light emission side of the sealing resin layer, and
a light incident side of the sealing resin layer is in direct contact with a light emission side of the color change member.

9. The light emitting device according to claim 1, wherein the first protective layer includes an aluminum oxide film having a thickness of 100 nm or less.

10. The light emitting device according to claim 9, wherein the first protective layer is formed by an atomic layer deposition method.

11. The light emitting device according to claim 1, further comprising a third protective layer that is provided on at least a part of the light emission surface of the color change layer.

12. The light emitting layer according to claim 11, wherein the first protective layer and the second protective layer include a first transparent inorganic base film and the third protective layer includes a second transparent inorganic base film.

13. The light emitting device according to claim 12, wherein the first protective layer, the second protective layer, and the third protective layer respectively include at least one of a silicon nitride film, a silicon oxynitride film, and an aluminum oxide film.

14. The light emitting device according to claim 11, wherein the sealing substrate, the sealing resin layer, and the third protective layer each have a planar structure including parallel upper and lower surfaces that extend continuously across a light emission side of the color change member.

15. The light emitting device according to claim 14, wherein
- a light incident side of the sealing substrate is in direct contact with a light emission side of the sealing resin layer,
- a light incident side of the sealing resin layer is in direct contact with a light emission side of the third protective layer, and
- a light incident side of the third protective layer is in direct contact with the light emission surface of the color change layer.

16. A display device comprising:
- a light control element that controls transmission or reflection of light or a light emitting element that emits light;
- a color change member that is provided on a light extraction side of the light control element or the light emitting element;
- a sealing substrate that covers the light emitting element with the color change member being provided between the light emitting element and the sealing substrate; and
- a sealing resin layer provided between the sealing substrate and the color change member, wherein
- the sealing substrate and the sealing resin layer each have a planar structure including parallel upper and lower surfaces that extend continuously across a light emission side of the color change member, and
- the color change member includes
  - a color change layer that has a light incident surface, a light emission surface, and a side surface,
  - a first protective layer that is provided on the light incident surface of the color change layer, and
  - a second protective layer that is provided on at least a part of the side surface of the color change layer, wherein
- the first protective layer and the second protective layer are integrally formed,
- the color change layer includes a plurality of color filters each having a light incident surface, and
- the integrally formed first protective layer and second protective layer continuously extends between a light emission side of the light emitting element to the light incident surface of the plurality of color filters.

17. The display device according to claim 16, wherein the light emitting element is provided along the light incident surface and the side surface of the color change layer.

18. An electronic apparatus comprising
a display device including
- a light control element that controls transmission or reflection of light or a light emitting element that emits light,
- a color change member that is provided on a light extraction side of the light control element or the light emitting element,
- a sealing substrate that covers the light emitting element with the color change member being provided between the light emitting element and the sealing substrate, and
- a sealing resin layer provided between the sealing substrate and the color change member, wherein
- the sealing substrate and the sealing resin layer each have a planar structure including parallel upper and lower surfaces that extend continuously across a light emission side of the color change member, and
- the color change member includes
  - a color change layer that has a light incident surface, a light emission surface, and a side surface,
  - a first protective layer that is provided on the light incident surface of the color change layer, and
  - a second protective layer that is provided on at least a part of the side surface of the color change layer, wherein
- the first protective layer and the second protective layer are integrally formed,
- the color change layer includes a plurality of color filters each having a light incident surface, and
- the integrally formed first protective layer and second protective layer continuously extends between a light emission side of the light emitting element to the light incident surface of the plurality of color filters.

* * * * *